(12) United States Patent
Park et al.

(10) Patent No.: US 12,408,433 B2
(45) Date of Patent: Sep. 2, 2025

(54) DISPLAY DEVICE

(71) Applicant: Samsung Display Co., LTD., Yongin-si (KR)

(72) Inventors: Do Yeong Park, Yongin-si (KR); No Kyung Park, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 929 days.

(21) Appl. No.: 17/555,120

(22) Filed: Dec. 17, 2021

(65) Prior Publication Data

US 2022/0254816 A1    Aug. 11, 2022

(30) Foreign Application Priority Data

Feb. 9, 2021 (KR) .................. 10-2021-0018614

(51) Int. Cl.
*H10D 86/60* (2025.01)
*H01L 23/00* (2006.01)
(Continued)

(52) U.S. Cl.
CPC .......... *H10D 86/60* (2025.01); *H01L 25/167* (2013.01); *H10D 86/443* (2025.01);
(Continued)

(58) Field of Classification Search
CPC .... H10D 89/931; H10D 89/921; H10D 86/60; H10D 86/443; H10D 89/813; H01L 25/167; H01L 25/0753; H01L 24/25; H01L 2224/25175; H01L 2224/24137; H01L 2224/24146; H01L 24/24; H10H 20/857; H10H 20/819; H10H 20/831
See application file for complete search history.

(56) References Cited

U.S. PATENT DOCUMENTS 10,026,798 B2 * 7/2018 Kim ..................... H10D 89/811
10,096,594 B2  10/2018 Chung
(Continued)

FOREIGN PATENT DOCUMENTS

KR  10-2017-0027901 A  3/2017
KR  10-2018-0009014 A  1/2018
(Continued)

*Primary Examiner* — Vinh T Lam
(74) *Attorney, Agent, or Firm* — Womble Bond Dickinson (US) LLP

(57) ABSTRACT

A display device includes a substrate including a display area and a non-display area adjacent to the display area, a plurality of pixels being located in the display area, a driver located in the non-display area, a data line electrically connected to the driver to transmit a data signal to each of the plurality of pixels, a first driving voltage line and a second driving voltage line in the non-display area, and an antistatic portion in the non-display area and connected between the data line and the first driving voltage line. The display area further includes at least one first area electrically connected to one side of the driver and at least one second area electrically connected to another side of the driver. In addition, the non-display area includes a first non-display area corresponding to the first area and a second non-display area corresponding to the second area.

20 Claims, 19 Drawing Sheets

(51) Int. Cl.
*H01L 25/16* (2023.01)
*H10D 86/40* (2025.01)
*H10D 89/60* (2025.01)
*H10H 20/831* (2025.01)

(52) U.S. Cl.
CPC ......... *H10D 89/921* (2025.01); *H10D 89/931* (2025.01); *H01L 24/24* (2013.01); *H01L 24/25* (2013.01); *H01L 2224/24137* (2013.01); *H01L 2224/24146* (2013.01); *H01L 2224/25175* (2013.01); *H10D 89/813* (2025.01); *H10H 20/831* (2025.01)

(56) References Cited

U.S. PATENT DOCUMENTS

| | | | |
|---|---|---|---|
| 10,249,603 B2 | 4/2019 | Cho et al. | |
| 10,276,630 B2 | 4/2019 | Lee et al. | |
| 10,288,960 B2 * | 5/2019 | Xu | G02F 1/136286 |
| 10,340,419 B2 | 7/2019 | Kim et al. | |
| 10,644,091 B2 | 5/2020 | Liu et al. | |
| 10,700,020 B2 * | 6/2020 | Lin | H10D 86/441 |
| 10,930,231 B2 * | 2/2021 | Kim | H10D 89/811 |
| 11,158,267 B2 * | 10/2021 | Jeong | G06F 1/1637 |
| 11,238,818 B2 * | 2/2022 | Kim | G09G 3/3648 |
| 11,387,306 B2 * | 7/2022 | Park | G09G 3/3233 |
| 11,842,665 B2 * | 12/2023 | Liu | G09G 3/20 |
| 12,170,309 B2 * | 12/2024 | Lee | H10H 20/84 |
| 2020/0176540 A1 | 6/2020 | Park et al. | |
| 2020/0203420 A1 | 6/2020 | Wu et al. | |
| 2020/0343326 A1 | 10/2020 | Park et al. | |
| 2022/0158054 A1 * | 5/2022 | Cha | H10H 20/857 |
| 2022/0344439 A1 * | 10/2022 | Zhang | H10K 59/131 |

FOREIGN PATENT DOCUMENTS

| | | |
|---|---|---|
| KR | 10-2018-0011404 A | 2/2018 |
| KR | 10-1987196 B1 | 6/2019 |
| KR | 10-2020-0066499 A | 6/2020 |

* cited by examiner

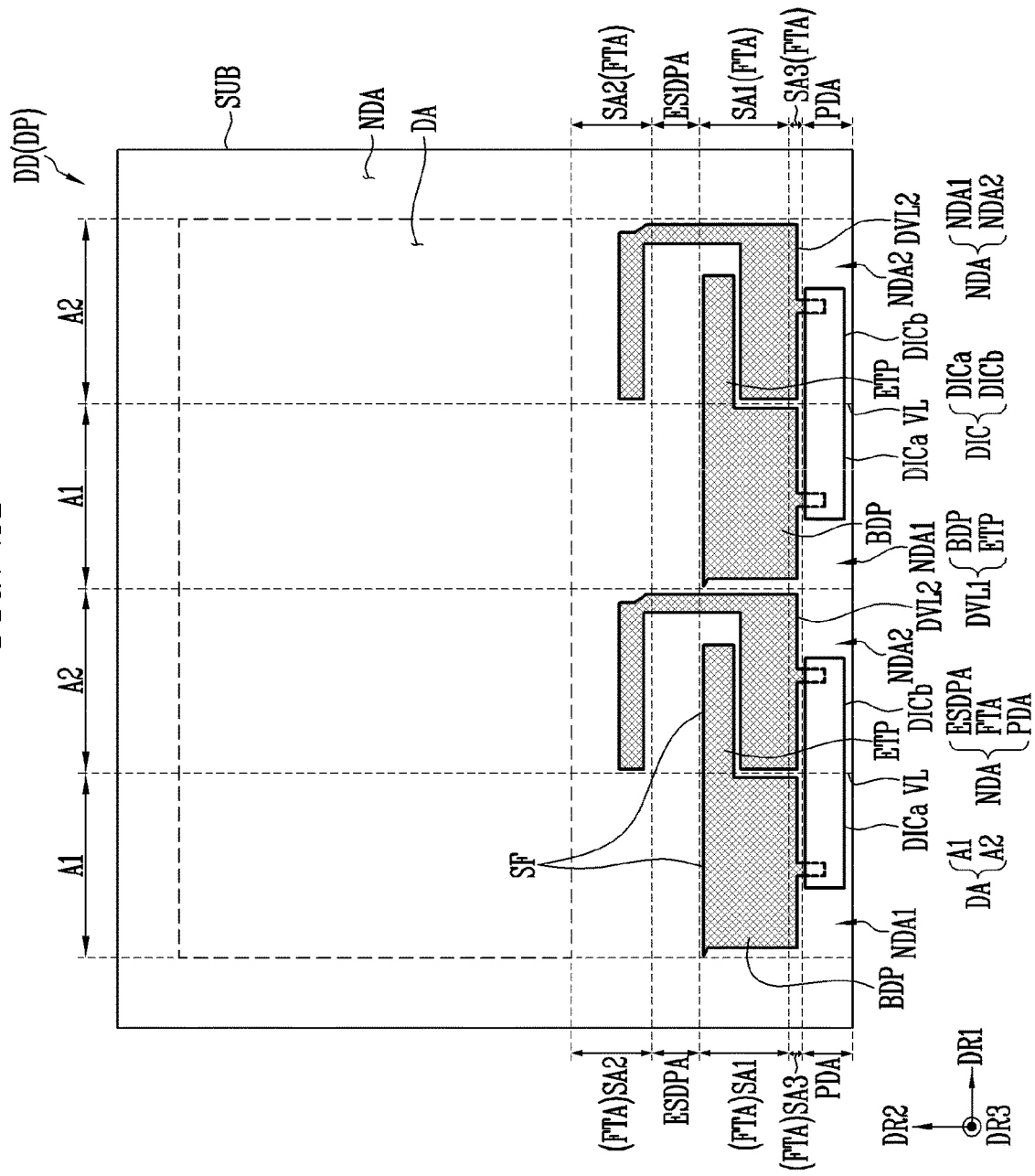

DISPLAY DEVICE

CROSS-REFERENCE TO RELATED APPLICATION

This application claims priority to and the benefit of Korean Patent Application No. 10-2021-0018614, filed in the Korean Intellectual Property Office on Feb. 9, 2021, the entire content of which is incorporated by reference herein.

BACKGROUND

1. Field

The present disclosure relates to a display device.

2. Description of the Related Art

As interest in an information display is increasing and a demand for using a portable information media is increasing, a demand and commercialization for a display device are being focused.

SUMMARY

Aspects and features of embodiments of the present disclosure are to provide a display device having improved reliability.

A display device according to an embodiment of the present disclosure may include a substrate including a display area and a non-display area adjacent to the display area, a plurality of pixels being located in the display area, a driver located in the non-display area, a data line electrically connected to the driver to transmit a data signal to each of the plurality of pixels, a first driving voltage line and a second driving voltage line disposed in the non-display area, and an antistatic portion in the non-display area and connected between the data line and the first driving voltage line. Here, the display area may include at least one first area electrically connected to one side of the driver and at least one second area electrically connected to another side of the driver. In addition, the non-display area may include a first non-display area corresponding to the first area and a second non-display area corresponding to the second area.

In an embodiment, the first driving voltage line may include a first portion at the first non-display area and a second portion extending from the first portion and at the second non-display area.

In an embodiment, the second driving voltage line may be in the second non-display area. In addition, the second driving voltage line may bypass the second portion of the first driving voltage line in the second non-display area. The first driving voltage line and the second driving voltage line may be electrically separated from each other.

In an embodiment, the first driving voltage line may receive a first power, and the second driving voltage line may receive a second power. Here, wherein the first power is a driving power at a higher potential than the second power.

In an embodiment, the display device may further include a buffer layer, a gate insulating layer, and an interlayer insulating layer sequentially stacked on the substrate, a first power line at the display area and electrically connected to each of the plurality of pixels, a second power line at the display area and spaced apart from the first power line, the second power line being electrically connected to each of the plurality of pixels, a pad portion at the non-display area and including a plurality of pads electrically connected to the driver, and a line portion at the non-display area and including a plurality of fan-out lines electrically connecting the pad portion and the pixels.

In an embodiment, the non-display area may include an antistatic circuit area, the antistatic portion being located in the antistatic circuit area, a fan-out area, the plurality of fan-out lines being located in the fan-out area, and a pad area, the plurality of pads being located in the pad area. The fan-out area may be divided into a first sub area, a second sub area, and a third sub area.

In an embodiment, the antistatic portion may include a first antistatic portion positioned in the first non-display area and a second antistatic portion positioned in the second non-display area. Here, the first antistatic portion may be connected between a data line positioned in the first area and the first portion of the first driving voltage line. In addition, the second antistatic portion may be connected between a data line positioned in the second area and the second portion of the first driving voltage line.

In an embodiment, each of the first and second antistatic portions may include at least one transistor. The at least one transistor may include an active pattern on the buffer layer, a gate electrode on the active pattern with the gate insulating layer therebetween, and a first terminal and a second terminal connected to both ends of the active pattern, respectively. Here, the gate electrode may be floating.

In an embodiment, the first antistatic portion may further include a first connection line electrically connecting one of the first and second terminals of the transistor and the first portion of the first driving voltage line, and a second connection line electrically connecting the other one of the first and second terminals of the transistor and the data line located at the first area. The first connection line may be provided integrally with the first portion of the first driving voltage line.

In an embodiment, the second antistatic portion may include a first connection line electrically connecting one of the first and second terminals of the transistor and the second portion of the first driving voltage line, and a second connection line electrically connecting the other one of the first and second terminals of the transistor and the data line located at the second area. Here, the first connection line may be provided integrally with the second portion of the first driving voltage line.

In an embodiment, the first antistatic portion and the second antistatic portion may be located at positions corresponding to each other in the non-display area, in a plan view.

In an embodiment, the first non-display area and the second non-display area may be divided into the second sub area, the antistatic circuit area, the first sub area, and the third sub area sequentially disposed in a direction from a corresponding display area toward the driver.

In an embodiment, at least one side of the first portion and at least one side of the second portion of the first driving voltage line may be positioned at the same line, in a plan view.

In an embodiment, the first antistatic portion and the second antistatic portion may be provided at different positions in the non-display area, in a plan view.

In an embodiment, the first non-display area may be divided into the antistatic circuit area, the first sub area, the second sub area, and the third sub area sequentially disposed in a direction from the first area toward the driver. The second non-display area may be divided into the second sub area, the antistatic circuit area, the first sub area, and the third sub area sequentially disposed in a direction from the second area toward the driver.

In an embodiment, each of the plurality of fan-out lines may include a first diagonal portion located at the first sub area, a straight portion located at the second sub area, and a second diagonal portion located at the third sub area.

In an embodiment, each of the plurality of fan-out lines may include the first diagonal portion, the straight portion, and the second diagonal portion sequentially arranged along a direction from the first area toward the driver, in the first non-display area. In addition, each of the plurality of fan-out lines may include the straight portion, the first diagonal portion, and the second diagonal portion sequentially arranged along a direction from the second area toward the driver, in the second non-display area.

In an embodiment, the first driving voltage line and the second driving voltage line may be on the interlayer insulating layer and may be spaced from each other. The first driving voltage line and the second driving voltage line may overlap the plurality of fan-out lines, in a plan view.

In an embodiment, the display device may further include a first bus line in the non-display area and connected to the first power line, and a second bus line in the non-display area and connected to the second power line. Here, the first driving voltage line may be electrically connected to the first bus line, and the second driving voltage line may be electrically connected to the second bus line.

In an embodiment, each of the plurality of pixels may further include a first emission area, a second emission area, and a third emission area divided along one direction, and a first electrode, a second electrode, a third electrode, and a fourth electrode located at each of the first, second, and third emission areas and spaced from each other in the one direction. A plurality of light emitting elements may be located at each of the first emission area, the second emission area, and the third emission area.

In an embodiment, the plurality of light emitting elements may include a plurality of first light emitting elements between the first electrode and the second electrode and electrically connected to the first and second electrodes, and a plurality of second light emitting elements between the third electrode and the fourth electrode and electrically connected to the third and fourth electrodes.

The display device according to an embodiment of the disclosure may secure reliability of the antistatic portion by connecting the antistatic portion between the first driving voltage line and the corresponding data line regardless of an area by changing a shape of the first driving voltage line and the second driving voltage line positioned in the non-display area. Accordingly, the display device according to an embodiment of the disclosure may improve reliability by preventing or alleviating a defect due to static electricity input from the outside.

In addition, the display device according to an embodiment of the disclosure may prevent or alleviate a defect due to a stack structure by designing the display device so that the first driving voltage line and the second driving voltage line are spaced apart from each other and minimizing the area of the stack structure formed by overlapping conductive layers positioned in the non-display area.

Aspects and features according to embodiments of the present disclosure are not limited to the contents discussed above, and more various aspects and features of embodiments are included in the present specification.

BRIEF DESCRIPTION OF THE DRAWINGS

The above and other features of embodiments of the present disclosure will become more apparent by describing in further detail embodiments thereof with reference to the accompanying drawings, in which:

FIG. 21 is a plan view schematically illustrating a display device according to an embodiment of the present disclosure.

DETAILED DESCRIPTION

Figure 1:
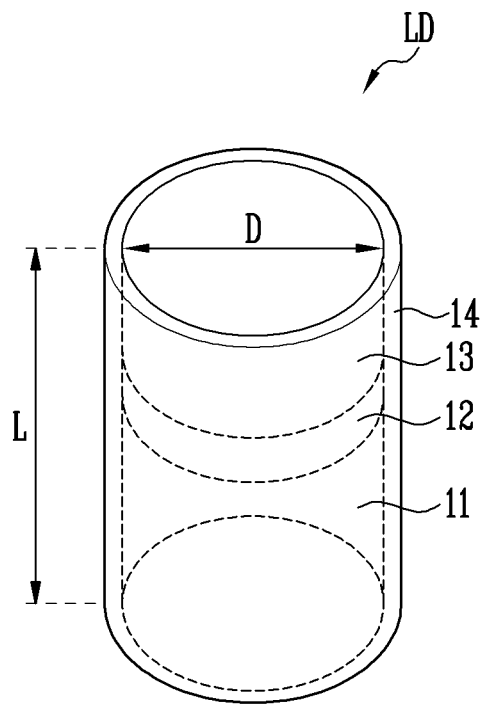
FIGS. 1 and 2 are perspective views schematically illustrating a light emitting element according to an embodiment of the present disclosure.

The present disclosure may be modified in various manners and have various forms. Therefore, embodiments will be illustrated in the drawings and will be described in detail in the specification. However, it should be understood that the present disclosure is not intended to be limited to the disclosed specific forms, and the disclosure includes all modifications, equivalents, and substitutions within the spirit and technical scope of the present disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the present disclosure, a first component may be referred to as a second component, and similarly, a second component may also be referred to as a first component. The singular expressions include plural expressions unless the context clearly indicates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

In the present application, in a case where "a component (for example, 'a first component') is operatively or communicatively coupled with/to or "connected to" another component (for example, 'a second component'), the case should be understood that the component may be directly connected to the other component, or may be connected to the other component through another component (for example, a 'third component'). In contrast, in a case where a component (for example, 'a first component') is "directly coupled with/to or "directly connected" to another component (for example, 'a second component'), the case may be understood that another component (for example, 'a third component') is not present between the component and the other component.

Hereinafter, embodiments of the present disclosure and other details necessary for those skilled in the art to understand the present disclosure will be described in detail with reference to the accompanying drawings. In the following description, the singular expressions include plural expressions unless the context clearly dictates otherwise.

Figure 2:
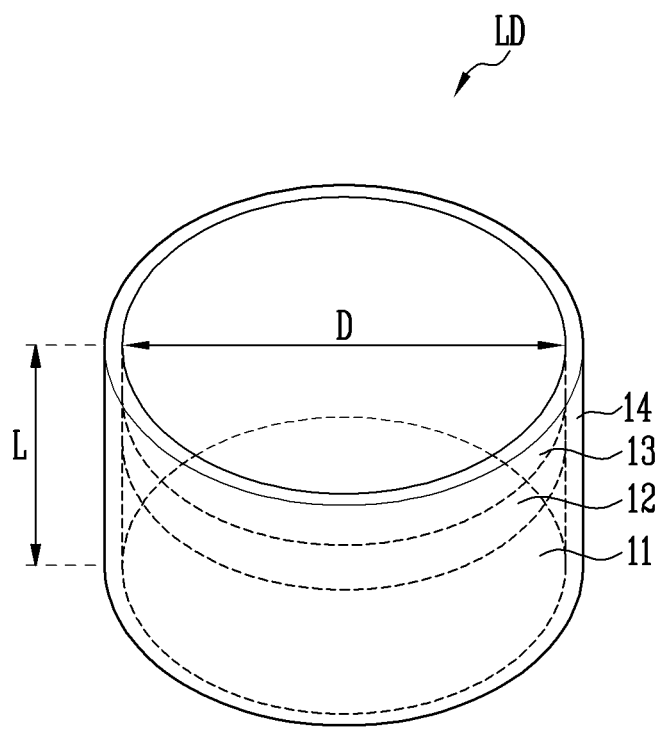
Figure 3:
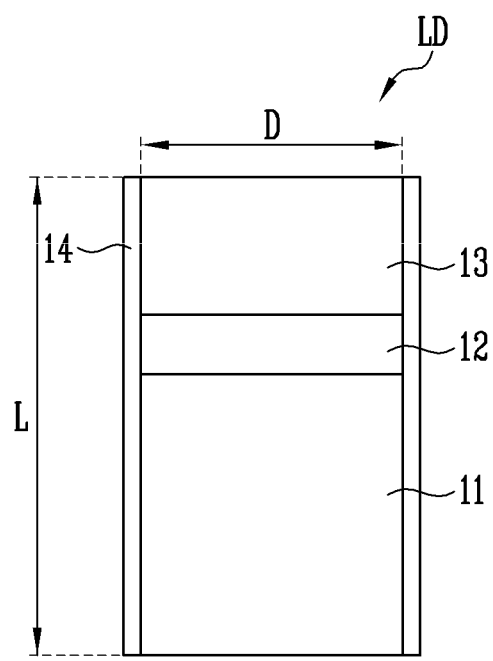
FIG. 3 is a cross-sectional view of the light emitting element of FIG. 1.

FIGS. 1 and 2 are perspective views schematically illustrating a light emitting element LD according to an embodiment of the present disclosure, and FIG. 3 is a cross-sectional view of the light emitting element LD of FIG. 1.

In an embodiment of the present disclosure, a type and/or a shape of the light emitting element LD are/is not limited to the embodiment shown in FIGS. 1-3.

Referring to FIGS. 1-3, the light emitting element LD may include a first semiconductor layer 11, a second semiconductor layer 13, and an active layer 12 interposed between the first semiconductor layer 11 and the second semiconductor layer 13. For example, the light emitting element LD may implement a light emitting stack in which the first semiconductor layer 11, the active layer 12, and the second semiconductor layer 13 are sequentially stacked.

The light emitting element LD may be provided in a shape extending in one direction. When an extension direction of the light emitting element LD is referred to as a length direction, the light emitting element LD may include one end (or a lower end) and another end (or an upper end) along the extension direction. Any one of the first and second semiconductor layers 11 and 13 may be disposed at the one end (or the lower end) of the light emitting element LD, and the other one of the first and second semiconductor layers 11 and 13 may be positioned at the other end (or the upper end) of the light emitting element LD. For example, the first semiconductor layer 11 may be positioned at the one end (or the lower end) of the light emitting element LD, and the second semiconductor layer 13 may be positioned at the other end (or the upper end) of the light emitting element LD.

The light emitting element LD may be provided in various shapes. For example, as shown in FIG. 1, the light emitting element LD may have a rod shape, a bar shape, a column shape, or the like, which is long in the length L direction (that is, an aspect ratio is greater than 1). In an embodiment of the present disclosure, a length L of the light emitting element LD in the length L direction may be greater than a diameter D (or a width of a cross section) of the light emitting element LD. However, the present disclosure is not limited thereto. According to an embodiment, as shown in FIG. 2, the light emitting element LD may have a rod shape, a bar shape, a column shape, or the like, which is short in the length L direction (that is, the aspect ratio is less than 1). In addition, the light emitting element LD may have a rod shape, a bar shape, a column shape, or the like, in which the length L and the diameter D are the same.

The light emitting element LD may include, for example, a light emitting diode (LED) manufactured to be extremely small to have the diameter D and/or the length L of about a nano scale to a micro scale.

When the light emitting element LD is long in the length L direction (that is, the aspect ratio is greater than 1), the diameter D of the light emitting element LD may be about 0.5 μm to 6 μm, and the length L may be about 1 μm to 10 μm. However, the diameter D and the length L of the light emitting element LD are not limited thereto. A size of the light emitting element LD may be changed to satisfy a requirement condition (or a design condition) of a lighting device or a light emitting display device to which the light emitting element LD is applied.

For example, the first semiconductor layer 11 may include at least one n-type semiconductor layer. For example, the first semiconductor layer 11 may include any one semiconductor material among InAlGaN, GaN, AlGaN, InGaN, AlN, and InN, and may be an n-type semiconductor layer doped with a first conductive dopant (or an n-type dopant) such as Si, Ge, or Sn. However, the material configuring the first semiconductor layer 11 is not limited thereto, and other various materials may configure the first semiconductor layer 11. The first semiconductor layer 11 may include an upper surface contacting the active layer 12 along a direction of the length L of the light emitting element LD and a lower surface exposed to the outside. The lower surface of the first semiconductor layer 11 may be the one end (or the lower end) of the light emitting element LD.

The active layer 12 may be disposed on the first semiconductor layer 11 and may be formed in a single quantum well structure or a multiple quantum wells structure. For example, when the active layer 12 is formed in the multiple quantum wells structure, in the active layer 12, a barrier layer, a strain reinforcing layer, and a well layer may be periodically and repeatedly stacked as one unit. The strain reinforcing layer may have a lattice constant less than that of the barrier layer to further a reinforce strain, for example, a compression strain, applied to the well layer. However, a structure of the active layer 12 is not limited to the above-described embodiment.

The active layer 12 may emit light of a wavelength of 400 nm to 900 nm, and may use a double hetero structure. In an embodiment of the present disclosure, a clad layer doped with a conductive dopant may be formed on and/or under the active layer 12 along the direction of the length L of the light emitting element LD. For example, the clad layer may be formed of an AlGaN layer or an InAlGaN layer. According to an embodiment, a material such as AlGaN or InAlGaN may be used to form the active layer 12. In addition, other various materials may configure the active layer 12. The active layer 12 may include a first surface contacting the first semiconductor layer 11 and a second surface contacting the second semiconductor layer 13.

When an electric field of a suitable voltage (e.g., a predetermined voltage) or more is applied between both ends of the light emitting element LD, the light emitting element LD emits light while an electron-hole pair is combined in the active layer 12. By controlling light emission of the light emitting element LD by using such a principle, the light emitting element LD may be used as a light source (or a light emitting source) of various light emitting devices including a pixel of the display device.

The second semiconductor layer 13 may be disposed on the second surface of the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant (or a p-type dopant) such as Mg, Zn, Ca, Sr, or Ba. However, the material configuring the second semiconductor layer 13 is not limited thereto, and other various materials may configure the second semiconductor layer 13. The second semiconductor layer 13 may include a lower surface contacting the second surface of the active layer 12 along the direction of the length L of the light emitting element LD and an upper surface exposed to the outside. Here, the upper surface of the second semiconductor layer 13 may be the other end (or the upper end) of the light emitting element LD.

In an embodiment of the present disclosure, the first semiconductor layer 11 and the second semiconductor layer 13 may have thicknesses different from each other in the direction of the length L of the light emitting element LD. For example, the first semiconductor layer 11 may have a thickness that is relatively greater than that of the second semiconductor layer 13 along the direction of the length L of the light emitting element LD. Therefore, the active layer 12 of the light emitting element LD may be positioned more adjacently to the upper surface of the second semiconductor layer 13 (e.g., the upper end of the light emitting element LD) than to the lower surface of the first semiconductor layer 11 (e.g., the lower end of the light emitting element LD).

Although the first semiconductor layer 11 and the second semiconductor layer 13 are shown as being configured of one layer, the present disclosure is not limited thereto. In an embodiment of the present disclosure, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer to reduce a difference in lattice constants between adjacent layers. The TSBR layer may be configured of a p-type semiconductor layer such as p-GaInP, p-AlInP, and p-AlGaInP, but the present disclosure is not limited thereto.

According to an embodiment, the light emitting element LD may further include a contact electrode (hereinafter referred to as a "first contact electrode") disposed on the second semiconductor layer 13 (e.g., the upper end of the light emitting element LD) in addition to the above-described first semiconductor layer 11, active layer 12, and second semiconductor layer 13. In addition, according to another embodiment, the light emitting element LD may further include another contact electrode (hereinafter referred to as a "second contact electrode") disposed at one end of the first semiconductor layer 11 (e.g., the lower end of the light emitting element LD).

Each of the first and second contact electrodes may be an ohmic contact electrode, but the present disclosure is not limited thereto. According to an embodiment, the first and second contact electrodes may be schottky contact electrodes. The first and second contact electrodes may include a conductive material. For example, the first and second contact electrodes may include an opaque metal using chromium (Cr), titanium (Ti), aluminum (Al), gold (Au), nickel (Ni), oxide thereof, alloy thereof, and the like alone or in combination, but the present disclosure is not limited thereto. According to an embodiment, the first and second contact electrodes may also include transparent conductive oxide such as indium tin oxide (ITO), indium zinc oxide (IZO), zinc oxide (ZnO), indium gallium zinc oxide (IGZO), and indium tin zinc oxide (ITZO).

The materials included in the first and second contact electrodes may be the same as or different from each other. The first and second contact electrodes may be substantially transparent or translucent. Therefore, the light generated by the light emitting element LD may pass through each of the first and second contact electrodes and may be emitted to the outside of the light emitting element LD. According to an embodiment, when the light generated by the light emitting element LD does not pass through the first and second contact electrodes and is emitted to the outside of the light emitting element LD through a region except for the both ends of the light emitting element LD, the first and second contact electrodes may include an opaque metal.

In an embodiment of the present disclosure, the light emitting element LD may further include an insulating film 14 (or an insulating layer). However, according to an embodiment, the insulating film 14 may be omitted and may be provided so as to cover (or surround) only a portion of the first semiconductor layer 11, the active layer 12, and the second semiconductor layer 13.

The insulating film 14 may prevent an electrical short that may occur when the active layer 12 contacts a conductive material other than the first and second semiconductor layers 11 and 13 of the same light emitting element LD. In addition, the insulating film 14 may reduce or minimize a surface defect of the light emitting element LD to improve life and light emission efficiency of the light emitting element LD. In addition, when a plurality of light emitting elements LD are closely disposed, the insulating film 14 may prevent an unwanted short that may occur between the light emitting elements LD. When the active layer 12 may prevent an occurrence of a short with an external conductive material, presence or absence of the insulating film 14 is not limited.

The insulating film 14 may be provided in a form to be around (e.g., partially or entirely surrounding or covering) an outer surface (e.g., an outer peripheral or circumferential surface) of the light emitting stack including the first semiconductor layer 11, the active layer 12, and the second semiconductor layer 13.

In the above-described embodiment, the insulating film 14 may be around (e.g. partially or entirely surround) the outer surface (e.g., an outer peripheral or circumferential surface) of each of the first semiconductor layer 11, the active layer 12, and the second semiconductor layer 13, but the present disclosure is not limited thereto. According to an embodiment, when the light emitting element LD includes the first contact electrode, the insulating film 14 may be around (e.g., partially or entirely surround) an outer surface (e.g., an outer peripheral or circumferential surface) of each of the first semiconductor layer 11, the active layer 12, the second semiconductor layer 13, and the first contact electrode. According to some embodiments, the insulating film 14 may not entirely surround the outer surface (e.g., an outer peripheral or circumferential surface) of the first contact electrode, or may be around (e.g., surround) only a portion of the outer surface (e.g., an outer peripheral or circumferential surface) of the first contact electrode and may not surround the remaining of the outer surface (e.g., an outer peripheral or circumferential surface) of the first contact electrode. In addition, according to an embodiment, when the first contact electrode is disposed at the other end (or the upper end) of the light emitting element LD and the second contact electrode is disposed at the one end (or the lower end) of the light emitting element LD, the insulating film 14 may expose at least one region of each of the first and second contact electrodes.

The insulating film 14 may include a transparent insulating material. For example, the insulating film 14 may include at least one insulating material selected from a group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), Magnesium oxide (MgO), zinc oxide (ZnO), rucenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium Oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN), but the present disclosure is not limited thereto, and various materials having insulating properties may be used as the material of the insulating film 14.

The insulating film 14 may be provided in a form of a single layer, or may be provided in a form of multiple layers including at least a double layer. For example, when the insulating film 14 is formed of a double layer including a first layer and a second layer sequentially stacked, the first layer and the second layer may be formed of different materials (or substances), and may be formed in different processes. According to an embodiment, the first layer and the second layer may be formed by a continuous process including the same material.

According to an embodiment, the light emitting element LD may be implemented with a light emitting pattern of a core-shell structure. In this case, the above-described first semiconductor layer 11 may be positioned in a core, that is, a middle (or a center or central region) of the light emitting element LD, the active layer 12 may be provided and/or formed in a form to be around (e.g., surrounding) the outer surface (e.g., an outer peripheral or circumferential surface) of the first semiconductor layer 11, and the second semiconductor layer 13 may be provided and/or formed in a form to be around (e.g., surrounding) the outer surface (e.g., an outer peripheral or circumferential surface) of the active layer 12. In addition, the light emitting element LD may further include a contact electrode to be around (e.g., surrounding) at least one side of the second semiconductor layer 13. In addition, according to an embodiment, the light emitting element LD may further include the insulating film 14 provided on an outer surface (e.g., an outer peripheral or circumferential surface) of the light emitting pattern of the core-shell structure and including a transparent insulating material. The light emitting element LD implemented with the light emitting pattern having the core-shell structure may be manufactured by a growth method.

The above-described light emitting element LD may be used as a light emitting source (or a light source) of various display devices. The light emitting element LD may be manufactured through a surface treatment process. For example, when a plurality of light emitting elements LD are mixed in a fluid solution (or solvent) and supplied to each pixel area (for example, a emission area of each pixel or a emission area of each sub pixel), surface treatment may be performed on each of the light emitting elements LD so that the light emitting elements LD may be uniformly sprayed without being unevenly aggregated in the solution.

A light emitting unit (or a light emitting device) including the light emitting element LD described above may be used in various types of electronic devices that require a light source, including a display device. For example, when a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 4:
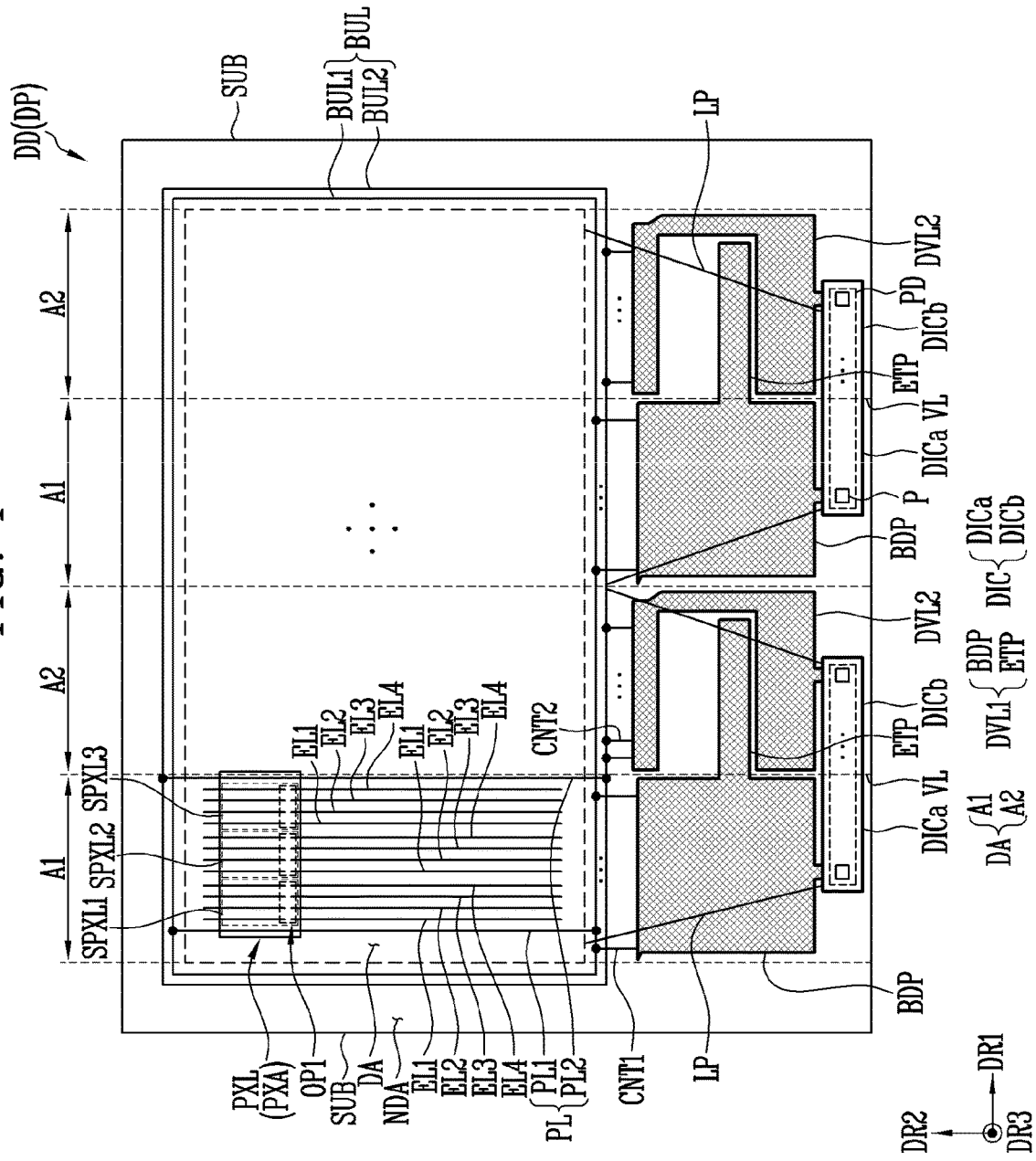
FIG. 4 is a plan view schematically illustrating a display device according to an embodiment of the present disclosure.

FIG. 4 is a plan view schematically illustrating a display device DD according to an embodiment of the present disclosure.

In FIG. 4, for convenience, a structure of the display device DD, particularly a display panel DP provided in the display device DD, is schematically illustrated centering on a display area DA where an image is displayed.

In an embodiment, a term "connection" between two components may refer to both of an electrical connection and a physical connection.

When the display device is an electronic device to which a display surface is at least one surface of the display device, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or wearable device, the disclosure may be applied to the display device.

Referring to FIGS. 1-4, the display device DD according to an embodiment of the present disclosure may include a substrate SUB, a plurality of pixels PXL, and a line portion.

The display device DD may be classified into a passive matrix type display device and an active matrix type display device according to a method of driving the light emitting element LD. For example, when the display device DD is implemented as an active matrix type, each of the pixels PXL may include a driving transistor that controls a current amount supplied to the light emitting element LD, a switching transistor that transfers a data signal to the driving transistor, and the like.

The display device DD may be provided in various shapes, and for example, may be provided in a rectangular plate shape having two pairs of sides parallel to each other, but the present disclosure is not limited thereto. When the display device DD is provided in the rectangular plate shape, one pair of sides of the two pairs of sides may be provided to be longer than the other pair of sides. For convenience, a case where the display device DD has a rectangular shape having a pair of long sides and a pair of short sides is disclosed. In addition, an extension direction of the long side is denoted as a first direction DR1, an extension direction of the short side is denoted as a second direction DR2, and a direction perpendicular to the extension direction of the long side and the short side is denoted as a third direction DR3. The display device DD provided in a rectangular plate shape may be configured as a round shape in a corner portion where one long side and one short side contact (or meet), but the present disclosure is not limited thereto.

The substrate SUB may include the display area DA and a non-display area NDA.

The display area DA may be an area where the pixels PXL displaying an image are provided. For convenience, only one pixel PXL is shown in FIG. 4, but substantially a plurality of pixels PXL may be provided in the display area DA of the substrate SUB.

The substrate SUB may include a transparent insulating material and may transmit light. The substrate SUB may be a rigid substrate or a flexible substrate.

One area on the substrate SUB may be provided as the display area DA and thus the pixels PXL may be disposed. The remaining area on the substrate SUB may be provided as the non-display area NDA. For example, the substrate SUB may include the display area DA including pixel areas PXA in which each pixel PXL is disposed, and the non-display area NDA disposed around the display area DA (or adjacent to the display area DA) to be around (e.g., surrounding) the display area DA along the edge or periphery of the display area DA.

Each of the pixels PXL may be provided in the pixel area PXA in the display area DA on the substrate SUB. In an embodiment of the present disclosure, the pixels PXL may be arranged in the display area DA in a stripe arrangement structure or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PXL may include at least one light emitting element LD driven by corresponding scan signal and data signal. The light emitting element may have a size as small as a nano scale to a micro scale and may be connected in parallel with adjacent light emitting elements, but the disclosure is not limited thereto. The light emitting element may configure a light source of each of the pixels PXL.

Each of the pixels PXL may include at least one light source (for example, the light emitting element LD shown in FIG. 1) driven by a suitable signal (e.g., a predetermined signal) (for example, a scan signal, a data signal, and the like) and/or a suitable power supply (e.g., a predetermined power) (for example, first driving power, second driving power, and the like). However, the type of the light emitting element LD that may be used as the light source of each of the pixels PXL is not limited thereto.

A first sub pixel SPXL1, a second sub pixel SPXL2, and a third sub pixel SPXL3 may be provided in the pixel area PXA provided with each of the pixels PXL. In an embodiment, the first sub pixel SPXL1 may be a red pixel, the second sub pixel SPXL2 may be a green pixel, and the third sub pixel SPXL3 may be a blue pixel. However, the present disclosure is not limited thereto, and according to an embodiment, the second sub pixel SPXL2 may be a red pixel, the first sub pixel SPXL1 may be a green pixel, and the third sub pixel SPXL3 may be a blue pixel. In addition, according to another embodiment, the third sub pixel SPXL3 may be a red pixel, the first sub pixel SPXL1 may be a green pixel, and the second sub pixel SPXL2 may be a blue pixel.

A first electrode EL1, a second electrode EL2, a third electrode EL3, and a fourth electrode EL4 spaced from each other may be disposed in one area (hereinafter referred to as a "sub pixel area") of the pixel area PXA in which each of the first to third sub pixels SPXL1, SPXL2, and SPXL3 is provided. For example, in the sub pixel area, the first electrode EL1, the second electrode EL2, the third electrode EL3, and the fourth electrode EL4 that are spaced from each other along the first direction DR1 and extending in the second direction DR2 may be disposed. At least one light emitting element LD may be disposed (or provided) between two adjacent electrodes among the first electrode EL1, the second electrode EL2, the third electrode EL3, and the fourth electrode EL4. Components disposed in the pixel area PXA are described later with reference to FIGS. 6-9.

At least one first opening area OP1 (or an electrode separation area) may be positioned in the sub pixel area. As an example, the first opening area OP1 may be positioned on at least one side of each of the first to third sub pixels SPXL1, SPXL2, and SPXL3. At least one of the first electrode EL1, the second electrode EL2, the third electrode EL3, and the fourth electrode EL4 may be partially removed from the first opening area OP1.

A power line PL for supplying a desired driving voltage (e.g., a predetermined driving voltage) to the pixels PXL may be provided in the display area DA. The power line PL may include a first power line PL1 and a second power line PL2.

The first power line PL1 and the second power line PL2 may extend in one direction, for example, in the second direction DR2. A plurality of first and second power lines PL1 and PL2 may be arranged in the display area DA at a distance of at least one pixel PXL (or pixel area PXA) along the first direction DR1. The first power line PL1 provided to one pixel PXL may have a mesh shape (or a grid shape) and may be connected to the first power line PL1 provided to the adjacent pixel PXL of the one pixel PXL. The second power line PL2 provided to one pixel PXL may have a mesh shape (or a grid shape) and may be connected to the second power line PL2 provided to the adjacent pixel PXL of the one pixel PXL.

The first power line PL1 may be commonly connected to the plurality of pixels PXL sequentially arranged along the same direction as an extension direction thereof. For example, the first power line PL1 may extend in the second direction DR2 and may be commonly connected to the plurality of pixels PXL that are sequentially arranged along the second direction DR2. Similarly, the second power line PL2 may be commonly connected to the plurality of pixels PXL sequentially arranged along the same direction as an extension direction thereof. For example, the second power line PL2 may extend in the second direction DR2 and may be commonly connected to the plurality of pixels PXL that are sequentially arranged along the second direction DR2.

In an embodiment, one area of the first power line PL1 may be disposed to overlap the pixel area PXA of at least one pixel PXL, but the present disclosure is not limited thereto. The first power line PL1 may be electrically connected to a first bus line BUL1 disposed in the non-display area NDA, and may be electrically connected to a first driving voltage line DVL1 through the first bus line BUL1. When the display device DD is driven, a voltage of first driving power (for example, high potential driving power) may be supplied to the first driving voltage line DVL1.

One area of the second power line PL2 may be disposed to overlap the pixel area PXA of at least one pixel PXL, but the present disclosure is not limited thereto. The second power line PL2 may be electrically connected to a second bus line BUL2 disposed in the non-display area NDA, and may be electrically connected to a second driving voltage line DVL2 through the second bus line BUL2. When the display device DD is driven, a voltage of second driving power (for example, low potential driving power) may be supplied to the second driving voltage line DVL2.

The non-display area NDA may be an area where lines (e.g. predetermined lines) (for example, fan-out lines), pads, and/or a built-in circuit unit electrically connected to the pixels PXL to drive the pixels PXL are provided. For example, the line portion, a bus line BUL, the first driving voltage line DVL1, the second driving voltage line DVL2, and a pad portion PD may be provided in the non-display area NDA.

The non-display area NDA may be provided on at least one side of the display area DA. The non-display area NDA may be around (e.g., may surround) a periphery (e.g., a circumference or an edge) of the display area DA.

The line portion may be provided in the non-display area NDA, and may electrically connect a driver DIC (or the pad portion PD) and the pixels PXL. The line portion may provide a signal to each pixel PXL and may include signal lines connected to each pixel PXL, for example, fan-out lines LP connected to a scan line, a data line, an emission control line, and the like. In addition, the line portion may include signal lines connected to each pixel PXL to compensate for an electrical characteristic change, for example, fan-out lines LP connected to a control line, a sensing line, and the like.

The bus line BUL may be positioned in the non-display area NDA to be around (e.g., surround) at least one side of the display area DA. In an embodiment, the bus line BUL may include the first bus line BUL1 and the second bus line BUL2.

The first bus line BUL1 may be electrically connected to the first power line PL1 and the first driving voltage line DVL1 (or a first power pad of the pad portion PD). For example, the first bus line BUL1 may be connected between the first power line PL1 and the first driving voltage line DVL1 (or the first power pad of the pad portion PD) to transmit the voltage of the first driving power applied to the first driving voltage line DVL1 (or the first power pad of the pad portion PD) to the first power line PL1 when driving the display device DD.

The first bus line BUL1 may be electrically connected to a first alignment pad provided on a mother substrate in a step of aligning the light emitting elements LD in the pixel area PXA of each pixel PXL during a manufacturing step of the display device DD, to transmit a first alignment signal applied to the first alignment pad to the first electrode EL1 and the fourth electrode EL4 of each of the first to third sub pixels SPXL1, SPXL2, and SPXL3. To this end, the first bus line BUL1 may be first formed so as to be connected to the first and fourth electrodes EL1 and EL4 of each of the first to third sub pixels SPXL1, SPXL2, and SPXL3, and may be separated from each of the first and fourth electrodes EL1 and EL4 of each of the first to third sub pixels SPXL1, SPXL2, and SPXL3 after the alignment of the light emitting elements LD is completed.

The second bus line BUL2 may be electrically connected to the second power line PL2 and the second driving voltage line DVL2 (or a second power pad of the pad portion PD). For example, the second bus line BUL2 may be connected between the second power line PL2 and the second driving voltage line DVL2 (or the second power pad of the pad portion PD) to transmit the voltage of the second driving power applied to the second driving voltage line DVL2 (or the second power pad of the pad portion PD) to the second power line PL2 when driving the display device DD.

The second bus line BUL2 may be electrically connected to a second alignment pad provided on the mother substrate in the above-described step of aligning the light emitting elements LD, to transmit a second alignment signal applied to the second alignment pad to the second and third electrodes EL2 and EL3 of each of the first to third sub pixels SPXL1, SPXL2, and SPXL3. To this end, the second bus line BUL2 may be first formed so as to be connected to the second and third electrodes EL2 and EL3 of each of the first to third sub pixels SPXL1, SPXL2, and SPXL3, and may be separated from each of the second and third electrodes EL2 and EL3 of each of the first to third sub pixels SPXL1, SPXL2, and SPXL3 after the alignment of the light emitting elements LD is completed.

In an embodiment, at least one of the first and second bus lines BUL1 and BUL2 may have a closed loop shape. For example, each of the first and second bus lines BUL1 and BUL2 may have a closed loop shape to be around (e.g., surrounding) the edge of the display area DA. However, the present disclosure is not limited thereto, and according to an embodiment, one of the first and second bus lines BUL1 and BUL2 may have a closed loop shape, and the other ones of the bus lines may have a shape that does not completely surround the edge, for example, an open loop shape in which a portion thereof is open.

When the first and second bus lines BUL1 and BUL2 have the closed loop shape, a voltage drop of the first and second driving power may be reduced or minimized. In addition, voltages of the first and second driving power VDD (e.g., applied to DVL1) and VSS (e.g., applied to DVL2) may be supplied to the first and second power lines PL1 and PL2 in both directions, respectively, by connecting the first and second bus lines BUL1 and BUL2 to both ends of the first and second power lines PL1 and PL2, respectively. Accordingly, a luminance deviation of the pixels PXL due to the voltage drop of the first and second driving power may be prevented or reduced.

In addition, when the first and second bus lines BUL1 and BUL2 have the closed loop shape, a corresponding alignment signal may be stably applied to each of the first to fourth electrodes EL1, EL2, EL3, and EL4 of each of the first to third sub pixels SPXL1, SPXL2, and SPXL3 in the above-described step of aligning the light emitting elements LD.

According to an embodiment, another bus line that is around (e.g., surrounding) the second bus line BUL2 may be provided. The other bus line may be disposed at an outermost area (or an outside) of the bus lines BUL to be used as a shielding line.

The pad portion PD may include a plurality of pads P. The pads P may supply (or transmit) driving power and signals for driving the pixels PXL and/or the built-in circuit unit provided in the display area DA.

At least one of the pads P may be the first power pad. The first power pad may be connected to the first driving voltage line DVL1 and finally connected to the first bus line BUL1. The first power pad may be electrically connected to the first alignment pad in the step of aligning the light emitting elements LD, and transmit the first alignment signal supplied from the first alignment pad to the first and fourth electrodes EL1 and EL4 of each of the first to third sub pixels SPXL1, SPXL2, and SPXL3 through the first bus line BUL1.

At least the other one of the pads P may be the second power pad. The second power pad may be connected to the second driving voltage line DVL2 and finally connected to the second bus line BUL2. The second power pad may be electrically connected to the second alignment pad in the step of aligning the light emitting elements LD, and transmit the second alignment signal supplied from the second alignment pad to the second and third electrodes EL2 and EL3 of each of the first to third sub pixels SPXL1, SPXL2, and SPXL3 through the second bus line BUL2.

The driver DIC may be positioned on the pad portion PD. The driver DIC may include input/output pads connected to the pads P included in the pad portion PD. For example, the driver DIC may be an integrated circuit (IC). The driver DIC may receive driving signals output from a printed circuit board, and output suitable signals (e.g., predetermined signals), a voltage of suitable driving power (e.g., a voltage of predetermined driving power), and the like to be provided to the pixels PXL, based on the received driving signals. The suitable signals (e.g., predetermined signals) and the voltage of suitable driving power (e.g. the voltage of predetermined driving power) described above may be supplied to the corresponding pad P of the pad portion PD through some of the input/output pads. The driver DIC may include a power pad connected to each of the first and second power pads to supply the voltage of the driving power to the first and second power pads when the display device DD is driven.

In the above-described embodiment, the driver DIC is disposed on the pad portion PD, but the present disclosure is not limited thereto. According to an embodiment, the driver DIC may be disposed on a circuit board.

The first driving voltage line DVL1 may be positioned in one area of the non-display area NDA positioned between one side of the driver DIC and the display area DA. The first driving voltage line DVL1 may be integrally formed (or provided) with the first power pad of the pad portion PD to be connected to the first power pad. The voltage of the first driving power may be supplied to the first driving voltage line DVL1. The first driving voltage line DVL1 may be electrically connected to the first bus line BUL1 through a first connection member CNT1. Here, a plurality of first connection members CNT1 may be provided. One end of each of the plurality of first connection members CNT1 may be connected to the first bus line BUL1, and another end of each of the plurality of first connection members CNT1 may be connected to the first driving voltage line DVL1. The first connection members CNT1 may be separated from the first bus line BUL1 after the alignment of the light emitting elements LD is completed.

The second driving voltage line DVL2 may be positioned in one area of the non-display area NDA positioned between another side of the driver DIC and the display area DA. The second driving voltage line DVL2 may be integrally formed (or provided) with the second power pad of the pad portion PD to be connected to the second power pad. The voltage of the second driving power may be supplied to the second driving voltage line DVL2. The second driving voltage line DVL2 may be electrically connected to the second bus line BUL2 through a second connection member CNT2. Here, a plurality of second connection members CNT2 may be provided. One end of each of the plurality of second connection members CNT2 may be connected to the second bus line BUL2, and another end of each of the plurality of second connection members CNT2 may be connected to the second driving voltage line DVL2. The second connection members CNT2 may be separated from the second bus line BUL2 after the alignment of the light emitting elements LD is completed.

In an embodiment of present the disclosure, one driver DIC may be divided into a first portion DICa (or one side) and a second portion (or another side) based on a virtual line VL that crosses a center (or middle) of the driver DIC along the second direction DR2. For example, the first portion DICa may be a left side of the driver DIC in a plan view, and the second portion DICb may be a right side of the driver DIC.

The display area DA may include at least one first area A1 corresponding to the first portion DICa of the driver DIC and at least one second area A2 corresponding to the second portion DICb of the driver DIC. The first area A1 may be an area of the display area DA in which the pixels PXL (hereinafter referred to as "first pixels") electrically connected to the first portion DICa of the driver DIC are positioned, and the second area A2 may be an area of the display area DA in which the pixels PXL (hereinafter referred to as "second pixels") electrically connected to the second portion DICb of the driver DIC are positioned.

The second driving voltage line DVL2 may be positioned in one area of the non-display area NDA corresponding to the second area A2. For example, the second driving voltage line DVL2 may be positioned in one area of the non-display area NDA positioned between the second area A2 and the second portion DICb of the driver DIC. The second driving voltage line DVL2 may be electrically connected to the second power line PL2 of each of the second pixels PXL to transmit the voltage of the second driving power that is applied to the second driving voltage line DVL2 to the second power line PL2. The voltage of the second driving power transmitted to each of the second pixels PXL may be transmitted to the second power line PL2 of each of the first pixels PXL positioned in the first area A1 through the second power line PL2 having the mesh shape in the second area A2.

The first driving voltage line DVL1 may include a body portion BDP (or a first portion) positioned in one area of the non-display area NDA positioned between the first area A1 and the first portion DICa of the driver DIC, and an extension portion ETP (or a second portion) extending from the body portion BDP in the first direction DR1 and positioned in one area of the non-display area NDA in which the second driving voltage line DVL2 is positioned. At this time, the extension portion ETP may be positioned to be spaced from the second driving voltage line DVL2 and may be electrically and physically separated from the second driving voltage line DVL2.

The body portion BDP may be electrically connected to the first power line PL1 of each of the first pixels PXL to transmit the voltage of the first driving power to the first power line PL1. In addition, the extension portion ETP may be electrically connected to the first power line PL1 of each of the second pixels PXL to transmit the voltage of the first driving power to the first power line PL1.

The first driving voltage line DVL1 and the second driving voltage line DVL2 may be positioned to be spaced from each other, and may be electrically and physically separated from each other. The second driving voltage line DVL2 may be designed in a shape that bypasses the extension portion ETP of the first driving voltage line DVL1 in one area of the non-display area NDA.

A detailed description of the first and second driving voltage lines DVL1 and DVL2 is described later with reference to FIGS. 10-21.

Figure 5:
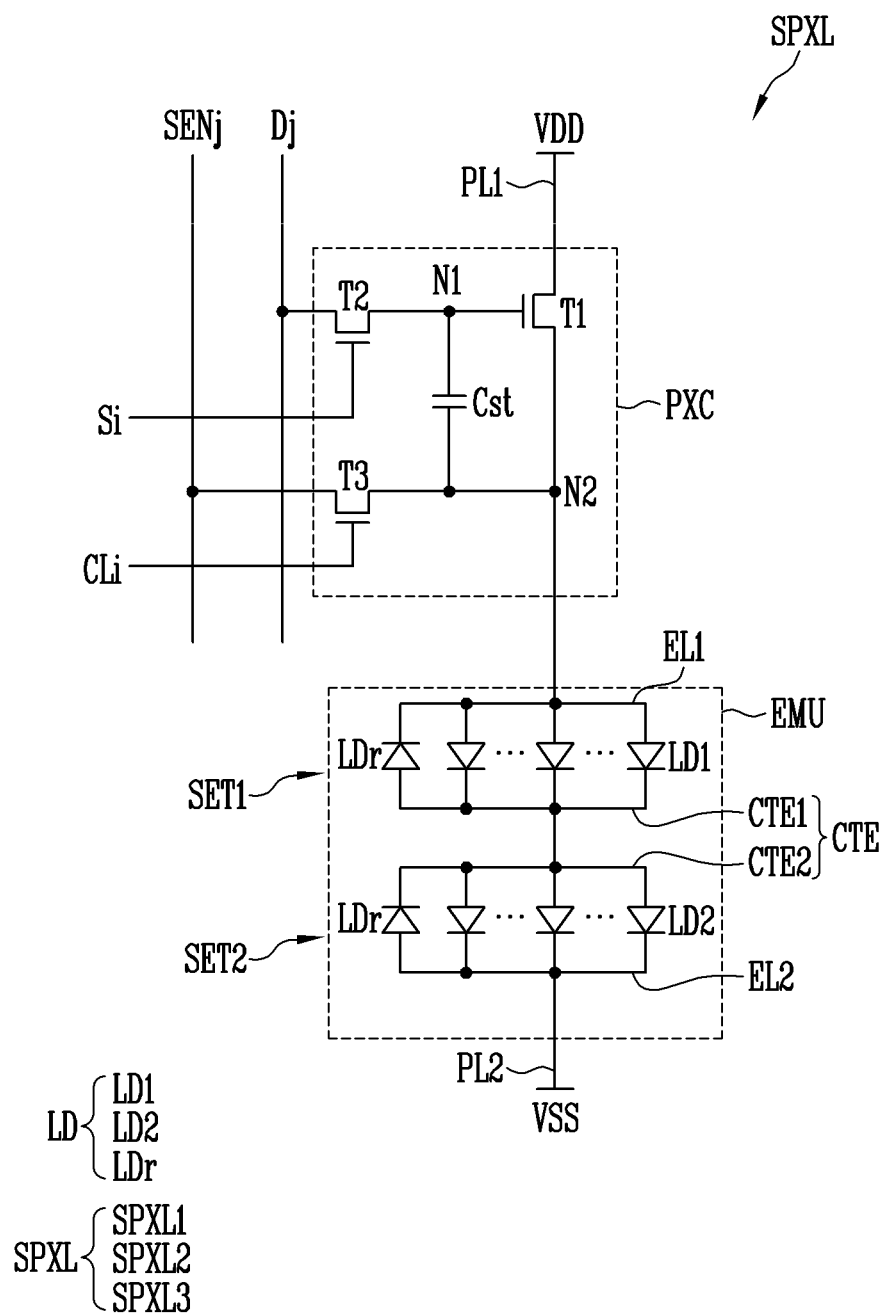
FIG. 5 is a circuit diagram illustrating an electrical connection relationship between components included in each of first to third sub pixels SPXL1, SPXL2, and SPXL3 shown in FIG. 4, according to an embodiment.

FIG. 5 is a circuit diagram illustrating an electrical connection relationship between components included in each of the first to third sub pixels SPXL1, SPXL2, and SPXL3 shown in FIG. 4, according to an embodiment.

For example, FIG. 5 illustrates an electrical connection relationship between components included in each of the first to third sub pixels SPXL1, SPXL2, and SPXL3 applicable to the active matrix display device DD, according to an embodiment. However, types of the components included in each of the first to third sub pixels SPXL1, SPXL2, and SPXL3 to which an embodiment of the present disclosure may be applied are not limited thereto. In the following embodiment, when the first sub pixel SPXL1, the second sub pixel SPXL2, and the third sub pixel SPXL3 are collectively named, the first sub pixel SPXL1, the second sub pixel SPXL2, and the third sub pixel SPXL3 are referred to as a sub pixel SPXL or sub pixels SPXL.

In FIG. 5, not only the components included in each of the first to third sub pixels SPXL1, SPXL2, and SPXL3 shown in FIG. 4, but also an area in which the components are provided, is referred to as the sub pixel SPXL.

Referring to FIGS. 1-5, each of the first to third sub pixels SPXL1, SPXL2, and SPXL3 may include a light emitting unit EMU (or a light emitting part) that generates light of a luminance corresponding to a data signal. In addition, the sub pixel SPXL may selectively further include a pixel circuit PXC for driving the light emitting unit EMU.

According to an embodiment, the light emitting unit EMU may include a plurality of light emitting elements LD connected in parallel between the first power line PL1 to which the voltage of the first driving power VDD is applied and the second power line PL2 to which the voltage of second driving power VSS is applied. For example, the light emitting unit EMU may include a first electrode EL1 (or a "first alignment electrode") connected to the first driving power VDD via the pixel circuit PXC and the first power line PL1, a second electrode EL2 (or a "second alignment electrode") connected to the second driving power VSS via the second power line PL2, and the plurality of light emitting elements LD connected in parallel in the same direction between the first and second electrodes EL1 and EL2. In an embodiment of the present disclosure, the first electrode EU may be an anode, and the second electrode EL2 may be a cathode. Here, the first power line PL1 may be the first power line PL1 described with reference to FIG. 4, and the second power line PL2 may be the second power line PL2 described with reference to FIG. 4.

Each of the light emitting elements LD included in the light emitting unit EMU may include one end connected to the first driving power VDD through the first electrode EL1 and another end connected to the second driving power VSS through the second electrode EL2. The first driving power VDD and the second driving power VSS may have different potentials. For example, the first driving power VDD may be set as high potential power, and the second driving power VSS may be set as low potential power. At this time, a potential difference between the first driving power VDD and the second driving power VSS may be set as a threshold voltage or more of the light emitting elements LD during an emission period of the sub pixel SPXL. The first driving power VDD described above may be the first driving power described with reference to FIG. 4, and the second driving power VSS described above may be the second driving power described with reference to FIG. 4.

As described above, the respective light emitting elements LD connected in parallel in the same direction (for example, a forward direction) between the first electrode EL1 and the second electrode EL2 to which voltages of different potentials are respectively supplied may configure respective effective light sources. Such effective light sources may be gathered to configure the light emitting unit EMU of the sub pixel SPXL.

The light emitting elements LD of the light emitting unit EMU may emit light at a luminance corresponding to a driving current supplied through a corresponding pixel circuit PXC. For example, the pixel circuit PXC may supply a driving current corresponding to a grayscale value of corresponding frame data to the light emitting unit EMU during each frame period. The driving current supplied to the light emitting unit EMU may be divided and flow to each of the light emitting elements LD. Therefore, each of the light emitting elements LD may emit light at a luminance corresponding to the current flowing through the light emitting element LD, and thus the light emitting unit EMU may emit light of the luminance corresponding to the driving current.

While both ends of the light emitting elements LD are connected in the same direction between the first and second driving power VDD and VSS according to one or more embodiments, the present disclosure is not limited thereto. According to an embodiment, the light emitting unit EMU may further include at least one ineffective light source, for example, a reverse light emitting element LDr (see, for example, FIG. 5), in addition to the light emitting elements LD configuring each effective light source. The reverse light emitting element LDr may be connected in parallel between the first and second electrodes EL1 and EL2 together with the light emitting elements LD configuring the effective light sources, but may be connected between the first and second electrodes EL1 and EL2 in a direction opposite to the light emitting elements LD. The reverse light emitting element LDr maintains an inactive state even when a suitable driving voltage (e.g., a predetermined driving voltage) (for example, a driving voltage of a forward direction) is applied between the first and second electrodes EL1 and EL2, and thus a current substantially does not flow through the reverse light emitting element LDr.

The pixel circuit PXC may be connected to a scan line Si and a data line Dj of the corresponding sub pixel SPXL. For example, when the sub pixel SPXL is disposed in an i-th row and a j-th column of the display area DA, the pixel circuit PXC of the sub pixel SPXL may be connected to the i-th scan line Si and the j-th data line Dj. In addition, the pixel circuit PXC may be connected to an i-th control line CLi and a j-th sensing line SENj of the display area DA.

The above-described pixel circuit PXC may include first to third pixel transistors T1 to T3 and a storage capacitor Cst.

The first pixel transistor T1 may be a driving transistor for controlling a driving current applied to the light emitting unit EMU, and may be connected between the first driving power VDD and the light emitting unit EMU. For example, a first terminal of the first pixel transistor T1 may be connected (or coupled) to the first driving power VDD through the first power line PL1, a second terminal of the first pixel transistor T1 may be connected to a second node N2 and the first electrode EL1 of the light emitting unit EMU, and a gate electrode of the first pixel transistor T1 may be connected to a first node N1. The first pixel transistor T1 may control an amount of the driving current applied from the first driving power VDD to the light emitting unit EMU through the second node N2, according to a voltage applied to the first node N1. In an embodiment, the first terminal of the first pixel transistor T1 may be a drain electrode, and a second terminal of the first pixel transistor T1 may be a source electrode, but the present disclosure is not limited thereto. According to an embodiment, the first terminal may be a source electrode and the second terminal may be a drain electrode.

The second pixel transistor T2 may be a switching transistor that selects the sub pixel SPXL in response to a scan signal and activates the sub pixel SPXL, and may be connected between the data line Dj and the first node N1. A first terminal of the second pixel transistor T2 is connected to the data line Dj, a second terminal of the second pixel transistor T2 is connected to the first node N1, and a gate electrode of the second pixel transistor T2 is connected to the scan line Si. The first terminal and the second terminal of the second pixel transistor T2 may be different terminals. For example, when the first terminal is a drain electrode, the second terminal may be a source electrode.

The second pixel transistor T2 may be turned on when a scan signal of a gate-on voltage (for example, a high level voltage) is supplied from the scan line Si, to electrically connect the data line Dj and the first node N1. The first node N1 may be a point where the second terminal of the second pixel transistor T2 and the gate electrode of the first pixel transistor T1 are connected, and the second pixel transistor T2 may transmit a data voltage to the gate electrode of the first pixel transistor T1.

The third pixel transistor T3 may connect the first pixel transistor T1 to a sensing line SENj to obtain a sensing signal through the sensing line SENj, and detect a characteristic of each sub pixel SPXL including a threshold voltage and the like of the first pixel transistor T1 using the sensing signal. Information on the characteristic of each sub pixel SPXL may be used to convert image data so that a characteristic deviation between the sub pixels SPXL may be compensated. A second terminal of the third pixel transistor T3 may be connected to the second terminal of the first pixel transistor T1 and the second node N2, a first terminal of the third pixel transistor T3 may be connected to the sensing line SENj, and a gate electrode of the third pixel transistor T3 may be connected to the control line CLi. In addition, the first terminal of the third pixel transistor T3 may be connected to initialization power. The third pixel transistor T3 may be an initialization transistor capable of initializing the second node N2, and may be turned on when a sensing control signal is supplied from the control line CLi, to transmit a voltage of the initialization power to the second node N2. Accordingly, a second storage electrode (or an upper electrode) of the storage capacitor Cst connected to the second node N2 may be initialized.

A first storage electrode (or a lower electrode) of the storage capacitor Cst may be connected to the first node N1, and the second storage electrode of the storage capacitor Cst may be connected to the second node N2. The storage capacitor Cst charges to a data voltage (e.g., holds a charge) corresponding to a data signal supplied to the first node N1 during one frame period. Accordingly, the storage capacitor Cst may store a voltage corresponding to a voltage difference between a voltage of the gate electrode of the first pixel transistor T1 and a voltage of the second node N2.

Each light emitting unit EMU may be configured to include at least one series stage including the plurality of light emitting elements LD connected in parallel with each other. That is, the light emitting unit EMU may be configured in a series/parallel mixed structure as shown in FIG. 5.

The light emitting unit EMU may include first and second stages SET1 and SET2 sequentially connected between the first and second driving power VDD and VSS. Each of the first and second stages SET1 and SET2 may include two electrodes EL1 and CTE1, and CTE2 and EL2, respectively, configuring an electrode pair of a corresponding series stage, and the plurality of light emitting elements LD connected in parallel in the same direction between the two electrodes EL1 and CTE1, and CTE2 and EL2.

The first series stage SET1 may include the first electrode EL1, the first intermediate electrode CTE1, and at least one first light emitting element LD1 connected between the first electrode EL1 and the first intermediate electrode CTE1. In addition, the first series stage SET1 may include the reverse light emitting element LDr connected in a direction opposite to the first light emitting element LD1 between the first electrode EU and the first intermediate electrode CTE1.

The second series stage SET2 may include the second intermediate electrode CTE2, the second electrode EL2, and at least one second light emitting element LD2 connected between the second intermediate electrode CTE2 and the second electrode EL2. In addition, the second series stage SET2 may include the reverse light emitting element LDr connected in a direction opposite to the second light emitting element LD2 between the second intermediate electrode CTE2 and the second electrode EL2.

The first intermediate electrode CTE1 of the first series stage SET1 and the second intermediate electrode CTE2 of the second series stage SET2 may be integrally provided and connected to each other. That is, the first intermediate electrode CTE1 and the second intermediate electrode CTE2 may configure an intermediate electrode CTE that electrically connects the continuous first series stage SET1 and second series stage SET2. When the first intermediate electrode CTE1 and the second intermediate electrode CTE2 are integrally provided, the first intermediate electrode CTE1 and the second intermediate electrode CTE2 may be different areas of the intermediate electrode CTE.

In the above-described embodiment, the first electrode EL1 of the first series stage SET1 may be an anode of the light emitting unit EMU of each sub pixel SPXL, and the second electrode EL2 of the second series stage SET2 may be a cathode of the light emitting unit EMU.

As described above, the light emitting unit EMU of the sub pixel SPXL including the series stages SET1 and SET2 (or the light emitting elements LD) connected in a series/parallel mixed structure may easily adjust a driving current/voltage condition according to an applied product specification.

For example, the light emitting unit EMU of the sub pixel SPXL including the series stages SET1 and SET2 (or the light emitting elements LD) connected in the series/parallel mixed structure may reduce a driving current compared to the light emitting unit of a structure in which the light emitting elements LD are connected only in parallel. In addition, the light emitting unit EMU of the sub pixel SPXL including the series stages SET1 and SET2 connected in the series/parallel mixed structure may reduce a driving voltage applied to both ends of the light emitting unit EMU compared to the light emitting unit in which all of the same number of light emitting elements LD are connected in series. Furthermore, the light emitting unit EMU of the sub pixel SPXL including the series stages SET1 and SET2 (or the light emitting elements (LD) connected in the series/parallel mixed structure may include a greater number of light emitting elements LD between the same number of electrodes EL1, CTE1, CTE2, and EL2 compared to the light emitting unit of a structure in which all of the series stages are connected in series. In this case, light emission efficiency of the light emitting elements LD may be improved, and even though a defect occurs in a specific series stage, a ratio of the light emitting elements LD that do not emit light due to the defect may be relatively reduced, and thus a reduction of light emission efficiency of the light emitting elements LD may be alleviated.

FIG. 5 discloses an embodiment in which all of the first to third pixel transistors T1, T2, and T3 are N-type transistors, but the present disclosure is not limited thereto. For example, at least one of the above-described first to third pixel transistors T1, T2, and T3 may be changed to a P-type transistor. Those of ordinary skill in the art would appreciate required changes to the circuit design and applied voltage levels when one or more transistors are changed from N-type transistors to P-type transistors. In addition, FIG. 5 discloses an embodiment in which the light emitting unit EMU is connected between the pixel circuit PXC and the second driving power VSS, but the light emitting unit EMU may be connected between the first driving power VDD and the pixel circuit PXC.

A structure of the pixel circuit PXC may be variously changed. For example, the pixel circuit PXC may further include at least one transistor element such as a transistor element for initializing the first node N1, and/or a transistor element for controlling an emission time of the light emitting elements LD, and other circuit elements such as a boosting capacitor for boosting the voltage of the first node N1.

A structure of the sub pixel SPXL that may be applied to the present disclosure is not limited to the embodiment shown in FIG. 5, and the corresponding sub pixel SPXL may have various structures. For example, each sub pixel SPXL may be configured inside a passive light emitting display device or the like. In this case, the pixel circuit PXC may be omitted, and the both ends of the light emitting elements LD included in the light emitting unit EMU may be directly connected to the scan line Si, the data line Dj, the first power line PL1 to which the first driving power VDD is applied, the second power line PL2 to which the second driving power VSS is applied, a control line (e.g., a predetermined control line), and/or the like.

Figure 6:
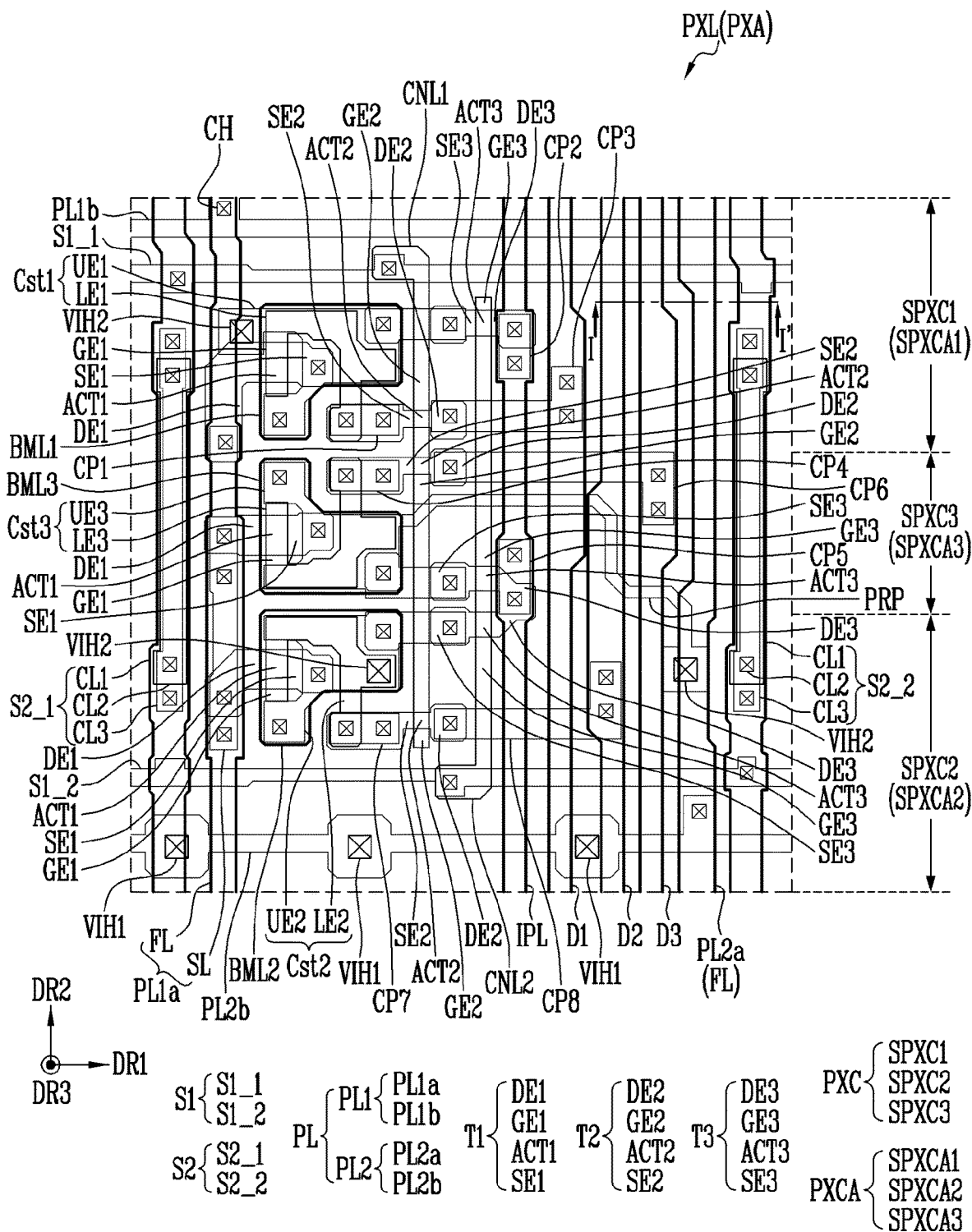
FIG. 6 is a plan view schematically illustrating a pixel circuit area of one pixel shown in FIG. 4.
Figure 7:
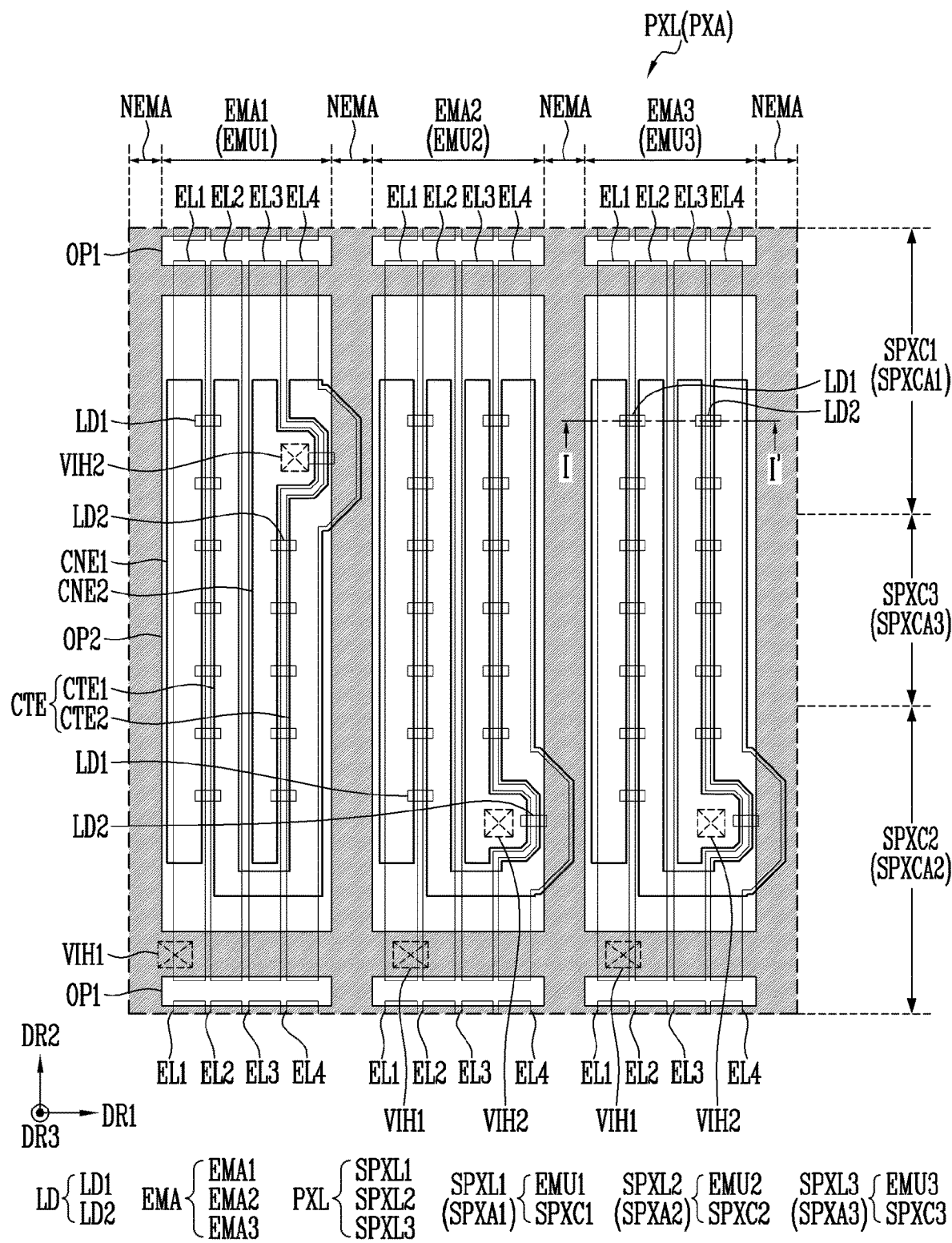
FIG. 7 is a plan view schematically illustrating an emission area of one pixel shown in FIG. 4.
Figure 8:
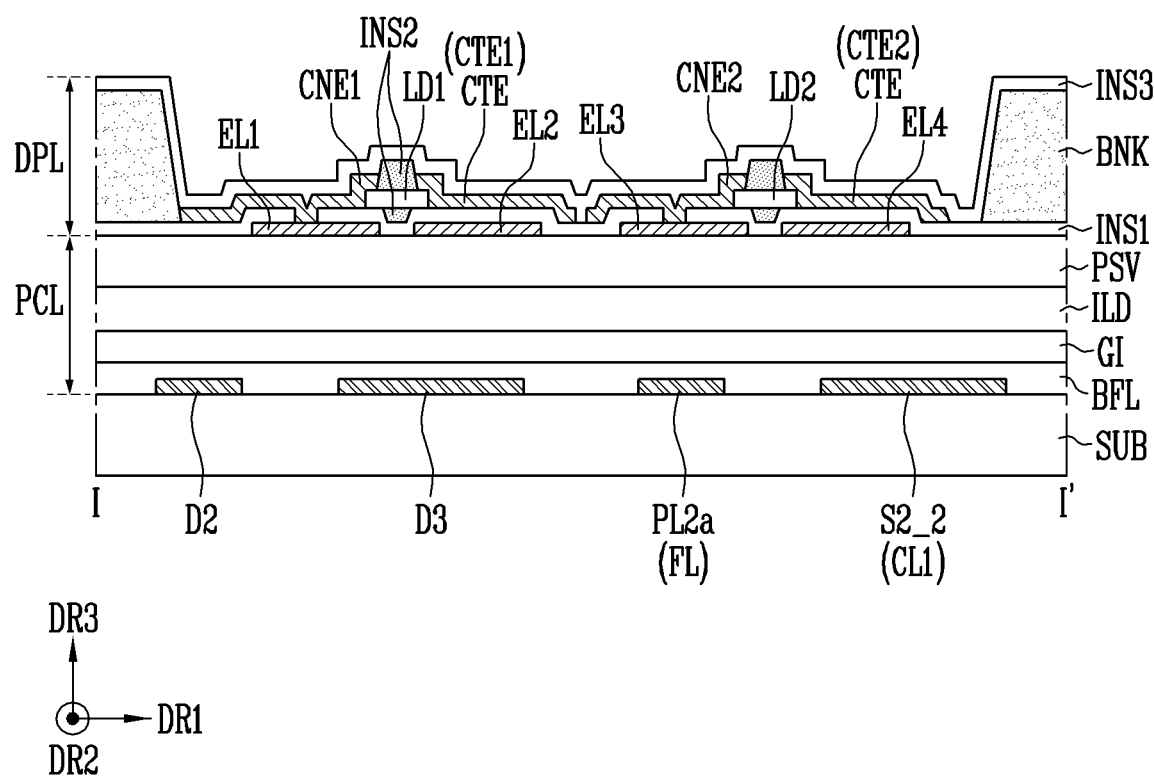
FIGS. 8 and 9 are cross-sectional views taken along the line I~I' of FIGS. 6 and 7.
Figure 9:
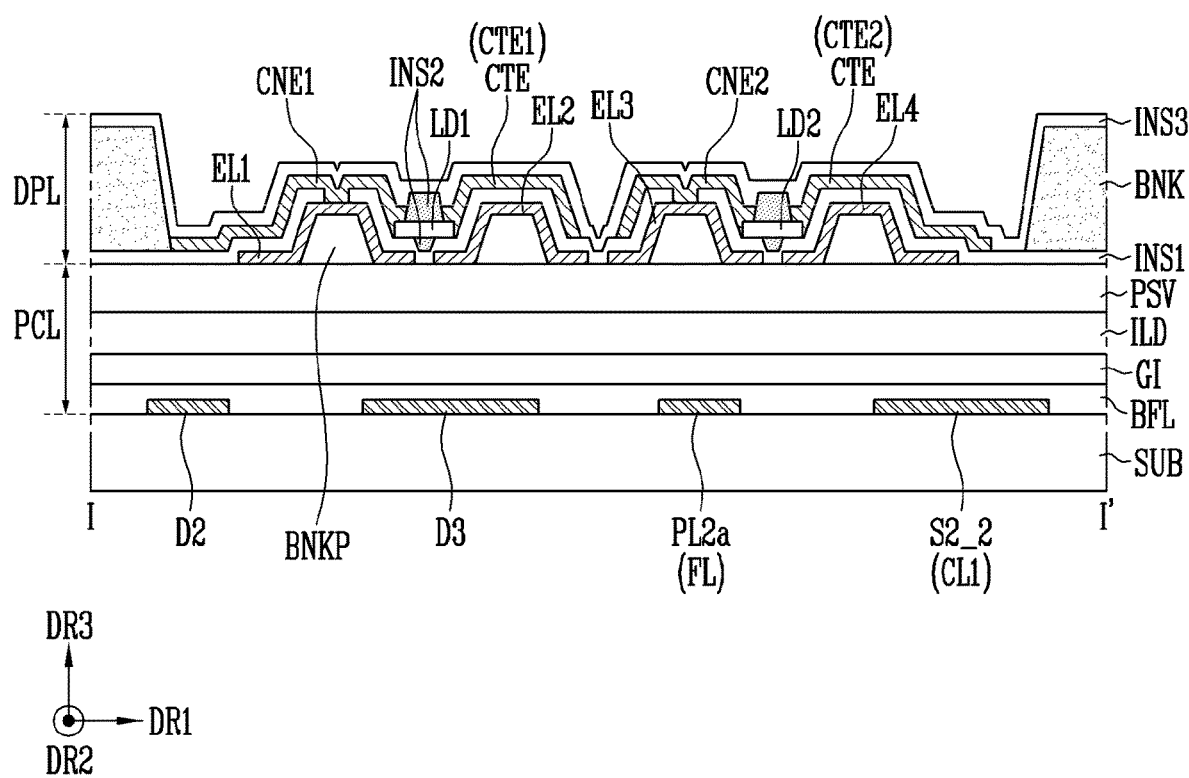

FIG. 6 is a plan view schematically illustrating a pixel circuit area PXCA of one pixel PXL shown in FIG. 4, FIG. 7 is a plan view schematically illustrating an emission area EMA of one pixel PXL shown in FIG. 4, and FIGS. 8 and 9 are cross-sectional views taken along the line I~I' of FIGS. 6 and 7.

FIGS. 6 and 7 schematically show a structure according to an embodiment of the pixel circuit area PXCA and the emission area EMA, centering on the pixel area PXA in which one pixel PXL is disposed.

In FIGS. 6-9, one pixel PXL is simplified and shown such as showing each electrode as an electrode of a single layer and each insulating layer as an insulating layer of a single layer, but the present disclosure is not limited thereto.

In describing embodiments of the present disclosure, "formed and/or provided on (or at) the same layer" may mean formed in the same process, and "formed and/or provided on (or at) different layers" may mean formed in different processes.

In FIGS. 6-9, a traverse direction (or a horizontal direction) on a plane is denoted as the first direction DR1, a longitudinal direction (or a vertical direction) on the plane is denoted as the second direction DR2, and a thickness direction of the substrate SUB on the cross section is denoted as the third direction DR3. The first to third directions DR1, DR2, and DR3 may refer to directions indicated by the first to third directions DR1, DR2, and DR3, respectively.

Referring to FIGS. 4-9, the pixel PXL may include the first sub pixel SPXL1, the second sub pixel SPXL2, and the third sub pixel SPXL3.

The first sub pixel SPXL1 may include a first sub pixel circuit SPXC1 and a first sub light emitting unit EMU1, the second sub pixel SPXL2 may include a second sub pixel circuit SPXC2 and a second sub light emitting unit EMU2, and the third sub pixel SPXL3 may include a third sub pixel circuit SPXC3 and a third sub light emitting unit EMU3. The first sub pixel circuit SPXC1, the second sub pixel circuit SPXC2, and the third sub pixel circuit SPXC3 may configure the pixel circuit PXC of the pixel PXL. The first sub light emitting unit EMU1, the second sub light emitting unit EMU2, and the third sub light emitting unit EMU3 may configure the light emitting unit of the pixel PXL. Each of the first sub pixel circuit SPXC1, the second sub pixel circuit SPXC2, and the third sub pixel circuit SPXC3 may be the pixel circuit PXC described with reference to FIG. 5. In addition, each of the first sub light emitting unit EMU1, the second sub light emitting unit EMU2, and the third sub light emitting unit EMU3 may be the light emitting unit EMU described with reference to FIG. 5.

In the pixel area PXA in which the pixel PXL is provided, one area in which the first sub pixel SPXL1 is provided may be a first sub pixel area SPXA1, one area in which the second sub pixel SPXL2 is provided may be a second sub pixel area SPXA2, and one area in which the third sub pixel SPXL3 is provided may be a third sub pixel area SPXA3.

The pixel area PXA may include a first sub pixel circuit area SPXCA1, a second sub pixel circuit area SPXCA2, and a third sub pixel circuit area SPXCA3. For example, the pixel area PXA may be partitioned in an order of the first sub pixel circuit area SPXCA1, the third sub pixel circuit area SPXCA3, and the second sub pixel circuit area SPXCA2 along the second direction DR2.

The first sub pixel circuit area SPXCA1 may be an area in which the first sub pixel circuit SPXC1 is provided, the second sub pixel circuit area SPXCA2 may be an area in which the second sub pixel circuit SPXC2 is provided, and the third sub pixel circuit area SPXCA3 may be an area in which the third sub pixel circuit SPXC3 is provided. The first sub pixel circuit area SPXCA1, the second sub pixel circuit area SPXCA2, and the third sub pixel circuit area SPXCA3 may configure the pixel circuit area PXCA of the pixel PXL.

The pixel PXL may include a substrate SUB, a pixel circuit layer PCL, and a display element layer DPL.

The substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The material applied to the substrate SUB may have resistance (e.g., heat resistance) to a high process temperature in a manufacturing process of the display device DD.

A plurality of insulating layers and a plurality of conductive layers may be disposed on the substrate SUB. For example, the insulating layers may include a buffer layer BFL, a gate insulating layer GI, an interlayer insulating layer ILD, a protective layer PSV, and first to third insulating layers INS1 to INS3 sequentially provided on the substrate SUB. The conductive layers may be provided and/or formed between the above-described insulating layers. For example, the conductive layers may include a first conductive layer provided on the substrate SUB, a second conductive layer provided on the gate insulating layer GI, a third conductive layer provided on the interlayer insulating layer ILD, a fourth conductive layer provided on the a protective layer PSV, and a fifth conductive layer provided on the second insulating layer INS2. However, the insulating layers and the conductive layers provided on the substrate SUB are not limited to the above-described embodiment, and according to an embodiment, other insulating layers and other conductive layers other than the insulating layers and the conductive layers may also be provided on the substrate SUB.

A signal line electrically connected to the pixel PXL may be positioned on the substrate SUB. The signal line may include a plurality of signal lines that transmit a suitable signal (e.g., a predetermined signal) (or a predetermined voltage) to the pixel PXL. The plurality of signal lines may include a first scan line S1, data lines D1, D2, and D3, a power line PL, an initialization power line IPL, and a second scan line S2.

The first scan line S1 may include a (1-1)-th scan line S1_1 and a (1-2)-th scan line SL1_2 spaced from each other.

The (1-1)-th scan line S1_1 may be a third conductive layer provided on the interlayer insulating layer ILD. The third conductive layer may form a single layer selected from a group consisting of copper (Cu), molybdenum (Mo), tungsten (W), aluminum neodymium (AlNd), titanium (Ti), aluminum (Al), silver (Ag), and an alloy thereof, or may be formed in a double layer or multiple layers structure of molybdenum (Mo), titanium (Ti), copper (Cu), aluminum (Al), or silver (Ag) that is a low resistance material to reduce a line resistance.

The scan signal may be applied to the (1-1)-th scan line S1_1. The (1-1)-th scan line S1_1 may be the scan line Si described with reference to FIG. 5. In the pixel PXL, the (1-1)-th scan line S1_1 may be connected to the first connection line CNL1 through a corresponding contact hole CH. For example, the (1-1)-th scan line S1_1 may be electrically and/or physically connected to the first connection line CNL1 through a contact hole CH passing through the interlayer insulating layer ILD in the pixel PXL.

The first connection line CNL1 may be a second conductive layer provided and/or formed on the gate insulating layer GI. The second conductive layer may include the same material as the third conductive layer or may include one or more materials selected from materials disclosed as configuration materials of the third conductive layer. The first connection line CNL1 may be provided integrally with a second gate electrode GE2 of the second pixel transistor T2 of each of the first to third sub pixel circuits SPXC1, SPXC2, and SPXC3 of the pixel PXL. For example, a portion of the first connection line CNL1 may be the second gate electrode GE2 of each of the first to third sub pixel circuits SPXC1, SPXC2, and SPXC3. Accordingly, the (1-1)-th scan line S1_1 may be connected to the second gate electrode GE2 of each of the first to third sub pixel circuits SPXC1, SPXC2, and SPXC3 of the corresponding pixel PXL.

The sensing control signal may be applied to the (1-2)-th scan line S1_2. The (1-2)-th scan line S1_2 may be the control line CLi described with reference to FIG. 5. The (1-2)-th scan line S1_2 may be the third conductive layer disposed on the interlayer insulating layer ILD. In the pixel PXL, the (1-2)-th scan line S1_2 may be connected to the second connection line CNL2 through a corresponding contact hole CH. For example, the (1-2)-th scan line S1_2 may be electrically and/or physically connected to the second connection line CNL2 through a contact hole CH passing through the interlayer insulating layer ILD in the pixel PXL.

The second connection line CNL2 may be the second conductive layer provided (or disposed) and/or formed on the gate insulating layer GI. In an embodiment, the second connection line CNL2 may be provided on the same layer as the first connection line CNL1. The second connection line CNL2 may be provided integrally with a third gate electrode GE3 of the third pixel transistor T3 of each of the first to third sub pixel circuits SPXC1, SPXC2, and SPXC3 of the pixel PXL. For example, a portion of the second connection line CNL2 may be the third gate electrode GE3 of each of the first to third sub pixel circuits SPXC1, SPXC2, and SPXC3. Accordingly, the (1-2)-th scan line SL1_2 may be connected to the third gate electrode GE3 of each of the first to third sub pixel circuits SPXC1, SPXC2, and SPXC3.

The first connection line CNL1 and the second connection line CNL2 described above may be a common configuration commonly provided to the first to third sub pixel circuits SPXC1, SPXC2, and SPXC3.

In an embodiment, the (1-1)-th scan line S1_1 may be positioned adjacent to a 1b-th power line PL1b and may be spaced apart from the 1b-th power line PL1b, and the (1-2)-th scan line S1_2 may be positioned adjacent to a 2b-th power line PL2b and may be spaced apart from the 2b-th power line PL2b.

The interlayer insulating layer ILD may be an inorganic insulating layer including an inorganic material. For example, the interlayer insulating layer ILD may include at least one of metal oxide such as silicon nitride ($SiN_x$), silicon oxide ($SiO_x$), silicon oxynitride ($SiO_xN_y$), and aluminum oxide ($AlO_x$). However, the material of the interlayer insulating layer ILD is not limited to the above-described embodiments. According to an embodiment, the interlayer insulating layer ILD may be formed of an organic insulating layer including an organic material. The interlayer insulating layer ILD may be provided as a single layer, but may be provided as multiple layers of at least a double layer or more.

The gate insulating layer GI may be positioned under the interlayer insulating layer ILD, and may include the same material as the interlayer insulating layer ILD or include at least one material selected from the materials disclosed as configuration materials of the interlayer insulating layer ILD. For example, the gate insulating layer GI may be an inorganic insulating layer including an inorganic material.

The data lines D1, D2, and D3 may be disposed to be spaced from each other along the first direction DR1, and may include the first data line D1, the second data line D2, and the third data line D3 extending in a direction different from the first direction DR1, for example, the second direction DR2 crossing the first direction DR1. A corresponding data signal may be applied to each of the first to third data lines D1, D2, and D3. Each of the first to third data lines D1, D2, and D3 may be the data line Dj described with reference to FIG. 5.

The first data line D1 may be electrically connected to the second pixel transistor T2 of the first sub pixel circuit SPXC1, the second data line D2 may be electrically connected to the second pixel transistor T2 of the second sub pixel circuit SPXC2, and the third data line D3 may be electrically connected to the second pixel transistor T2 of the third sub pixel circuit SPXC3. The first to third data lines D1, D2, and D3 may be a first conductive layer provided on the substrate SUB. The first conductive layer may include the same material as the third conductive layer or may include one or more materials selected from materials disclosed as configuration materials of the third conductive layer.

The power line PL may include the first power line PL1 and the second power line PL2.

The voltage of the first driving power VDD may be applied to the first power line PL1. The first power line PL1 may be the first power line PL1 described with reference to FIG. 5. The first power line PL1 may include a 1a-th power line PL1$a$ and a 1b-th power line PL1$b$.

The 1a-th power line PL1$a$ may extend in the second direction DR2. In an embodiment, the 1a-th power line PL1$a$ may include a first layer FL and a second layer SL. The first layer FL may be the first conductive layer provided (or disposed) and/or formed on the substrate SUB. The second layer SL may be the third conductive layer provided (or disposed) and/or formed on the interlayer insulating layer ILD. The first layer FL may be provided at the same layer as the first to third data lines D1, D2, and D3, and the second layer SL may be provided at the same layer as the first scan line S1. The second layer SL may be electrically connected to the first layer FL through at least one contact hole CH. For example, the second layer SL may be electrically and/or physically connected to the first layer FL through at least one contact hole CH sequentially passing through the buffer layer BFL, the gate insulating layer GI, and the interlayer insulating layer ILD.

The 1b-th power line PL1$b$ may extend in the first direction DR1. The 1b-th power line PL1$b$ may be the third conductive layer provided (or disposed) and/or formed on the interlayer insulating layer ILD. The 1b-th power line PL1$b$ may be provided at the same layer as the (1-1)-th scan line S1_1 and the second layer SL of the 1a-th power line PL1$a$, and may be disposed to be spaced from the (1-1)-th scan line S1_1 in a plan view. The 1b-th power line PL1$b$ may be connected to the 1a-th power line PL1$a$ through a corresponding contact hole CH. For example, the 1b-th power line PL1$b$ may be electrically and/or physically connected to the first layer FL of the 1a-th power line PL1$a$ through a contact hole CH sequentially passing through the buffer layer BFL, the gate insulating layer GI, and the interlayer insulating layer ILD.

The first power line PL1 including the 1a-th power line PL1$a$ and the 1b-th power line PL1$b$ connected to each other may have a mesh structure. In an embodiment, the 1a-th power line PL1$a$ may be implemented in a double layer structure including the first layer FL and the second layer SL, to reduce signal distortion by reducing a line resistance. However, the present disclosure is not limited thereto, and according to an embodiment, the 1a-th power line PL1$a$ may be implemented in a single layer structure or a multilayer structure of three or more layers.

The voltage of the second driving power VSS may be applied to the second power line PL2. The second power line PL2 may be the second power line PL2 described with reference to FIG. 5. The second power line PL2 may include a 2a-th power line PL2$a$ and a 2b-th power line PL2$b$.

The 2a-th power line PL2$a$ may extend in the second direction DR2. The 2a-th power line PL2$a$ may be implemented in a single layer structure including the first layer FL. The first layer FL may be the first conductive layer provided (or disposed) and/or formed on the substrate SUB. The first layer FL may be provided at the same layer as the first to third data lines D1, D2, and D3 and the first layer FL of the 1a-th power line PL1$a$. The first layer FL may be disposed to be spaced from the first to third data lines D1, D2 and D3 and the 1a-th power line PL1$a$ in a plan view.

In the above-described embodiment, an embodiment in which the 2a-th power line PL2$a$ is implemented in a single layer structure including only the first layer FL is described, but the present disclosure is not limited thereto. According to an embodiment, the 2a-th power line PL2$a$ may be implemented in a double layer structure similar to the 1a-th power line PL1$a$. In addition, the 2a-th power line PL2$a$ may be implemented in a multilayer structure of three or more layers.

The 2a-th power line PL2$a$ and the 2b-th power line PL2$b$ may be electrically connected through a corresponding contact hole CH. For example, the 2b-th power line PL2$b$ may be electrically and/or physically connected to the 2a-th power line PL2$a$ through a contact hole CH sequentially passing through the buffer layer BFL, the gate insulating layer GI, and the interlayer insulating layer ILD. The second power line PL2 including the 2a-th power line PL2$a$ and the 2b-th power line PL2$b$ connected to each other may have a mesh structure.

The second scan line S2 may include a (2-1)-th scan line S2_1 and a (2-2)-th scan line S2_2 spaced from each other.

The second scan line S2 may extend in the second direction DR2 crossing the first direction DR1 which is an extension direction of the first scan line S1. In each pixel PXL, the second scan line S2 may cross the first scan line S1, and a portion thereof may overlap the first scan line S1. The second scan line S2 may be electrically connected to the driver (refer to "DIC" of FIG. 4) positioned at one side of the non-display area NDA of the substrate SUB, and receive the scan signal and the sensing control signal from the driver DIC. For example, the (2-1)-th scan line S2_1 may receive the scan signal from the driver DIC during a driving period of the light emitting elements LD, and the (2-2)-th scan line S2_2 may receive the sensing control signal from the driver DIC during a sensing period (e.g., a predetermined sensing period).

In an embodiment, each of the (2-1)-th scan line S2_1 and the (2-2)-th scan line S2_2 may be implemented in a triple layer structure including a first conductive line CL1, a second conductive line CL2, and a third conductive line CL3. Here, the first conductive line CL1 may be the first conductive layer provided (or disposed) and/or formed on the substrate SUB, the second conductive line CL2 may be the second conductive layer provided (or disposed) and/or formed on the gate insulating layer GI, and the third conductive line CL3 may be the third conductive layer provided (or disposed) and/or formed on the interlayer insulating layer ILD. The third conductive line CL3 may be electrically and/or physically connected to the first conductive line CL1 through a contact hole CH sequentially passing through the buffer layer BFL, the gate insulating layer GI, and the interlayer insulating layer ILD. In addition, the third conductive line CL3 may be electrically connected to the second conductive line CL2 through a contact hole CH passing through the interlayer insulating layer ILD. Accordingly, the first conductive line CL1 and the second conductive line CL2 may be connected to each other through the third conductive line CL3.

In the above-described embodiment, the (2-1)-th scan line S2_1 and the (2-2)-th scan line S2_2 are implemented in the triple layer structure including the first conductive line CL1, the second conductive line CL2, and the third conductive line CL3, but the present disclosure is not limited thereto. According to an embodiment, the (2-1)-th scan line S2_1 and the (2-2)-th scan line S2_2 may be implemented in a single layer structure, a double layer structure, or a multi-layer structure of three or more layers.

At least one of the (2-1)-th scan line S2_1 and the (2-2)-th scan line S2_2 may be connected to the (1-1)-th scan line S1_1 through a corresponding contact hole CH, and the other one of the (2-1)-th scan line S2_1 and the (2-2)-th scan line S2_2 may be connected to the (1-2)-th scan line S1_2 through a corresponding contact hole CH. For example, the (2-1)-th scan line S2_1 may be connected to the (1-1)-th scan line S1_1 through a contact hole CH sequentially passing through the buffer layer BFL, the gate insulating layer GI, and the interlayer insulating layer ILD. The (2-2)-th scan line S2_2 may be connected to the (1-2)-th scan line S1_2 through a contact hole CH sequentially passing through the buffer layer BFL, the gate insulating layer GI, and the interlayer insulating layer ILD.

The initialization power line IPL may extend in the second direction DR2, and may be disposed between the 1a-th power line PL1a and the first data line D1. The initialization power line IPL may be the sensing line SENj described with reference to FIG. 5. A voltage of the initialization power may be applied to the initialization power line IPL. In an embodiment, the initialization power line IPL may be the first conductive layer provided and/or formed on the substrate SUB. The initialization power line IPL may be provided and/or formed at the same layer as the first to third data lines D1, D2, and D3.

The initialization power line IPL may be electrically connected to the third pixel transistor T3 of the first sub pixel circuit SPXC1 through a second conductive pattern CP2, and may be electrically connected to the third pixel transistor T3 of each of the second and third sub pixel circuits SPXC2 and SPXC3 through a fifth conductive pattern CP5.

The second conductive pattern CP2 may be the third conductive layer provided (or disposed) and/or formed on the interlayer insulating layer ILD. One end of the second conductive pattern CP2 may be electrically and/or physically connected to the initialization power line IPL through a contact hole CH sequentially passing through the buffer layer BFL, the gate insulating layer GI, and the interlayer insulating layer ILD. Another end of the second conductive pattern CP2 may be electrically connected to a third drain region DE3 of the third pixel transistor T3 of the first sub pixel circuit SPXC1 through a contact hole CH sequentially passing through the gate insulating layer GI and the interlayer insulating layer ILD.

The fifth conductive pattern CP5 may be the third conductive layer provided (or disposed) and/or formed on the interlayer insulating layer ILD. One end of the fifth conductive pattern CP5 may be electrically and/or physically connected to the initialization power line IPL through a contact hole CH sequentially passing through the buffer layer BFL, the gate insulating layer GI, and the interlayer insulating layer ILD. Another end of the fifth conductive pattern CP5 may be electrically connected to the third drain region DE3 of the third pixel transistor T3 of the second and third sub pixel circuits SPXC2 and SPXC3 through a contact hole CH sequentially passing through the gate insulating layer GI and the interlayer insulating layer ILD.

The above-described first power line PL1, second power line PL2, initialization power line IPL, first and second connection lines CNL1 and CNL2, first scan line S1, and second scan line S2 may be common components commonly provided to the first to third pixel circuits SPXC1, SPXC2, and SPXC3.

Each of the first to third sub pixels SPXL1, SPXL2, and SPXL3 may include a pixel circuit layer PCL (or a circuit element layer) including a corresponding sub pixel circuit. For example, the pixel circuit layer PCL of the first sub pixel SPXL1 may include the buffer layer BFL, the first sub pixel circuit SPXC1, and a protective layer PSV (or a protective layer). The pixel circuit layer PCL of the second sub pixel SPXL2 may include the buffer layer BFL, the second sub pixel circuit SPXC2, and the protective layer PSV. The pixel circuit layer PCL of the third sub pixel SPXL3 may include the buffer layer BFL, the third sub pixel circuit SPXC3, and the protective layer PSV.

The buffer layer BFL may be positioned on the first conductive layer, and may prevent diffusion of an impurity and the like into each of the first to third sub pixel circuits SPXC1, SPXC2, and SPXC3. The buffer layer BFL may be an inorganic insulating layer including an inorganic material. The buffer layer BFL may include at least one of metal oxides such as silicon nitride ($SiN_x$), silicon oxide ($SiO_x$), silicon oxynitride ($SiO_xN_y$), and aluminum oxide ($AlO_x$). The buffer layer BFL may be provided as a single layer, but may also be provided as multiple layers of at least two layers. When the buffer layer BFL is provided as multiple layers, each layer may be formed of the same material or may be formed of different materials. The buffer layer BFL may be omitted according to the material, a process condition, and the like of the substrate SUB.

Each of the first to third sub pixel circuits SPXC1, SPXC2, and SPXC3 may include the first pixel transistor T1, the second pixel transistor T2, the third pixel transistor T3, and the storage capacitor Cst. For example, the first sub pixel circuit SPXC1 may include the first to third pixel transistors T1, T2, and T3, and a first storage capacitor Cst1. The second sub pixel circuit SPXC2 may include the first to third pixel transistors T1, T2, and T3, and a second storage capacitor Cst2. The third sub pixel circuit SPXC3 may include the first to third pixel transistors T1, T2, and T3, and a third storage capacitor Cst3. The first pixel transistor T1 of each of the first to third sub pixel circuits SPXC1, SPXC2, and SPXC3 may be the first pixel transistor T1 described with reference to FIG. 5, the second pixel transistor T2 of each of the first to third sub pixels circuits SPXC1, SPXC2, and SPXC3 may be the second pixel transistor T2 described with reference to FIG. 5, and the third pixel transistor T3 of each of the first to third sub pixel circuits SPXC1, SPXC2, and SPXC3 may be the third pixel transistor T3 described with reference to FIG. 5.

The first sub pixel circuit SPXC1, the second sub pixel circuit SPXC2, and the third sub pixel circuit SPXC3 may have substantially similar or identical structures. Hereinafter, among the first to third sub pixel circuits SPXC1, SPXC2, and SPXC3, the first sub pixel circuit SPXC1 is described as a representative, and the second and third sub pixel circuits SPXC2 and SPXC3 is briefly described.

The first sub pixel circuit SPXC1 includes the first pixel transistor T1, the second pixel transistor T2, the third pixel transistor T3, and the first storage capacitor Cst1.

The first pixel transistor T1 may include a first gate electrode GE1, a first active pattern ACT1, a first source region SE1, and a first drain region DE1.

The first gate electrode GE1 may be connected to the second source region SE2 of the second pixel transistor T2 through the first conductive pattern CP1. The first gate electrode GE1 may be the second conductive layer provided (or disposed) and/or formed on the gate insulating layer GI.

The first conductive pattern CP1 may be the third conductive layer. One end of the first conductive pattern CP1 may be electrically and/or physically connected to the first gate electrode GE1 through a contact hole CH passing through the interlayer insulating layer ILD. Another end of the first conductive pattern CP1 may be electrically and/or physically connected to the second source region SE2 of the second pixel transistor T2 through a contact hole CH sequentially passing through the gate insulating layer GI and the interlayer insulating layer ILD.

The first active pattern ACT1, the first source region SE1, and the first drain region DE1 may be semiconductor patterns formed of poly silicon, amorphous silicon, an oxide semiconductor, or the like. The first active pattern ACT1, the first source region SE1, and the first drain region DE1 may be formed of a semiconductor layer that is not doped with an impurity or doped with an impurity. For example, the first source region SE1 and the first drain region DE1 may be formed of a semiconductor layer doped with an impurity, and the first active pattern ACT1 may be formed of a semiconductor layer that is not doped with an impurity. As an impurity, for example, an n-type impurity may be used, but the present disclosure is not limited thereto.

The first active pattern ACT1, the first source region SE1, and the first drain region DE1 may be provided and/or formed on the buffer layer BFL.

The first active pattern ACT1 may be a region overlapping the first gate electrode GE1 in the third direction DR3 and may be a channel region of the first pixel transistor T1. When the first active pattern ACT1 is formed to be long, the channel region of the first pixel transistor T1 may be formed to be long. In this case, a driving range of a suitable voltage (e.g., a driving range of a predetermined voltage) (or a predetermined voltage) applied to the first pixel transistor T1 may be widened. Accordingly, a grayscale (or gray levels) of light emitted from the light emitting elements LD may be precisely controlled.

The first source region SE1 may be connected (or contacted) to one end of the first active pattern ACT1. In addition, the first source region SE1 may be electrically connected to a first bottom metal layer BML1 through a contact hole CH passing through the buffer layer BFL. Here, the first source region SE1 may be the second terminal of the first pixel transistor T1 described with reference to FIG. 5.

The first bottom metal layer BML1 may be the first conductive layer provided and/or formed on the substrate SUB. The first bottom metal layer BML1 may be provided and/or formed at the same layer as the first conductive line CL1 of each of the first to third data lines D1, D2, and D3, the 1a-th and 2a-th power lines PL1a and PL2a, and the (2-1)-th and (2-2)-th scan lines S2_1 and S2_2, and the initialization power line IPL. The first bottom metal layer BML1 may be electrically and/or physically connected to the first source region SE1 through a corresponding contact hole CH. When the first bottom metal layer BML1 is connected to the first pixel transistor T1, a swing width margin of the second driving power VSS may be further secured. In this case, a driving range of a suitable voltage (e.g., a driving range of a predetermined voltage) supplied to the first gate electrode GE1 of the first pixel transistor T1 may be widened.

The first drain region DE1 may be connected (or contacted) to another end of the first active pattern ACT1. In addition, the first drain region DE1 may be electrically and/or physically connected to the first layer FL of the 1a-th power line PL1a through a contact hole CH passing through the buffer layer BFL. Here, the first drain region DE1 may be the first terminal of the first pixel transistor T1 described with reference to FIG. 5.

The second pixel transistor T2 may include a second gate electrode GE2, a second active pattern ACT2, a second source region SE2, and a second drain region DE2.

The second gate electrode GE2 may be provided integrally with the first connection line CNL1. In this case, the second gate electrode GE2 may be one region of the first connection line CNL1. As described above, because the first connection line CNL1 is connected to the (1-1)-th scan line S1_1 through a corresponding contact hole CH, a signal (e.g., a predetermined signal) (for example, the scan signal) applied to the (1-1)-th scan line S1_1 may be supplied to the second gate electrode GE2.

The second active pattern ACT2, the second source region SE2, and the second drain region DE2 may be semiconductor patterns formed of poly silicon, amorphous silicon, an oxide semiconductor, or the like. The second active pattern ACT2, the second source region SE2, and the second drain region DE2 may be formed of a semiconductor layer that is not doped with an impurity or doped with an impurity. For example, the second source region SE2 and the second drain region DE2 may be formed of a semiconductor layer doped with an impurity, and the second active pattern ACT2 may be formed of a semiconductor layer that is not doped with an impurity. As the impurity, for example, an n-type impurity may be used.

The second active pattern ACT2, the second source region SE2, and the second drain region DE2 may be provided and/or formed on the buffer layer BFL.

The second active pattern ACT2 may be a region overlapping the second gate electrode GE2 in the third direction DR3 and may be a channel region of the second pixel transistor T2.

The second source region SE2 may be connected (or contacted) to one end of the second active pattern ACT2. In addition, the second source region SE2 may be connected to the first gate electrode GE1 through the first conductive pattern CP1. Here, the second source region SE2 may be the second terminal of the second pixel transistor T2 described with reference to FIG. 5.

The second drain region DE2 may be connected (or contacted) to another end of the second active pattern ACT2. In addition, the second drain region DE2 may be connected to the first data line D1 through the third conductive pattern CP3. Here, the second drain region DE2 may be the first terminal of the second pixel transistor T2 described with reference to FIG. 5.

The third conductive pattern CP3 may be the third conductive layer provided (or disposed) and/or formed on the interlayer insulating layer ILD. One end of the third conductive pattern CP3 may be electrically and/or physically connected to the first data line D1 through a contact hole CH sequentially passing through the buffer layer BFL, the gate insulating layer GI, and the interlayer insulating layer ILD. Another end of the third conductive pattern CP3 may be connected to the second drain region DE2 through a contact hole CH sequentially passing through the gate insulating layer GI and the interlayer insulating layer ILD. The second drain region DE2 and the first data line D1 may be electrically connected through the third conductive pattern CP3.

The third pixel transistor T3 may include a third gate electrode GE3, a third active pattern ACT3, a third source region SE3, and a third drain region DE3.

The third gate electrode GE3 may be provided integrally with the second connection line CNL2. As described above, because the second connection line CNL2 is connected to the (1-2)-th scan line S1_2 through a corresponding contact hole CH, a signal (e.g. a predetermined signal) (for example, the sensing control signal) applied to the (1-2)-th scan line S1_2 may be supplied to the third gate electrode GE3.

The third active pattern ACT3, the third source region SE3, and the third drain region DE3 may be semiconductor patterns formed of poly silicon, amorphous silicon, an oxide semiconductor, or the like. The third active pattern ACT3, the third source region SE3, and the third drain region DE3 may be formed of a semiconductor layer that is not doped with an impurity or doped with an impurity. For example, the third source region SE3 and the third drain region DE3 may be formed of a semiconductor layer doped with an impurity, and the third active pattern ACT3 may be formed of a semiconductor layer that is not doped with an impurity. As the impurity, for example, an n-type impurity may be used.

The third active pattern ACT3, the third source region SE3, and the third drain region DE3 may be provided and/or formed on the buffer layer BFL.

The third active pattern ACT3 may be a region overlapping the third gate electrode GE3 in the third direction DR3 and may be a channel region of the third pixel transistor T3.

The third source region SE3 may be connected (or contacted) to one end of the third active pattern ACT3. In addition, the third source region SE3 may be electrically and/or physically connected to the first bottom metal layer BML1 through a contact hole CH passing through the buffer layer BFL. The third source region SE3 may be the second terminal of the third pixel transistor T3 described with reference to FIG. 5.

The third drain region DE3 may be connected (or contacted) to another end of the third active pattern ACT3. In addition, the third drain region DE3 may be electrically connected to the initialization power line IPL through the second conductive pattern CP2. The third drain region DE3 may be the first terminal of the third pixel transistor T3 described with reference to FIG. 5.

The first storage capacitor Cst1 may include a first lower electrode LE1 and a first upper electrode UE1. Here, the first storage capacitor Cst1 may be the storage capacitor Cst described with reference to FIG. 5.

The first lower electrode LE1 may be provided integrally with the first gate electrode GE1. In this case, the first lower electrode LE1 may be one region of the first gate electrode GE1.

The first upper electrode UE1 may be disposed to overlap the first lower electrode LE1 in the third direction DR3 in a plan view, and may have a size (or area) greater than that of the first lower electrode LE1, but the present disclosure is limited thereto. The first upper electrode UE1 may overlap each of the first and third source regions SE1 and SE3 in a plan view. The first upper electrode UE1 may be the third conductive layer provided (or disposed) and/or formed on the interlayer insulating layer ILD3.

The first upper electrode UE1 may be electrically and/or physically connected to the first bottom metal layer BML1 through a contact hole CH sequentially passing through the buffer layer BFL, the gate insulating layer GI, and the interlayer insulating layer ILD. As described above, because the first source region SE1 and the third source region SE3 are electrically connected to the first bottom metal layer BML1, the first upper electrode UE1 may be electrically and/or physically connected to the first and third source regions SE1 and SE3 through the first bottom metal layer BML1.

The second sub pixel circuit SPXC2 may include the first pixel transistor T1, the second pixel transistor T2, the third pixel transistor T3, and the second storage capacitor Cst2.

The first pixel transistor T1 may include a first gate electrode GE1, a first active pattern ACT1, a first source region SE1, and a first drain region DE1.

The first gate electrode GE1 may be connected to the second source region SE2 of the second pixel transistor T2.

The first active pattern ACT1 may be a channel region of the first pixel transistor T1.

The first source region SE1 may be connected to the first active pattern ACT1. In addition, the first source region SE1 may be electrically and/or physically connected to a second bottom metal layer BML2 through a contact hole CH passing through the buffer layer BFL.

The second bottom metal layer BML2 may be a configuration corresponding to the first bottom metal layer BML1. The second bottom metal layer BML2 may be the first conductive layer provided (or disposed) and/or formed on the substrate SUB. The second bottom metal layer BML2 may be electrically and/or physically connected to the first source region SE1 through a corresponding contact hole CH. In addition, the second bottom metal layer BML2 may be electrically and/or physically connected to the third source region SE3 of the third pixel transistor T3 through another contact hole CH passing through the buffer layer BFL. Additionally, the second bottom metal layer BML2 may be electrically and/or physically connected to the second upper electrode UE2 of the second storage capacitor Cst2 through still another contact hole CH sequentially passing through the buffer layer BFL, the gate insulating layer GI, and the interlayer insulating layer ILD.

The first drain region DE1 may be connected to the first active pattern ACT1. In addition, the first drain region DE1 may be electrically and/or physically connected to the first layer FL of the 1a-th power line PL1a through another contact hole CH passing through the buffer layer BFL.

The second pixel transistor T2 may include a second gate electrode GE2, a second active pattern ACT2, a second source region SE2, and a second drain region DE2.

The second gate electrode GE2 is provided integrally with the first connection line CNL1 and may be connected to the (1-1)-th scan line S1_1.

The second active pattern ACT2 may be a channel region of the second pixel transistor T2.

The second source region SE2 may be connected to the second active pattern ACT2. In addition, the second source region SE2 may be connected to the first gate electrode GE1 through a seventh conductive pattern CP7.

The seventh conductive pattern CP7 may be the third conductive layer provided (or disposed) and/or formed on the interlayer insulating layer ILD. One end of the seventh conductive pattern CP7 may be electrically and/or physically connected to the second source region SE2 through a contact hole CH sequentially passing through the gate insulating layer GI and the interlayer insulating layer ILD. Another end of the seventh conductive pattern CP7 may be connected to the first gate electrode GE1 through a contact hole CH passing through the interlayer insulating layer ILD.

The second drain region DE2 may be connected to the second active pattern ACT2. In addition, the second drain region DE2 may be connected to the second data line D2 through an eighth conductive pattern CP8.

The eighth conductive pattern CP8 may be the third conductive layer provided (or disposed) and/or formed on the interlayer insulating layer ILD. One end of the eighth conductive pattern CP8 may be electrically and/or physically connected to the second data line D2 through a contact hole CH sequentially passing through the buffer layer BFL, the gate insulating layer GI, and the interlayer insulating layer ILD. Another end of the eighth conductive pattern CP8 may be electrically and/or physically connected to the second drain region DE2 through a contact hole CH sequentially passing through the gate insulating layer GI and the interlayer insulating layer ILD.

The third pixel transistor T3 may include a third gate electrode GE3, a third active pattern ACT3, a third source region SE3, and a third drain region DE3.

The third gate electrode GE3 may be provided integrally with the second connection line CNL2 and may be connected to the (1-2)-th scan line S1_2.

The third active pattern ACT3 may be a channel region of the third pixel transistor T3.

The third source region SE3 may be connected to the third active pattern ACT3. In addition, the third source region SE3 may be electrically and/or physically connected to the second bottom metal layer BML2 through a corresponding contact hole CH.

The third drain region DE3 may be connected to the third active pattern ACT3. In addition, the third drain region DE3 may be connected to the initialization power line IPL through the fifth conductive pattern CP5.

The second storage capacitor Cst2 may have the same or substantially similar structure as the first storage capacitor Cst1 of the first sub pixel circuit SPXC1 described above. For example, the second storage capacitor Cst may include a second lower electrode LE2 and a second upper electrode UE2.

The second lower electrode LE2 may be the second conductive layer, and may be provided integrally with a corresponding pixel transistor, for example, the first gate electrode GE1 of the first pixel transistor T1. The second upper electrode UE2 may be the third conductive layer and may overlap the second lower electrode LE2 in the third direction DR3. The second upper electrode UE2 may be electrically and/or physically connected to the second bottom metal layer BML2 through a corresponding contact hole CH.

As described above, the second upper electrode UE2 may be electrically connected to each of the first source region SE1 and the third source region SE3 through the second bottom metal layer BML2.

The third sub pixel circuit SPXC3 may include a first pixel transistor T1, a second pixel transistor T2, a third pixel transistor T3, and a third storage capacitor Cst3.

The first pixel transistor T1 may include a first gate electrode GE1, a first active pattern ACT1, a first source region SE1, and a first drain region DE1.

The first gate electrode GE1 may be connected to the second source region SE2 of the second pixel transistor T2.

The first active pattern ACT1 may be a channel region of the first pixel transistor T1.

The first source region SE1 may be connected to the first active pattern ACT1. In addition, the first source region SE1 may be electrically and/or physically connected to a third bottom metal layer BML3 through a contact hole CH passing through the buffer layer BFL.

The third bottom metal layer BML3 may have a configuration corresponding to each of the first and second bottom metal layers BML1 and BML2. The third bottom metal layer BML3 may be the first conductive layer. The third bottom metal layer BML3 may be electrically and/or physically connected to the first source region SE1 through a corresponding contact hole CH. In addition, the third bottom metal layer BML3 may be electrically and/or physically connected to the third source region SE3 of the third pixel transistor T3 through another contact hole CH passing through the buffer layer BFL. Additionally, the third bottom metal layer BML3 may be electrically and/or physically connected to a third upper electrode UE3 through still another contact hole CH sequentially passing through the buffer layer BFL, the gate insulating layer GI, and the interlayer insulating layer ILD.

The first drain region DE1 may be connected to the first active pattern ACT1. In addition, the first drain region DE1 may be electrically and/or physically connected to the first layer FL of the 1a-th power line PL1a through still another contact hole CH passing through the buffer layer BFL.

The second pixel transistor T2 may include a second gate electrode GE2, a second active pattern ACT2, a second source region SE2, and a second drain region DE2.

The second gate electrode GE2 may be provided integrally with the first connection line CNL1 and may be connected to the (1-1)-th scan line S1_1.

The second active pattern ACT2 may be a channel region of the second pixel transistor T2.

The second source region SE2 may be connected to the second active pattern ACT2. In addition, the second source region SE2 may be connected to the first gate electrode GE1 through a fourth conductive pattern CP4.

The fourth conductive pattern CP4 may be the third conductive layer. One end of the fourth conductive pattern CP4 may be electrically and/or physically connected to the second source region SE2 through a contact hole CH sequentially passing through the gate insulating layer GI and the interlayer insulating layer ILD. Another end of the fourth conductive pattern CP4 may be connected to the first gate electrode GE1 through a contact hole CH passing through the interlayer insulating layer ILD. Accordingly, the first gate electrode GE1 and the second source region SE2 may be connected to each other through the fourth conductive pattern CP4.

The second drain region DE2 may be connected to the second active pattern ACT2. In addition, the second drain region DE2 may be connected to the third data line D3 through a sixth conductive pattern CP6.

The sixth conductive pattern CP6 may be the third conductive layer. One end of the sixth conductive pattern CP6 may be electrically and/or physically connected to the third data line D3 through a contact hole CH sequentially passing through the buffer layer BFL, the gate insulating layer GI, and the interlayer insulating layer ILD. Another end of the sixth conductive pattern CP6 may be electrically and/or physically connected to the second drain region DE2 through a contact hole CH sequentially passing through the gate insulating layer GI and the interlayer insulating layer ILD. Accordingly, the second drain region DE2 and the third data line D3 may be connected to each other through the sixth conductive pattern CP6.

The third pixel transistor T3 may include a third gate electrode GE3, a third active pattern ACT3, a third source region SE3, and a third drain region DE3.

The third gate electrode GE3 may be provided integrally with the second connection line CNL2 and may be connected to the (1-2)-th scan line S1_2.

The third active pattern ACT3 may be a channel region of the third pixel transistor T3.

The third source region SE3 may be connected to the third active pattern ACT3. In addition, the third source region SE3 may be electrically and/or physically connected to the third bottom metal layer BML3 through a corresponding contact hole CH.

The third drain region DE3 may be connected to the third active pattern ACT3. In addition, the third drain region DE3 may be connected to the initialization power line IPL through the fifth conductive pattern CP5. In an embodiment, the third drain region DE3 of the third pixel transistor T3 of the third sub pixel circuit SPXC3 and the third drain region DE3 of the third pixel transistor T3 of the second sub pixel circuit SPXC2 may share the fifth conductive pattern CP5.

The third storage capacitor Cst3 may have a structure the same or substantially similar to each of the first and second storage capacitors Cst1 and Cst2 described above. For example, the third storage capacitor Cst3 may include a third lower electrode LE3 and a third upper electrode UE3.

The third lower electrode LE3 may be the second conductive layer, and may be provided integrally with a corresponding pixel transistor, for example, the first gate electrode GE1 of the first pixel transistor T1. The third upper electrode UE3 may be the third conductive layer and may overlap the third lower electrode LE3 in the third direction DR3. The third upper electrode UE3 may be electrically and/or physically connected to the third bottom metal layer BML3 through a corresponding contact hole CH. The third upper electrode UE3 may include a protrusion pattern PRP extending to the 2a-th power line PL2a in one direction, for example, along the first direction DR1. The protrusion pattern PRP may be provided integrally with the third upper electrode UE3 and may be one region of the third upper electrode UE3.

As described above, the third upper electrode UE3 may be electrically connected to each of the first source region SE1 and the third source region SE3 through the third bottom metal layer BML3.

The protective layer PSV may be provided (or disposed) and/or formed on the above-described first sub pixel circuit SPXC1, second sub pixel circuit SPXC2, and third sub pixel circuit SPXC3.

The protective layer PSV may be provided in a form including an organic insulating layer, an inorganic insulating layer, or the organic insulating layer disposed on the inorganic insulating layer. For example, the inorganic insulating layer may include at least one of metal oxides such as silicon oxide ($SiO_x$), silicon nitride ($SiN_x$), silicon oxynitride ($SiO_xN_y$), and aluminum oxide ($AlO_x$). For example, the organic insulating layer may include at least one of an acrylic resin, an epoxy resin, a phenolic resin, a polyamide resin, a polyimide resin, an unsaturated polyester resin, a poly-phenylene ethers resin, a poly-phenylene sulfides resin, and a benzocyclobutene resin.

The protective layer PSV may include a first via hole VIH1 and a second via hole VIH2.

The first via hole VIH1 may expose each of one region of the 2b-th power line PL2b, another region of the 2b-th power line PL2b, and still another region of the 2b-th power line PL2b. The second via hole VIH2 may expose each of one region of the first upper electrode UE1, one region of the second upper electrode UE2, and one region of the third upper electrode UE3 (for example, one region of the protrusion pattern PRP). In an embodiment, the number of first via holes VIH1 provided in the pixel area PXA may be three, and the number of second via holes VIH2 provided in the pixel area PXA may be three.

The pixel area PXA may include a first emission area EMA1, a second emission area EMA2, and a third emission area EMA3. For example, the pixel area PXA may include the first emission area EMA1, the second emission area EMA2, and the third emission area EMA3 partitioned along the first direction DR1.

The first emission area EMA1 may be an area in which light is emitted from the light emitting elements LD driven by the first sub pixel circuit SPXC1. The light emitting elements LD may be one configuration of the first sub light emitting unit EMU1. In an embodiment, the first emission area EMA1 may be an emission area of the first sub pixel SPXL1.

The second emission area EMA2 may be an area in which light is emitted from the light emitting elements LD driven by the second sub pixel circuit SPXC2. Here, the light emitting elements LD may be one configuration of the second sub light emitting unit EMU2. In an embodiment, the second emission area EMA2 may be an emission area of the second sub pixel SPXL2.

The third emission area EMA3 may be an area in which light is emitted from the light emitting elements LD driven by the third sub pixel circuit SPXC3. Here, the light emitting elements LD may be one configuration of the third sub light emitting unit EMU3. In an embodiment, the third emission area EMA3 may be an emission area of the third sub pixel SPXL3.

The first emission area EMA1, the second emission area EMA2, and the third emission area EMA3 described above may configure the emission area EMA of the pixel PXL.

The pixel area PXA in which the pixel PXL may include a non-emission area NEMA adjacent to the first emission area EMA1 (or surrounding a periphery of the first emission area EMA1), a non-emission area NEMA adjacent to the second emission area EMA2 (or surrounding a periphery of the second emission area EMA2), and a non-emission area NEMA adjacent to the third emission area EMA3 (or surrounding a periphery of the third emission area EMA3).

As shown in FIGS. 7-9, each of the first sub pixel SPXL1, the second sub pixel SPXL2, and the third sub pixel SPXL3 may include the display element layer DPL (or a display layer) including light emitting elements LD. The display element layer DPL of the first sub pixel SPXL1 may correspond to the first emission area EMA1, the display element layer DPL of the second sub pixel SPXL2 may correspond to the second emission area EMA2, and the display element layer DPL of the third sub pixel SPXL3 may correspond to the third emission area EMA3.

The display element layer DPL may be provided and/or formed on the protective layer PSV.

The display element layer DPL may include a bank BNK, first to fourth electrodes EL1, EL2, EL3, and EL4, light emitting elements LD, first and second connection electrodes CNE1 and CNE2, an intermediate electrode CTE, and first to third insulating layers INS1, INS2, and INS3.

The bank BNK may be a structure defining the pixel PXL (or the first to third sub pixels SPXL1, SPXL2, and SPXL3) and the pixel area PXA or the emission area EMA of the pixel PXL adjacent thereto, and for example, the bank BNK may be a pixel defining layer. The bank BNK may be positioned in an area between the first to third emission areas EMA1, EMA2, and EMA3 and outside the first to third emission areas EMA1, EMA2, and EMA3.

The bank BNK may be a dam structure that defines each emission area EMA to which the light emitting elements LD are required to be supplied in a process of supplying the light emitting elements LD to the pixel PXL (or each sub pixel). For example, by partitioning the first to third emission areas EMA1, EMA2, and EMA3 by the bank BNK, a mixed solution (for example, an ink) including a desired amount and/or types of light emitting elements LD may be supplied.

The bank BNK may be configured to include at least one light blocking material and/or reflective material, to prevent a light leakage defect in which light is leaked between each of the first to third sub pixels SPXL1, SPXL2, and SPXL3 and adjacent sub pixels. According to an embodiment, the bank BNK may include a transparent material (or substance). The transparent material may include, for example, polyamides resin, polyimides resin, or the like, but the disclosure is not limited thereto. According to another embodiment, a reflective material layer may be separately provided and/or formed on the bank BNK in order to further improve efficiency of light emitted from the pixel PXL.

The bank BNK may include at least one opening area exposing configurations positioned under the bank BNK in the pixel area PXA. For example, the bank BNK may include a first opening area OP1 and a second opening area OP2 exposing configurations positioned under the bank BNK in the pixel area PXA. In an embodiment, the first to third emission areas EMA1, EMA2, and EMA3 may be defined by the second opening area OP2 of the bank BNK. Each of the first to third emission areas EMA1, EMA2, and EMA3 and the second opening area OP2 of the bank BNK may correspond to each other.

In the pixel area PXA, the first opening area OP1 of the bank BNK may be positioned to be spaced from the second opening area OP2, and may be positioned to be spaced from each of an upper side and a lower side of the second opening area OP2. Here, the first opening area OP1 of the bank BNK may be the first opening area OP1 described with reference to FIG. 4.

As the bank BNK is disposed in the non-emission area NEMA between the first to third emission areas EMA1, EMA2, and EMA3, a supply (or input) area of the light emitting elements LD in the pixel area PXA may be determined. Accordingly, material efficiency may be improved by supplying the light emitting elements LD only to the supply area. In addition, the number of light emitting elements LD that may be used as an effective light source in a corresponding emission area EMA may be increased by preventing a defect that the light emitting elements LD are supplied to an area other than the supply area. For example, in a step of supplying the light emitting elements LD to the pixel PXL (or each sub pixel), the light emitting elements LD may be prevented from being supplied to an unnecessary area, and the light emitting elements LD may be efficiently supplied to each of the first to third emission areas EMA1, EMA2, and EMA3. Accordingly, the light emitting elements LD may be prevented from being unnecessarily wasted and a manufacturing cost of the display device DD may be reduced.

The bank BNK may be provided (or disposed) and/or formed on the first insulating layer INS1, but the present disclosure is not limited thereto. According to an embodiment, the bank BNK may be provided (or disposed) and/or formed on the protective layer PSV.

The first electrode EL1, the second electrode EL2, the third electrode EL3, and the fourth electrode EL4 may be sequentially arranged along the first direction DR1 on the protective layer PSV of each of the first to third emission areas EMA1, EMA2, and EMA3 (or the first to third sub pixel areas SPXA1, SPXA2, and SPXA3). The first to fourth electrodes EL1, EL2, EL3, and EL4 may be the fourth conductive layer provided (or disposed) and/or formed on the protective layer PSV.

In each of the first to third sub pixel areas SPXA1, SPXA2, and SPXA3 (or the first to third emission areas EMA1, EMA2, and EMA3), the first electrode EL1, the second electrode EL2, the third electrode EL3, and the fourth electrode EL4 may extend in the second direction DR2. An end of each of the first to fourth electrodes EL1, EL2, EL3, and EL4 may be positioned in the first opening area OP1 of the bank BNK. The first to fourth electrodes EL1, EL2, EL3, and EL4 may be separated from other electrodes (for example, first to fourth electrodes provided to adjacent pixels PXL that are adjacent in the second direction DR2) in the first opening area OP1 after the light emitting elements LD are supplied and aligned in each of the first to third emission areas EMA1, EMA2, and EMA3 during a manufacturing process of the display device DD. Each first opening area OP1 of the bank BNK may be an electrode separation area provided for a separation process for the first electrode EL1, the second electrode EL2, the third electrode EL3, and the fourth electrode EL4.

In a corresponding sub pixel area, each of the first to fourth electrodes EL1, EL2, EL3, and EL4 may be disposed to be spaced from an adjacent electrode along the first direction DR1. For example, the first electrode EL1 may be disposed to be spaced from the second electrode EL2 in the first direction DR1, the second electrode EL2 may be disposed to be spaced from the third electrode EL3 in the first direction DR1, the third electrode EL3 may be disposed to be spaced from the fourth electrode EL4 in the first direction DR1, and the fourth electrode EL4 may be disposed to be spaced from a first electrode of an adjacent sub pixel in the first direction DR1. A distance between the first electrode EL1 and the second electrode EL2, a distance between the second electrode EL2 and the third electrode EL3, a distance between the third electrode EL3 and the fourth electrode EL4, and a distance between the fourth electrode E4 and the first electrode of the adjacent sub pixel may be same, but the present disclosure is not limited thereto. According to an embodiment, the distance between the first electrode EL1 and the second electrode EL2, the distance between the second electrode EL2 and the third electrode EL3, the distance between the third electrode EL3 and the fourth electrode EL4, and the distance between the fourth electrode E4 and the first electrode of the adjacent sub pixel may be different from each other.

Each of the first to fourth electrodes EL1, EL2, EL3, and EL4 may be configured of a material having a constant reflectance in order to cause the light emitted from each of the light emitting elements LD to progress in an image display direction (for example, a front direction) of the display device DD. For example, the first to fourth electrodes EL1, EL2, EL3, and EL4 may be configured of a conductive material (or substance) having a constant reflectance. The conductive material (or substance) may include an opaque metal that is suitable for reflecting the light emitted from the light emitting elements LD in the image display direction (for example, the third direction DR3) of the display device DD. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. According to an embodiment, the first to fourth electrodes EL1, EL2, EL3, and EL4 may include a transparent conductive material (substance). The transparent conductive material (substance) may include conductive oxide such as indium tin oxide (ITO), indium zinc oxide (IZO), zinc oxide (ZnO), indium gallium zinc oxide (IGZO), and indium tin oxide (ITZO), conductive polymer such as poly(3,4-ethylenedioxythiophene) (PEDOT), and the like. When the first to fourth electrodes EL1, EL2, EL3, and EL4 include the transparent conductive material (substance), a separate conductive layer formed of an opaque metal for reflecting the light emitted from the light emitting elements LD in the image display direction of the display device DD may be added. However, the material of the first to fourth electrodes EL1, EL2, EL3, and EL4 is not limited to the above-described materials.

In addition, each of the first to fourth electrodes EL1, EL2, EL3, and EL4 may be provided and/or formed as a single layer, but the present disclosure is not limited thereto. According to an embodiment, each of the first to fourth electrodes EL1, EL2, EL3, and EL4 may be provided and/or formed as multiple layers in which at least two or more materials of metals, alloys, conductive oxides, and conductive polymers are stacked. Each of the first to fourth electrodes EL1, EL2, EL3, and EL4 may be formed of multiple layers of at least two or more layers to reduce or minimize distortion caused by signal delay when transferring a signal (or voltage) to the both ends of each of the light emitting elements LD. For example, each of the first to fourth electrodes EL1 to EL4 may be formed of multiple layers in which indium tin oxide (ITO)/silver (Ag)/indium tin oxide (ITO) are sequentially stacked.

In a corresponding sub pixel area, the first electrode EL1 may be electrically connected to a configuration of some of a corresponding pixel circuit layer PCL through the first via hole VIH1. For example, the first electrode EU of the first sub pixel area SPXA1 may be electrically connected to the 2b-th power line PL2b of the corresponding sub pixel area through one via hole VIH1 among the three first via holes VIH1 of the protective layer PSV. The first electrode EL1 of the second sub pixel area SPXA2 may be electrically connected to the 2b-th power line PL2b of the corresponding sub pixel area through another via hole VIH1 among the three first via holes VIH1 of the protective layer PSV. The first electrode EL1 of the third sub pixel area SPXA3 may be electrically connected to the 2b-th power line PL2b of the corresponding sub pixel area through the remaining first via hole VIH1 among the three first via holes VIH1 of the protective layer PSV. In an embodiment, the first electrode EL1 may be the second electrode EL2 described with reference to FIG. 5, and may be a cathode of each of the first to third sub light emitting units EMU1, EMU2, and EMU3.

In a corresponding sub pixel area, the third electrode EL3 may be electrically connected to a configuration of some of a corresponding pixel circuit layer PCL through the second via hole VIH2. For example, the third electrode EL3 of the first sub pixel area SPXA1 may be electrically connected to the first upper electrode UE1 through one second via hole VIH2 among the three second via holes VIH2 of the protective layer PSV. The third electrode EL3 of the second sub pixel area SPXA2 may be electrically connected to the second upper electrode UE2 through another second via hole VIH2 among the three second via holes VIH2. The third electrode EL3 of the third sub pixel area SPXA3 may be electrically connected to the protrusion pattern PRP through the remaining second via hole VIH2 among the three second via holes VIH2. As described above, because the protrusion pattern PRP is one region of the third upper electrode UE3, the third electrode EL3 of the third sub pixel area SPXA3 may be electrically connected to the third upper electrode UE3. In an embodiment, the third electrode EL3 may be the first electrode EL1 described with reference to FIG. 5 and may be an anode of each of the first to third sub light emitting units EMU1, EMU2, and EMU3.

Each of the first to fourth electrodes EL1, EL2, EL3, and EL4 may be used as an alignment electrode (or alignment line) for receiving an alignment signal (e.g., a predetermined alignment signal) before the light emitting elements LD are aligned in the emission area EMA of the pixel PXL, and aligning the light emitting elements LD.

The first electrode EL1 may be connected to the first bus line (refer to "BUL1" of FIG. 4) in the alignment step of the light emitting elements LD, and thus may be used as a first alignment electrode by receiving a first alignment signal from the first driving voltage line DVL1 (or the first power pad of the pad portion PD). The second electrode EL2 may be connected to the second bus line (refer to "BUL2" of FIG. 4) in the alignment step of the light emitting elements LD, and thus may be used as a second alignment electrode by receiving a second alignment signal from the second driving voltage line DVL2 (or the second power pad of the pad portion PD). In the above-described alignment step of the light emitting elements LD, the third electrode EL3 may be connected to the second electrode EL2, and thus may be used as the second alignment electrode by receiving second alignment signal from the second driving voltage line DVL2 (or the second power pad of the pad portion PD). The fourth electrode EL4 may be connected to the first bus line BUL1 in the alignment step of the light emitting elements LD, and thus may be used as the first alignment electrode by receiving the first alignment signal from the first driving voltage line DVL1 (or the first power pad of the pad portion PD). The first and second alignment signals described above may be signals having a voltage difference and/or a phase difference of a degree at which the light emitting elements LD may be aligned between the first to fourth electrodes EL1, EL2, EL3, and EL4. At least one of the first and second alignment signals may be an AC signal, but the present disclosure is not limited thereto.

According to an embodiment, a support member (or pattern) may be positioned between each of the first to fourth electrodes EL1, EL2, EL3, and EL4 and the protective layer PSV in each of the first to third emission areas EMA1, EMA2, and EMA3. For example, as shown in FIG. 9, a bank pattern BNKP may be positioned between each of the first to fourth electrodes EL1, EL2, EL3, and EL4 and the protective layer PSV.

The bank pattern BNKP may be an inorganic insulating layer including an inorganic material or an organic insulating layer including an organic material. According to an embodiment, the bank pattern BNKP may include an organic insulating layer of a single layer and/or an inorganic insulating layer of a single layer, but the present disclosure is not limited thereto. According to an embodiment, the bank pattern BNKP may be provided in a form of multiple layers in which at least one organic insulating layer and at least one inorganic insulating layer are stacked. However, the material of the bank pattern BNKP is not limited to the above-described embodiment, and according to an embodiment, the bank pattern BNKP may include a conductive material (substance).

The bank pattern BNKP may have a cross-section of a trapezoid shape in which a width becomes narrower from one surface (for example, an upper surface) of the protective layer PSV toward an upper portion along the third direction DR3, but the present disclosure is not limited thereto. According to an embodiment, the bank pattern BNKP may include a curved surface having a cross-section of a semi-ellipse shape, a semi-circle shape (or a hemispherical shape), or the like in which a width becomes narrower toward the upper portion along the third direction DR3 from one surface of the protective layer PSV. On a cross-sectional view, the shape of the bank pattern BNKP is not limited to the above-described embodiments and may be variously changed within a range capable of improving efficiency of the light emitted from each of the light emitting elements LD.

The bank pattern BNKP may be provided (or disposed) and/or formed on one surface of the protective layer PSV, but the present disclosure is not limited thereto. According to an embodiment, the bank pattern BNKP may be provided integrally with the protective layer PSV and may be configured as one region of the protective layer PSV. For example, the bank pattern BNKP may be formed by the same process as the protective layer PSV and may be designed to have a higher (or greater) height (or thickness) in the third direction DR3 than an upper surface of the protective layer PSV.

Each of the first to fourth electrodes EL1, EL2, EL3, and EL4 may be provided and/or formed on the bank pattern BNKP. Accordingly, because each of the first to fourth electrodes EL1, EL2, EL3, and EL4 has a surface profile corresponding to a shape of the bank pattern BNKP disposed under the first to fourth electrodes EL1, EL2, EL3, and EL4, the light emitted from the light emitting elements LD may be reflected by each of the first to fourth electrodes EL1, EL2, EL3, and EL4 and may further advance in the image display direction of the display device DD. The bank pattern BNKP and each of the first to fourth electrodes EL1, EL2, EL3, and EL4 may be used as a reflective member that induces the light emitted from the light emitting elements LD in a desired direction, thereby improving light efficiency of the display device DD. When each pixel PXL does not include the bank pattern BNKP, the first to fourth electrodes EL1, EL2, EL3, and EL4 may be provided and/or formed on one surface (for example, the upper surface) of the protective layer PSV.

After the light emitting elements LD are aligned in each of the first to third emission areas EMA1, EMA2, and EMA3, in order to independently (or individually) drive each of the first to third sub pixels SPXL1, SPXL2, and SPXL3, a portion of each of the first to fourth electrodes EL1, EL2, EL3, and EL4 positioned between the sub pixels adjacent in the second direction DR2 may be removed, and thus an end thereof may be positioned in each first opening area OP1 of the bank BNK.

After the light emitting elements LD are aligned in each of the first to third emission areas EMA1, EMA2, and EMA3, each of the first to fourth electrodes EL1, EL2, EL3, and EL4 may be used as a driving electrode for driving the light emitting elements LD.

The first insulating layer INS1 may be provided (or disposed) and/or formed on the first to fourth electrodes EL1, EL2, EL3, and EL4. For example, the first insulating layer INS1 may be formed to cover one region of the first to fourth electrodes EL2, EL3, and EL4, and may be partially opened to expose another region of the first to fourth electrodes EL1, EL2, EL3, and EL4.

The first insulating layer INS1 may include an inorganic insulating layer formed of an inorganic material or an organic insulating layer formed of an organic material. The first insulating layer INS1 may be formed of an inorganic insulating layer that is suitable for protecting the light emitting elements LD from the pixel circuit layer PCL. For example, the first insulating layer INS1 may include at least one of metal oxides such as silicon nitride ($SiN_x$), silicon oxide ($SiO_x$), silicon oxynitride ($SiO_xN_y$), and aluminum oxide ($AlO_x$), but the present disclosure is not limited thereto. According to an embodiment, the first insulating layer INS1 may be formed of an organic insulating layer that is suitable for flattening a support surface of the light emitting elements LD. The first insulating layer INS1 may be provided as a single layer or multiple layers.

The first insulating layer INS1 may be provided (or disposed) and/or formed on the protective layer PSV to cover the first to fourth electrodes EL1, EL2, EL3, and EL4 entirely. After the light emitting elements LD are supplied (or input) and aligned on the first insulating layer INS1, the first insulating layer INS1 may be partially opened to expose one region of each of the first and third electrodes EU and EL3. The first insulating layer INS1 may be patterned in a form of an individual pattern that is locally disposed under the light emitting elements LD after supplying (or inputting) and aligning the light emitting elements LD. The first insulating layer INS1 may cover regions other than one region of each of the first and third electrodes EL1 and EL3. According to an embodiment, the first insulating layer INS1 may be omitted. In addition, according to an embodiment, the first insulating layer INS1 may be partially opened to expose one region of each of the first to fourth electrodes EL1, EL2, EL3, and EL4.

The bank BNK may be provided and/or formed on the first insulating layer INS1.

In each of the first to third emission areas EMA1, EMA2, and EMA3 of the pixel PXL, the third electrode EL3 and the fourth electrode EL4 may configure the first series stage (refer to "SET1" of FIG. 5) together with a plurality of light emitting elements LD connected in parallel between the third electrode EL3 and the fourth electrode EL4, and the first electrode EL1 and the second electrode EL2 may configure the second series stage (refer to "SET2" of FIG. 5) together with a plurality of light emitting elements LD connected in parallel between the first electrode EL1 and the second electrode EL2.

In an embodiment, the first and second series stages SET1 and SET2 may be disposed in each of the first to third emission areas EMA1, EMA2, and EMA3, and the first and second series stages SET1 and SET2 may configure a sub light emitting unit of each of the first to third sub pixels SPXL1, SPXL2, and SPXL3. For example, the first and second series stages SET1 and SET2 disposed in the first emission area EMA1 may configure the first sub light emitting unit EMU1 of the first sub pixel SPXL1, the first and second series stages SET1 and SET2 disposed in the second emission area EMA2 may configure the second sub light emitting unit EMU2 of the second sub pixel SPXL2, and the first and second series stages SET1 and SET2 disposed in the third emission area EMA3 may configure the third sub light emitting unit EMU3 of the third sub pixel SPXL3.

The third electrode EL3 included in the first series stage SET1 may be an anode of each of the first to third sub light emitting units EMU1, EMU2, and EMU3, and the first electrode EU included in the second series stage SET2 may be a cathode of a corresponding sub light emitting unit.

Each of the light emitting elements LD may be an ultra-small light emitting diode of, for example, a size as small as a nano scale to a micro scale, using an inorganic crystal structure material. Each of the light emitting elements LD may be an ultra-small light emitting diode manufactured by an etching method or an ultra-small light emitting diode manufactured by a growth method.

At least two to tens of light emitting elements LD may be aligned and/or provided in each of the first to third emission areas EMA1, EMA2, and EMA3, but the number of light emitting elements LD is not limited thereto. According to an embodiment, the number of light emitting elements LD aligned and/or provided in each of the first to third emission areas EMA1, EMA2, and EMA3 may be variously changed.

Each of the light emitting elements LD may emit any one of color light and/or white light. Each of the light emitting elements LD may be aligned on the first insulating layer INS1 between two adjacent electrodes among the first to fourth electrodes EL1, EL2, EL3, and EL4 so that the extension direction (or the length direction) of the light emitting elements LD is parallel to the first direction DR1 in a plan view or a cross-sectional view. The light emitting elements LD may be prepared in a form sprayed in a solution to be input to each of the first to third emission areas EMA1, EMA2, and EMA3.

The light emitting elements LD may be input to each of the first to third emission areas EMA1, EMA2, and EMA3 of the pixel PXL through an inkjet printing method, a slit coating method, or other various methods. For example, the light emitting elements LD may be mixed with a volatile solvent and supplied to the pixel area PXA (or each of the first to third emission areas EMA1, EMA2, and EMA3) through an inkjet printing method or a slit coating method. At this time, when an alignment signal corresponding to each of the first to fourth electrodes EL1, EL2, EL3, and EL4 provided in each of the first to third emission areas EMA1, EMA2, and EMA3 is applied, an electric field may be formed between two adjacent electrodes among the first to fourth electrodes EL1, EL2, EL3, and EL4. Therefore, the light emitting elements LD may be aligned between the two adjacent electrodes among the first to fourth electrodes EL1, EL2, EL3, and EL4. As described above, because the same alignment signal (or alignment voltage) is applied to each of the second and third electrodes EL2 and EL3, the light emitting elements LD may not be aligned between the second electrode EL2 and the third electrode EL3. However, the present disclosure is not limited thereto. According to an embodiment, when the alignment signal is applied to each of the second and third electrodes EL2 and EL3, a potential difference may occur between the alignment signals applied to the second electrode EL2 and the third electrode EL3 due to a line resistance of the two electrodes, influence of an electric field induced between the adjacent electrodes, and the like. In this case, the light emitting elements LD may be aligned between the second and third electrodes EL2 and EL3.

After the light emitting elements LD are aligned, the light emitting elements LD may be finally aligned and/or provided in each of the first to third emission areas EMA1, EMA2, and EMA3 by volatilizing the solvent or removing the solvent in other methods.

In FIG. 7, the light emitting elements LD in which the extension direction (or the length direction) is parallel to the first direction DR1 are aligned between the two adjacent electrodes among the first to fourth electrodes EL1, EL2, EL3, and EL4, but the present disclosure is not limited thereto. According to an embodiment, some of the light emitting elements LD in which the extension direction is parallel to the second direction DR2 and/or a direction inclined to the second direction DR2 may be aligned between the two adjacent electrodes. In addition, according to an embodiment, at least one reverse light emitting element (refer to "LDr" of FIG. 5) connected in a reverse direction may be further disposed between the two adjacent electrodes.

In an embodiment of the present disclosure, the light emitting elements LD may include a plurality of first light emitting elements LD1 and a plurality of second light emitting elements LD2.

The first light emitting elements LD1 may be disposed between the first electrode EL1 and the second electrode EL2. The second light emitting elements LD2 may be disposed between the third electrode EL3 and the fourth electrode EL4.

The first light emitting elements LD1 may be aligned in the same direction between the first electrode EL1 and the second electrode EL2. The first electrode EL1 and the second electrode EL2 may configure the second series stage SET2 of each of the first to third sub light emitting units EMU1, EMU2, and EMU3 together with the first light emitting elements LD1 connected in parallel in the same direction between the first electrode EL1 and the second electrode EL2.

The second light emitting elements LD2 may be aligned in the same direction between the third electrode EL3 and the fourth electrode EL4. The third electrode EL3 and the fourth electrode EL4 may configure the first series stage SET1 of each of the first to third sub light emitting units EMU1, EMU2, and EMU3 together with the second light emitting elements LD2 connected in the same direction between the third electrode EL3 and the fourth electrode EL4.

The first and second light emitting elements LD1 and LD2 described above may be provided and/or formed on the first insulating layer INS1 in each of the first to third emission areas EMA1, EMA2, and EMA3.

Each of the second insulating layers INS2 may be provided and/or formed on the above-described light emitting elements LD.

The second insulating layer INS2 may be provided and/or formed on the light emitting elements LD, partially cover an outer surface (e.g., an outer peripheral or circumferential surface) (or surface) of each of the light emitting elements LD, and expose both ends of each of the light emitting elements LD to the outside.

The second insulating layer INS2 may be configured of a single layer or multiple layers, and may include an inorganic insulating layer including at least one inorganic material or an organic insulating layer including at least one organic material. The second insulating layer INS2 may include an inorganic insulating layer that is suitable for protecting each active layer (refer to "12" of FIG. 1) of the light emitting elements LD from external oxygen and moisture, and the like. However, the present disclosure is not limited thereto. The second insulating layer INS2 may be configured of an organic insulating layer including an organic material according to a design condition or the like of the display device DD to which the light emitting elements LD are applied. The light emitting elements LD may be prevented from deviating from an aligned position by forming the second insulating layer INS2 on the light emitting elements LD after the alignment of the light emitting elements LD is completed in each of the first to third emission areas EMA1, EMA2, and EMA3.

When an empty gap (or space) is present between the first insulating layer INS1 and the light emitting elements LD before forming the second insulating layer INS2, the empty gap may be filled with the second insulating layer INS2 in a process of forming the second insulating layer INS2. In this case, the second insulating layer INS2 may also be configured of an organic insulating layer that is suitable for filling the empty gap between the first insulating layer INS1 and the light emitting elements LD.

In each of the first to third emission areas EMA1, EMA2, and EMA3, the first and second connection electrodes CNE1 and CNE2 and the intermediate electrode CTE may be configurations that electrically connect the first to fourth electrodes EL1, EL2, EL3, and EL4 with the light emitting elements LD more stably.

The first connection electrode CNE1 may be provided (or disposed) and/or formed on the first electrode EU and one end of each of the first light emitting elements LD1. The first connection electrode CNE1 may directly contact the first electrode EL1 exposed by the first insulating layer INS1 to be connected to the first electrode EL1. According to an embodiment, when a conductive capping layer is disposed on the first electrode EL1, the first connection electrode CNE1 may be disposed on the capping layer to contact the capping layer and to be connected to the first electrode EL1. The above-described capping layer may protect the first electrode EL1 from a defect occurring during a manufacturing process of the display device DD, and may further strengthen adhesion between the first electrode EL1 and the protective layer PSV positioned under the first electrode EL1. The capping layer may include a transparent conductive material (or substance) such as indium zinc oxide (IZO). The first connection electrode CNE1 may electrically connect the first electrode EL1 and one end of each of the first light emitting elements LD1.

The first connection electrode CNE1 may have a bar shape extending along the second direction DR2 in a plan view, but the present disclosure is not limited thereto. According to an embodiment, the shape of the first connection electrode CNE1 may be variously changed within a range in which the first connection electrode CNE1 is electrically connected to one end of the first light emitting element LD1 stably. In addition, the shape of the first connection electrode CNE1 may be variously changed in consideration of a connection relationship with the first electrode EL1 disposed under the first connection electrode CNE1.

The second connection electrode CNE2 may be disposed on the third electrode EL3 and another end of the second light emitting elements LD2. The second connection electrode CNE2 may directly contact the third electrode EL3 exposed by the first insulating layer INS1 and may be connected to the third electrode EL3. According to an embodiment, when a conductive capping layer is disposed on the third electrode EL3, the second connection electrode CNE2 may be disposed on the capping layer, and may be connected to the third electrode EL3 through the capping layer. The second connection electrode CNE2 may electrically connect the third electrode EL3 and the other end of each of the second light emitting elements LD2.

The second connection electrode CNE2 may have a bar shape extending along the second direction DR2 in a plan view, but the present disclosure is not limited thereto. According to an embodiment, the shape of the second connection electrode CNE2 may be variously changed within a range in which the second connection electrode CNE2 is electrically connected to the other end of the second light emitting element LD2 stably. In addition, the shape of the second connection electrode CNE2 may be variously changed in consideration of a connection relationship with the third electrode EL3 disposed under the second connection electrode CNE2.

The first and second connection electrodes CNE1 and CNE2 may be configured of various transparent conductive materials. For example, the first and second connection electrodes CNE1 and CNE2 may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and the like, and may be configured to be substantially transparent or translucent to satisfy a desired transmittance (e.g., a predetermined transmittance). However, the material of the first and second connection electrodes CNE1 and CNE2 is not limited to the above-described embodiment. According to an embodiment, the first and second connection electrodes CNE1 and CNE2 may be configured of various opaque conductive materials (or substances). The first and second connection electrodes CNE1 and CNE2 may be formed of a single layer or multiple layers. In an embodiment, the first and second connection electrodes CNE1 and CNE2 may be the fifth conductive layer provided (or disposed) and/or formed on the second insulating layer INS2.

The first connection electrode CNE1 and the second connection electrode CNE2 may be provided at the same layer and may be formed through the same process. However, the present disclosure is not limited thereto, and according to an embodiment, the first connection electrode CNE1 and the second connection electrode CNE2 may be provided on different layers and may be formed through different processes. In this case, another insulating layer may be provided and/or formed between the first connection electrode CNE1 and the second connection electrode CNE2. The other insulating layer may be provided on one of the first connection electrode CNE1 and the second connection electrode CNE2 to prevent corrosion of one connection electrode of the first connection electrode CNE1 and the second connection electrode CNE2 by covering the one connection electrode so that the one connection electrode is not exposed to the outside. In this case, the other insulating layer may include an inorganic insulating layer formed of an inorganic material or an organic insulating layer formed of an organic material. For example, the other insulating layer may include at least one of a metal oxide such as silicon nitride ($SiN_x$), silicon oxide ($SiO_x$), silicon oxynitride ($SiO_xN_y$), and aluminum oxide ($AlO_x$), but the present disclosure is not limited thereto. In addition, the other insulating layer may be formed as a single layer or multiple layers.

The intermediate electrode CTE may include a first intermediate electrode CTE1 and a second intermediate electrode CTE2 extending in the second direction DR2.

The first intermediate electrode CTE1 may be provided on the second electrode EL2 and may overlap the second electrode EL2 in a plan view. The first intermediate electrode CTE1 may be disposed on the first insulating layer INS1 on the second electrode EL2 to be electrically insulated (or separated) from the second electrode EL2. The first intermediate electrode CTE1 may be disposed on the other end of each of the first light emitting elements LD1 in each of the first to third emission areas EMA1, EMA2, and EMA3, and may be electrically and/or physically connected to the first light emitting elements LD1.

The second intermediate electrode CTE2 may be provided on the fourth electrode EL4 and may overlap the fourth electrode EL4 in a plan view. The second intermediate electrode CTE2 may be disposed on the first insulating layer INS1 on the fourth electrode EL4 to be electrically insulated (or separated) from the fourth electrode EL4. The second intermediate electrode CTE2 may be disposed on one end of each of the second light emitting elements LD2 in each of the first to third emission areas EMA1, EMA2, and EMA3 and may be electrically and/or physically connected to the second light emitting elements LD2.

The first intermediate electrode CTE1 and the second intermediate electrode CTE2 may be provided integrally and may be connected to each other. The first intermediate electrode CTE1 and the second intermediate electrode CTE2 may be different regions of the intermediate electrode CTE. The first intermediate electrode CTE1 may be the same configuration as the second intermediate electrode CTE2 described with reference to FIG. 5, and the second intermediate electrode CTE2 may be the same configuration as the first intermediate electrode CTE1 described with reference to FIG. 5. The intermediate electrode CTE may function as a bridge electrode (or a connection member) that electrically connects one end of each of the second light emitting elements LD2 of the first series stage SET1 and the other end of each of the first light emitting elements LD1 of the second series stage SET2. That is, the first series stage SET1 and the second series stage SET2 may be connected to each other through the intermediate electrode CTE.

In an embodiment, one end of each of the first light emitting elements LD1 and one end of each of the second light emitting elements LD2 may include the same type of semiconductor layer (for example, the first semiconductor layer 11 described with reference to FIG. 1). The other end of each of the first light emitting elements LD1 and the other end of each of the second light emitting elements LD2 may include the same type of semiconductor layer (for example, the second semiconductor layer 13 described with reference to FIG. 1).

The intermediate electrode CTE including the first intermediate electrode CTE1 and the second intermediate electrode CTE2 may be spaced from the second connection electrode CNE2 in a plan view, and may be provided in a shape to be around (e.g., surrounding) at least a portion of the second connection electrode CNE2, but the present disclosure is not limited thereto. According to an embodiment, the intermediate electrode CTE may be changed to various shapes within a range in which the intermediate electrode CTE stably connecting the continuous first series stage SET1 and the second series stage SET2. In an embodiment, the first connection electrode CNE1, the second connection electrode CNE2, and the intermediate electrode CTE may be disposed to be spaced from each other in a plan view and a cross-sectional view.

The intermediate electrode CTE may be configured of various transparent conductive materials. For example, the intermediate electrode CTE may include the same material as the first and second connection electrodes CNE1 and CNE2, or one or more materials selected from the materials disclosed as configuration materials of the first and second connection electrodes CNE1 and CNE2.

The intermediate electrode CTE may be provided at the same layer as the first and second connection electrodes CNE1 and CNE2 and may be formed through the same process. For example, the intermediate electrode CTE and the first and second connection electrodes CNE1 and CNE2 may be provided and/or formed on the second insulating layer INS2. However, the present disclosure is not limited thereto, and the intermediate electrode CTE may be provided on a layer different from that of the first and second connection electrodes CNE1 and CNE2 and may be formed through a process different from that of the first and second connection electrodes CNE1 and CNE2 according to an embodiment.

The third insulating layer INS3 may be provided and/or formed on the first connection electrode CNE1, the second connection electrode CNE2, and the intermediate electrode CTE. The third insulating layer INS3 may be an inorganic insulating layer including an inorganic material or an organic insulating layer including an organic material. For example, the third insulating layer INS3 may have a structure in which at least one inorganic insulating layer or at least one organic insulating layer is alternately stacked. The third insulating layer INS3 may completely cover the display element layer DPL to prevent moisture or humidity from flowing into the display element layer DPL including the light emitting elements LD.

Assuming that a driving current flows from the first power line PL1 to the second power line PL2 by the first pixel transistor T1 of each of the first to third sub pixels SPXL1, SPXL2, and SPXL3, the driving current may flow into the sub light emitting unit of a corresponding sub pixel through the second via hole VIH2 of the corresponding sub pixel.

For example, the driving current is supplied to the third electrode EL3 of the first emission area EMA1 through the second via hole VIH2 of the first sub pixel SPXL1, and the driving current flows to the intermediate electrode CTE via the second light emitting element LD2 through the second connection electrode CNE2 connected to the third electrode EL3. Accordingly, the second light emitting elements LD2 may emit light with a luminance corresponding to a current distributed to each of the second light emitting elements LD2 at the first series stage SET1 of the first sub pixel SPXL1. The driving current flowing through the intermediate electrode CTE flows to the first connection electrode CNE1 via the intermediate electrode CTE and the first light emitting elements LD1. Accordingly, the first light emitting elements LD1 may emit light with a luminance corresponding to a current distributed to each of the first light emitting elements LD1 at the second series stage SET2 of the first sub pixel SPXL1.

The driving current is supplied to the third electrode EL3 of the second emission area EMA2 through the second via hole VIH2 of the second sub pixel SPXL2, and the driving current flows to the intermediate electrode CTE via the second light emitting elements LD2 through the second connection electrode CNE2 connected to the third electrode EL3. Accordingly, the second light emitting elements LD2 may emit light with a luminance corresponding to a current distributed to each of the second light emitting elements at the first series stage SET1 of the second sub pixel SPXL2. The driving current flowing through the intermediate electrode CTE flows to the first connection electrode CNE1 via the intermediate electrode CTE and the first light emitting elements LD1. Accordingly, the first light emitting elements LD1 may emit light with a luminance corresponding to a current distributed to each of the first light emitting elements LD1 at the second series stage SET2 of the second sub pixel SPXL2.

Additionally, the driving current is supplied to the third electrode EL3 of the third emission area EMA3 through the second via hole VIH2 of the third sub pixel SPXL3, and the driving current flows to the intermediate electrode CTE via the second light emitting elements LD2 through the second connection electrode CNE2 connected to the third electrode EL3. Accordingly, the second light emitting elements LD2 may emit light with a luminance corresponding to a current distributed to each of the second light emitting elements LD2 at the first series stage SET1 of the third sub pixel SPXL3. The driving current flowing through the intermediate electrode CTE flows to the first connection electrode CNE1 via the intermediate electrode CTE and the first light emitting elements LD1. Accordingly, the first light emitting elements LD1 may emit light with a luminance corresponding to the current distributed to each of the first light emitting elements LD1 at the second series stage SET2 of the third sub pixel SPXL3.

In the method described above, the driving current of each of the first to third sub pixels SPXL1, SPXL2, and SPXL3 may flow through sequentially the second light emitting elements LD2 of the first series stage SET1 and the first light emitting elements LD1 of the second series stage SET2. Accordingly, each of the first to third sub pixels SPXL1, SPXL2, and SPXL3 may emit light with a luminance corresponding to a data signal supplied during each frame period.

According to the above-described embodiment, in a step of forming the first connection electrode CNE1 and the second connection electrode CNE2, the intermediate electrode CTE may be concurrently formed (e.g., simultaneously formed). Accordingly, a manufacturing process of the first to third sub pixels SPXL1, SPXL2, and SPXL3 and the display device DD having the same may be simplified, thereby improving a product yield.

In addition, according to the above-described embodiment, by configuring the first to third sub light emitting units EMU1, EMU2, and EMU3 of a series/parallel mixed structure, the pixel PXL may be stably driven. Therefore, power consumption efficiency may be improved by reducing the driving current flowing through the display panel DP of the display device.

According to an embodiment, at least one overcoat layer (for example, a layer that flattens an upper surface of the display element layer DPL) may be further disposed on the third insulating layer INS3.

According to another embodiment, the display element layer DPL of each of the first to third sub pixels SPXL1, SPXL2, and SPXL3 may further selectively include an optical layer. For example, the display element layer DPL may further include a color conversion layer including color conversion particles that convert the light emitted from the light emitting elements LD into light of a specific color.

Figure 10:
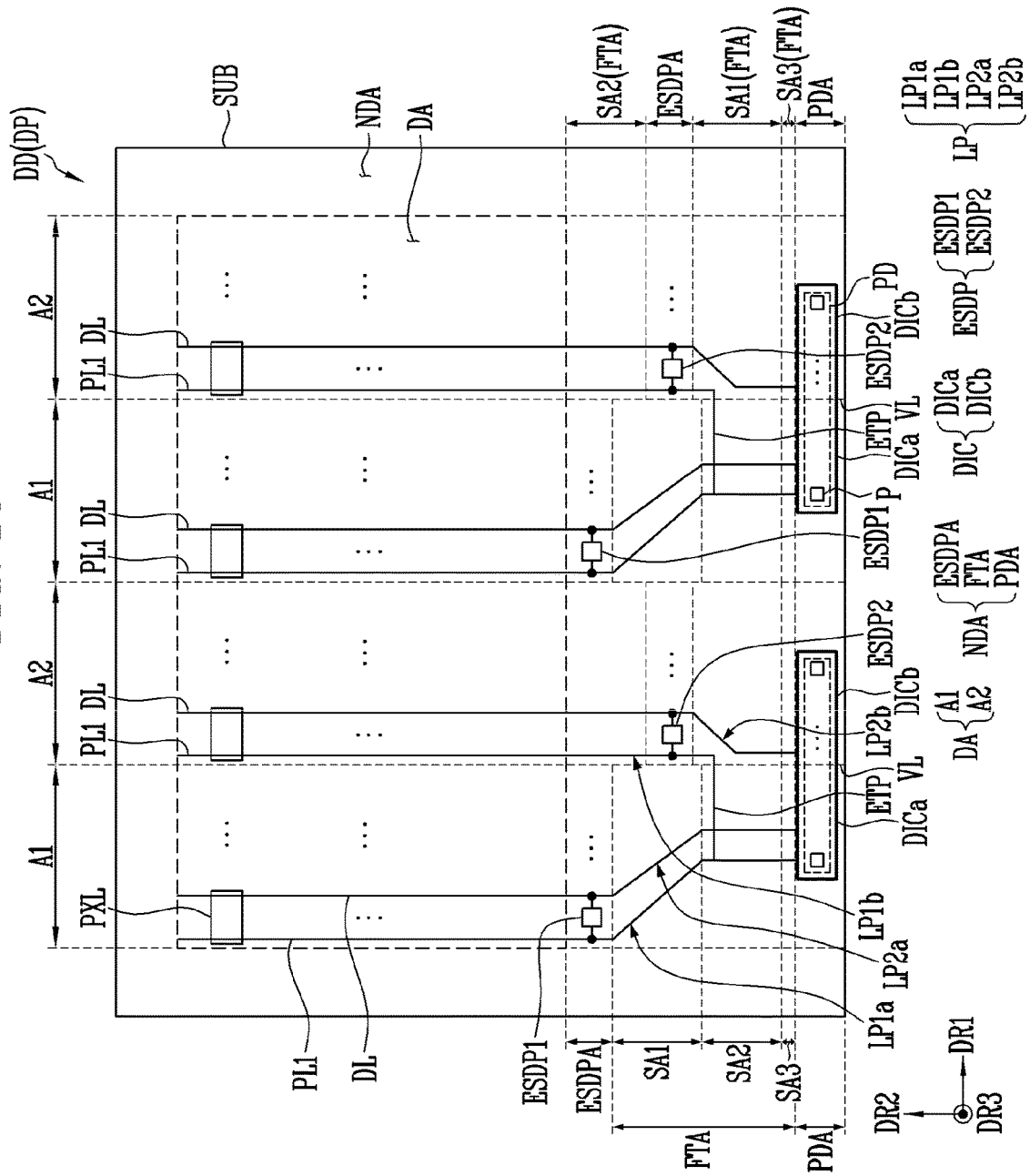
FIG. 10 is a plan view schematically illustrating a display device according to an embodiment of the present disclosure.

FIG. 10 is a plan view schematically illustrating a display device DD according to an embodiment of the present disclosure. For example, FIG. 10 schematically shows only a partial configuration of the display device DD according to an embodiment of the present disclosure.

In relation to the display device DD of FIG. 10, a point different from that of the above-described embodiment is mainly described in order to avoid a repetitive description.

In FIG. 10, a horizontal direction on a plane is indicated as the first direction DR1, a vertical direction on the plane is indicated as the second direction DR2, and a thickness direction of the substrate SUB on a cross section is indicated as the third direction DR3.

Referring to FIG. 10, the display device DD according to an embodiment of the present disclosure may include the substrate SUB including the display area DA and the non-display area NDA.

The pixels PXL and a plurality of signal lines connected to the pixels PXL may be disposed in the display area DA. The signal lines may include the first power line PL1 and the data line DL. Here, the first power line PL1 may be the first power line PL1 described with reference to FIGS. 4 and 6, and the data line DL may be each of the first to third data lines D1, D2, and D3 described with reference to FIG. 6.

In an embodiment of the present disclosure, the display area DA may be divided into at least one first area A1 and at least one second area A2. Here, the first area A1 may be an area of the display area DA in which at least one pixel PXL electrically connected to the first portion DICa of the driver DIC is positioned, and the second area A2 may be an area of the display area DA in which at least one pixel PXL electrically connected to the second portion DICb of the driver DIC is positioned. Hereinafter, for convenience, the pixels PXL positioned in the first area A1 are referred to as first pixels, and the pixels PXL positioned in the second area A2 are referred to as second pixels. In addition, when the first pixel PXL and the second pixel PXL are collectively named, the first pixel PXL and the second pixel PXL are referred to as a pixel PXL or pixels PXL.

The first power line PL1 may be electrically connected to the driver DIC (or the first driving voltage line (refer to "DVL1" of FIG. 4)) through a corresponding fan-out line LP included in the line portion. The data line DL may be electrically connected to the driver DIC through a corresponding fan-out line LP included in the line portion. A plurality of first power lines PL1 and a plurality of data lines DL may be arranged in the display area DA at a distance of at least one pixel PXL.

The line portion and the driver DIC may be disposed in the non-display area NDA.

The line portion may include a plurality of lines, for example, fan-out lines LP. Here, the fan-out lines LP may be electrically connected to signal lines connected to each of the pixels PXL. For example, the line portion may include a 1a-th fan-out line LP1a electrically connected to the first power line PL1 positioned in the first area A1, a 2a-th fan-out line LP2a electrically connected to the data line DL positioned in the first area A1, a 1b-th fan-out line LP1b electrically connected to the first power line PL1 positioned in the second area A2, and a 2b-th fan-out line LP2b electrically connected to the data line DL positioned in the second area A2.

Each of the fan-out lines LP may be a connection means (or member) electrically connecting the driver DIC and the pixels PXL positioned in the same pixel column in the second direction DR2.

The driver DIC may be the same configuration as the driver DIC described with reference to FIG. 4. The driver DIC may be divided into the first portion DICa and the second portion DICb based on a virtual line VL crossing a center (or a middle) of the driver DIC along the second direction DR2. The first portion DICa of the driver DIC may be electrically connected to the first pixel PXL through the 1a-th and 2a-th fan-out lines LP1a and LP2a, and the second portion DICb of the driver DIC may be electrically connected to the second pixel PXL through the 1b-th and 2b-th fan-out lines LP1b and LP2b.

The first portion DICa of the driver DIC may be electrically connected to the first driving power line DVL1 integrally formed with the first power pad of the pad portion PD to supply the voltage of the first driving power (refer to "VDD" of FIG. 5) to the first driving power line DVL1. The second portion DICb of the driver DIC may be electrically connected to the second driving power line (refer to "DVL2" of FIG. 4) integrally formed with the second power pad of the pad portion PD to supply the voltage of the second driving power (refer to "VSS" of FIG. 5) to the second driving power line DVL2.

In some embodiments, due to high resolution of the display device DD, as a distance between circuits and signal lines disposed in the display device DD narrows, a possibility of occurrence of a static electricity increases. When the static electricity occurs, the pixel circuit (refer to "PXC" of FIG. 5) of each pixel PXL may malfunction or a problem may occur in a configuration of the pixel circuit PXC. To solve this problem, an antistatic portion ESDP connected to the data line DL and the first power line PL1 may be positioned in one area of the non-display area NDA.

The antistatic portion ESDP may prevent a pulse potential due to the static electricity from flowing into an internal circuit, for example, the pixel circuit PXC. In an embodiment, the antistatic portion ESDP may include a first antistatic portion ESDP1 and a second antistatic portion ESDP2.

The first antistatic portion ESDP1 may be connected to the 1a-th fan-out line LP1a and the 2a-th fan-out line LP2a in the non-display area NDA. The first antistatic portion ESDP1 may be connected between the 1a-th fan-out line LP1a and the 2a-th fan-out line LP2a and may distribute the pulse due to the static electricity flowing into the data line DL of the first area A1 to the 1a-th fan-out line LP1a.

The second antistatic portion ESDP2 may be connected to the extension portion ETP and the 2b-th fan-out line LP2b in the non-display area NDA. Here, the extension portion ETP may be the 1a-th fan-out line LP1a branched from the 1a-th fan-out line LP1a and extended to an area of the non-display area NDA in which the second antistatic portion ESDP2 is positioned. The extension portion ETP may be electrically connected to the 1b-th fan-out line LP1b extended from the first power line PL1 of the second area A2 to the non-display area NDA. Accordingly, the extension portion ETP may be electrically connected to the first power line PL1 of the second area A2.

The second antistatic portion ESDP2 may be connected between the extension portion ETP and the 2b-th fan-out line LP2b and may distribute the pulse due to the static electricity flowing into the data line DL of the second area A2 to the extension portion ETP, that is, the 1a-th fan-out line LP1a.

As described above, when external static electricity flows into the corresponding data line DL, the first and second antistatic portions ESDP1 and ESDP2 may distribute the pulse due to the static electricity to the 1a-th fan-out line LP1a to which voltage of the first driving power VDD is applied.

In an embodiment of the present disclosure, the non-display area NDA may include an antistatic circuit area ESDPA in which the antistatic portion ESDP is positioned, a fan-out area FTA in which the fan-out lines LP are positioned, and a pad area PDA in which the pad portion PD is positioned. In an embodiment, the fan-out area FTA may be divided into a first sub area SA1, a second sub area SA2, and a third sub area SA3 along the second direction DR2.

The non-display area NDA corresponding to the first area A1 may be divided into the antistatic circuit area ESDPA, the first sub area SA1, the second sub area SA2, and the third sub area SA3 sequentially in a direction from the first area A1 to the driver DIC along the second direction DR2. The non-display area NDA corresponding to the second area A2 may be divided into the second sub area SA2, the antistatic circuit area ESDPA, the first sub area SA1, and the third sub area SA3 sequentially in a direction from the second area A2 to the driver DIC along the second direction DR2. Accordingly, configurations positioned in the non-display area NDA corresponding to the first area A1 and configurations positioned in the non-display area NDA corresponding to the second area A2 may have different arrangement (or disposition) relationships.

A detailed description of the non-display area NDA and the configurations positioned in the non-display area NDA is described later with reference to FIGS. 14-20.

Figure 11:
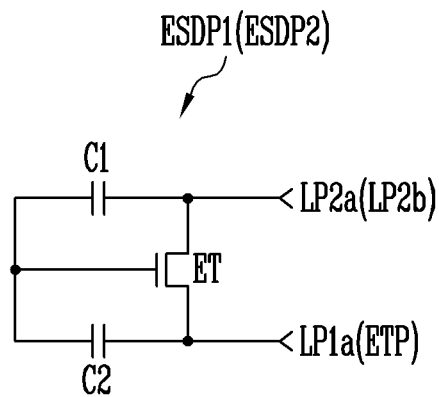
FIG. 11 is a circuit diagram illustrating an electrical connection relationship between components included in first and second antistatic portions of FIG. 10, according to an embodiment.

FIG. 11 is a circuit diagram illustrating an electrical connection relationship between components included in the first and second antistatic portions ESDP1 and ESDP2 of FIG. 10, according to an embodiment.

Referring to FIGS. 10 and 11, the first antistatic portion ESDP1 may include at least one transistor ET having an interconnection relationship between the 1a-th fan-out line LP1a and the 2a-th fan-out line LP2a. The first antistatic portion ESDP1 may be designed to have a low impedance in a high voltage region (e.g., a predetermined high voltage region) so as to discharge an overcurrent or to be destroyed itself so as to block the inflow of the static electricity, and to have a high impedance in a normal driving environment so as not to affect a signal supplied through the 1a-th fan-out line LP1a and the 2a-th fan-out line LP2a.

The second antistatic portion ESDP2 may include at least one transistor ET having an interconnection relationship between the extension portion ETP and the 2b-th fan-out line LP2b. The second antistatic portion ESDP2 may be designed to have a low impedance in a high voltage region (e.g., a predetermined high voltage region) so as to discharge an overcurrent or to be destroyed itself so as to block the inflow of the static electricity, and to have a high impedance in a normal driving environment so as not to affect a signal supplied through the extension portion ETP and the 2b-th fan-out line LP2b. In an embodiment, the extension portion ETP may be the 1a-th fan-out line LP1a.

Each of the first and second antistatic portions ESDP1 and ESDP2 may include a transistor ET, a first capacitor C1, and a second capacitor C2.

The transistor ET of the first antistatic portion ESDP1 may be connected between the second fan-out line LP2a supplied with a data signal of the first portion DICa of the driver DIC and the 1a-th fan-out lines LP1a supplied with the voltage of the first driving power. The transistor ET of the second antistatic portion ESDP2 may be connected between the 2b-th fan-out line LP2b supplied with a data signal of the second portion DICb of the driver DIC and the extension portion ETP branched from the 1a-th fan-out line LP1a.

In each of the first and second antistatic portions ESDP1 and ESDP2, the first capacitor C1 may be connected between a gate electrode of the corresponding transistor ET and a first terminal (or a source electrode) of the transistor ET. The second capacitor C2 may be connected between the gate electrode of the transistor ET and a second terminal (or a drain electrode) of the transistor ET. At this time, a gate electrode of the transistor ET may be floating.

Figure 12:
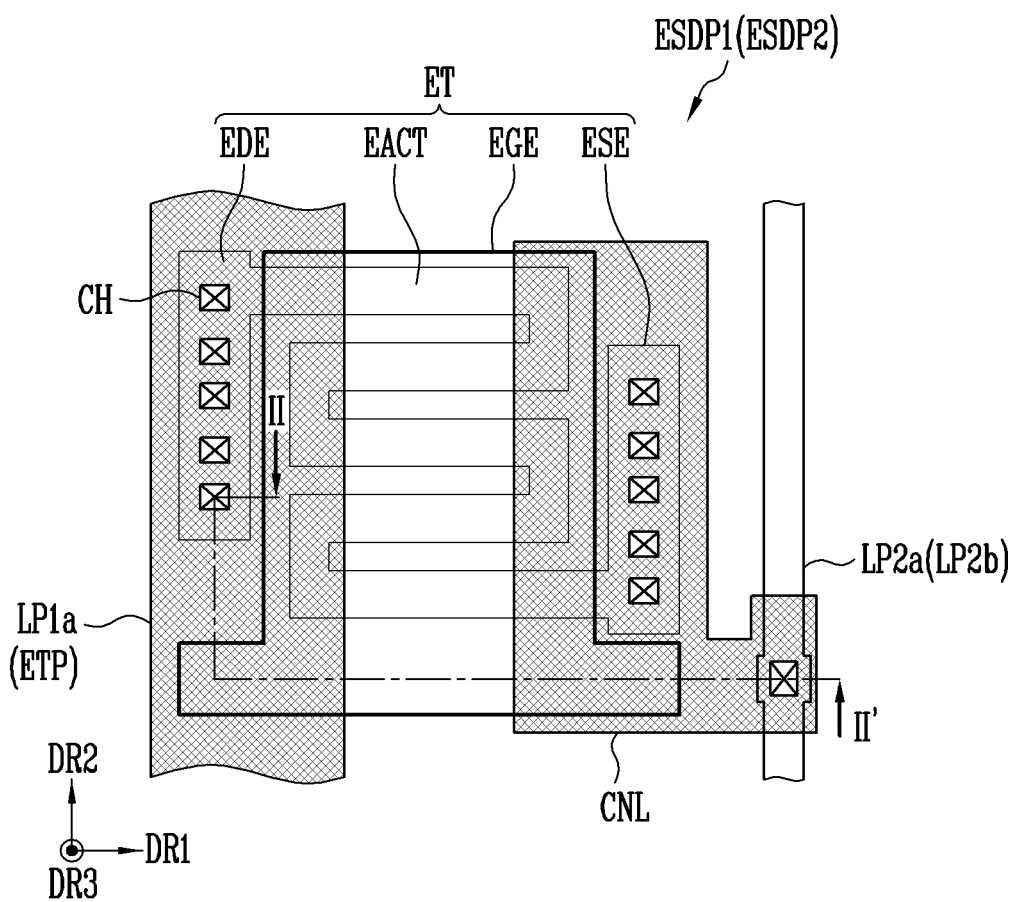
FIG. 12 is a plan view schematically illustrating the first and second antistatic portions of FIG. 10.
Figure 13:
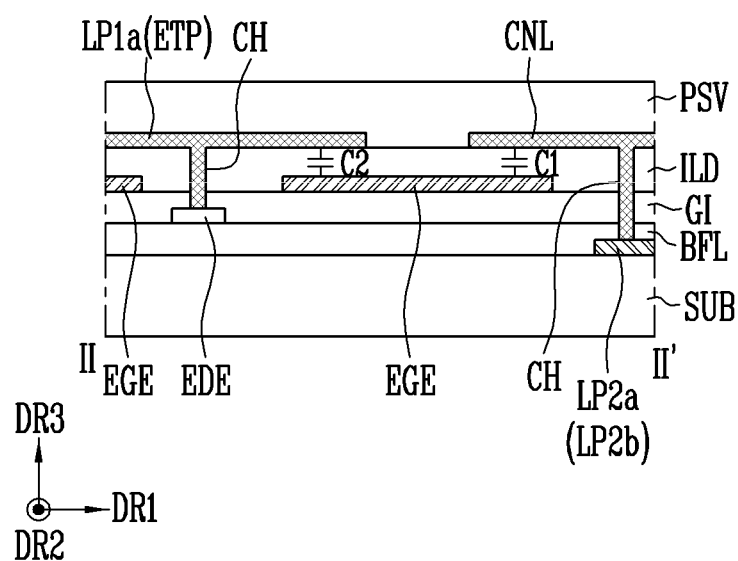
FIG. 13 is a cross-sectional view taken along the line II~II' of FIG. 12.

FIG. 12 is a plan view schematically illustrating the first and second antistatic portions ESDP1 and ESDP2 of FIG. 10, and FIG. 13 is a cross-sectional view taken along the line II~II' of FIG. 12.

Regarding the first and second antistatic portions ESDP1 and ESDP2 of FIGS. 12 and 13, a point different from that of the above-described embodiment is mainly described in order to avoid a repetitive description.

Referring to FIGS. 10-13, the first antistatic portion ESDP1 may include the transistor ET connected between the 1a-th fan-out line LP1a and the 2a-th fan-out line LP2a in the antistatic circuit area ESDPA. The second antistatic portion ESDP2 may include the transistor ET connected between the extension portion ETP and the 2b-th fan-out line LP2b in the antistatic circuit area ESDPA.

The 1a-th fan-out line LP1a and the 2a-th fan-out line LP2a may extend in the second direction DR2. The voltage of the first driving power may be transmitted to the 1a-th fan-out line LP1a from the first portion DICa (or the first driving voltage line (refer to "DVL1" of FIG. 4)) of the driver DIC, and the data signal may be transmitted to the 2a-th fan-out line LP2a from the first portion DICa of the driver DIC.

The 1a-th fan-out line LP1a and the 2a-th fan-out line LP2a may be disposed to be spaced from each other in the first direction DR1, in a plan view. In an embodiment of the present disclosure, the 1a-th fan-out line LP1a may be the third conductive layer disposed on the substrate SUB, and the 2a-th fan-out line LP2a may be the first conductive layer disposed on the substrate SUB. Here, the substrate SUB may be the substrate SUB described with reference to FIGS. 6-9.

The 1a-th fan-out line LP1a may be provided on the same layer as the first scan line S1 described with reference to FIGS. 6-9, may include the same material as the first scan line S1, and may be formed through the same process as the first scan line S1. For example, the 1a-th fan-out line LP1a may be provided and/or formed on the interlayer insulating layer ILD. The 2a-th fan-out line LP2a may be provided at the same layer as the first to third bottom metal layers BML1, BML2, and BML3 described with reference to FIGS. 6-9, may include the same material as the first to third bottom metal layers BML1, BML2, and BML3, and may be formed through the same process as the first to third bottom metal layers BML1, BML2, and BML3. The interlayer insulating layer ILD may be the interlayer insulating layer ILD described with reference to FIGS. 6-9.

The extension portion ETP and the 2b-th fan-out line LP2b may extend in the second direction DR2. The voltage of the first driving power may be transmitted to the extension portion ETP, and the data signal may be transmitted to the 2b-th fan-out line LP2b from the second portion DICb of the driver DIC.

The extension portion ETP and the 2b-th fan-out line LP2b may be disposed to be spaced from each other in the first direction DR1, in a plan view. In an embodiment of the present disclosure, the extension portion ETP may be the third conductive layer, and the 2b-th fan-out line LP2b may be the first conductive layer. The transistor ET of the second antistatic portion ESDP2 connected between the extension portion ETP and the 2b-th fan-out line LP2b may include a gate electrode EGE, an active pattern EACT, a source region ESE, and a drain region EDE.

The first antistatic portion ESDP1 and the second antistatic portion ESDP2 may have substantially the same or similar structure. Hereinafter, the first antistatic portion ESDP1 of the first and second antistatic portions ESDP1 and ESDP2 is described as a representative, and a description of the second antistatic portion ESDP2 is briefly described.

The first antistatic portion ESDP1 may include the transistor ET and the first and second capacitors C1 and C2.

The transistor ET may include the gate electrode EGE, the active pattern EACT, the source region ESE, and the drain region EDE.

The gate electrode EGE may be provided in a shape of an isolated island, and may be floating. The gate electrode EGE may be the second conductive layer and may be provided and/or formed on the gate insulating layer GI. The gate electrode EGE may be provided at the same layer as the first and second connection lines CNL1 and CNL2 described with reference to FIGS. 6-9, may include the same material as the first and second connection lines CNL1 and CNL2, and may be formed by the same process as the first and second connection lines CNL1 and CNL2. Here, the gate insulating layer GI may be the gate insulating layer GI described with reference to FIGS. 6-9.

The active pattern EACT, the source region ESE, and the drain region EDE may be semiconductor patterns formed of poly silicon, amorphous silicon, oxide semiconductor, or the like. The active pattern EACT, the source region ESE, and the drain region EDE may be formed of a semiconductor layer that is not doped with an impurity or doped with an impurity. For example, the source region ESE and the drain region EDE may be formed of a semiconductor layer doped with an impurity, and the active pattern EACT may be formed of a semiconductor layer that is not doped with an impurity. As an impurity, for example, an n-type impurity may be used, but the present disclosure is not limited thereto.

The active pattern EACT, the source region ESE, and the drain region EDE may be provided and/or formed on the buffer layer BFL.

The active pattern EACT may extend in a suitable direction (e.g., a predetermined direction) and may have a shape bent a plurality of times along an extended length direction. The active pattern EACT may overlap the gate electrode EGE. Because the active pattern EACT is formed to be long, a channel region of the transistor ET may be formed to be long.

The source region ESE may be connected (or contacted) to one end of the active pattern EACT. In addition, the source region ESE may be electrically and/or physically connected to the 2a-th fan-out line LP2a through the connection line CNL.

The connection line CNL may be the third conductive layer provided (or disposed) and/or formed on the interlayer insulating layer ILD. The connection line CNL may be provided at the same layer as the 1a-th fan-out line LP1a. One end of the connection line CNL may be connected to the source region ESE through a contact hole CH sequentially passing through the gate insulating layer GI and the interlayer insulating layer ILD. Another end of the connection line CNL may be connected to the 2a-th fan-out line LP2a through a contact hole CH sequentially passing through the buffer layer BFL, the gate insulating layer GI, and the interlayer insulating layer ILD.

The drain region EDE may be connected (or contacted) to another end of the active pattern EACT. In addition, the drain region EDE may be connected to the 1a-th fan-out line LP1a through a corresponding contact hole CH. For example, the drain region EDE may be connected to the 1a-th fan-out line LP1a through a contact hole CH sequentially passing through the gate insulating layer GI and the interlayer insulating layer ILD.

The first capacitor C1 may include an upper electrode and a lower electrode. The upper electrode may be one region of the connection line CNL electrically connected to the 2a-th fan-out line LP2a, and the lower electrode may be one region of the gate electrode EGE. That is, the connection line CNL and the gate electrode EGE overlapping each other with the interlayer insulating layer ILD interposed therebetween may be used as the upper electrode and the lower electrode of the first capacitor C1, respectively.

The second capacitor C2 may include an upper electrode and a lower electrode. The upper electrode may be one region of the 1a-th fan-out line LP1a, and the lower electrode may be one region of the gate electrode EGE. That is, the 1a-th fan-out line LP1a and the gate electrode EGE overlapping each other with the interlayer insulating layer ILD interposed therebetween may be used as the upper electrode and the lower electrode of the second capacitor C2, respectively.

The protective layer PSV may be provided and/or formed on the 1a-th fan-out line LP1a and the connection line CNL. The protective layer PSV may be the protective layer PSV described with reference to FIGS. 6-9.

Figure 14:
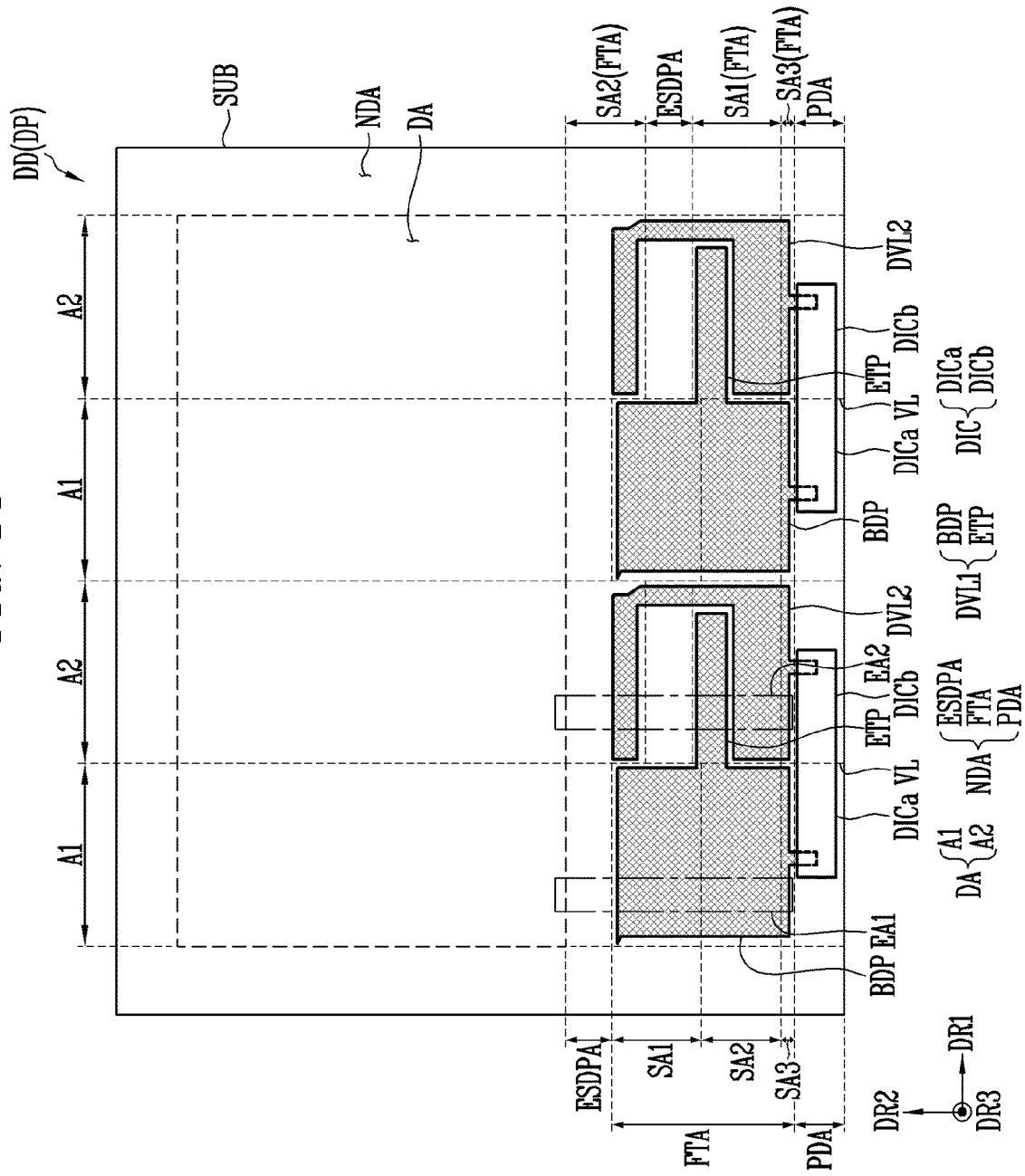
FIG. 14 is a plan view more schematically illustrating the display device of FIG. 10.
Figure 15:
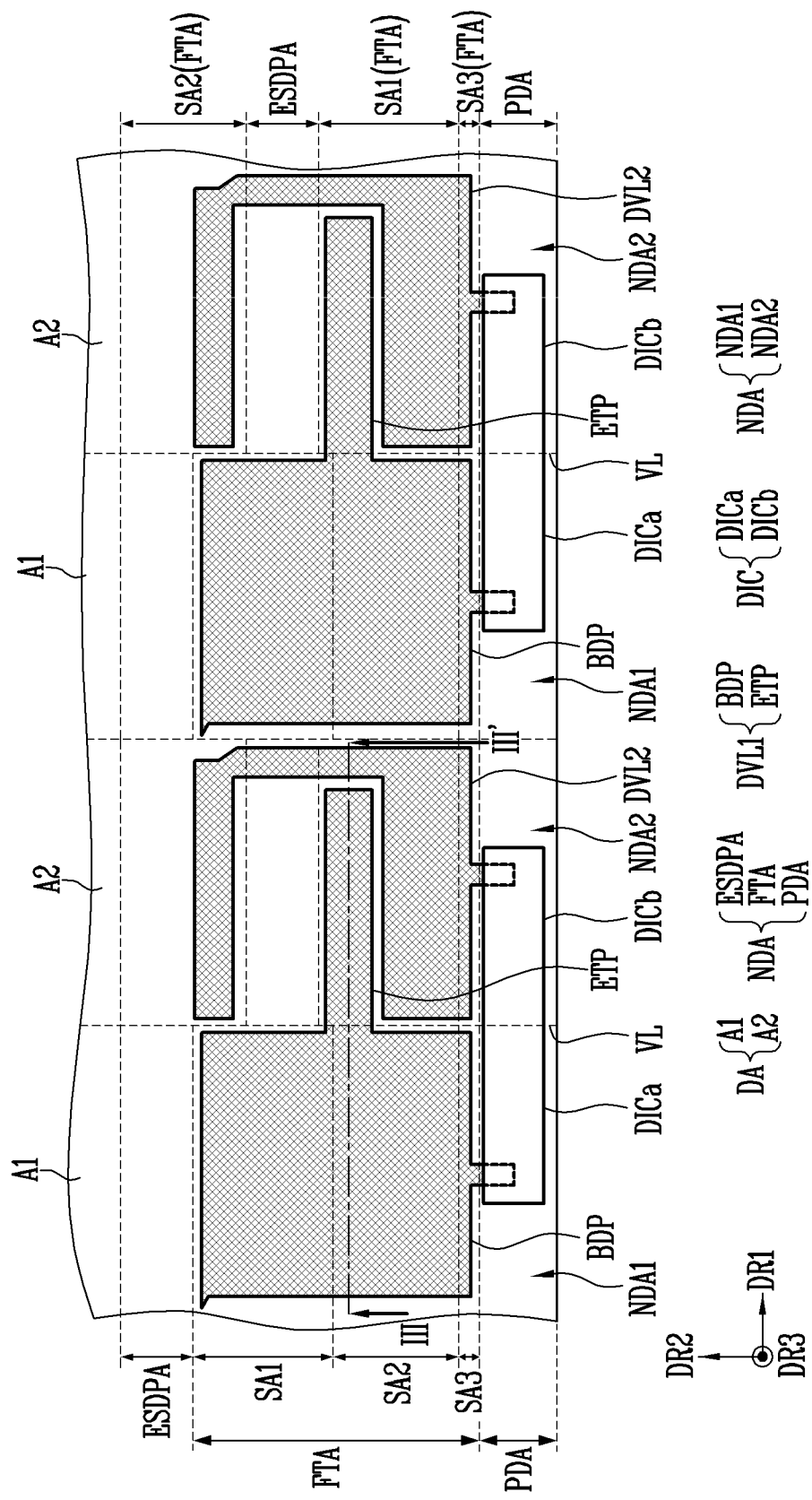
FIG. 15 is a schematic enlarged plan view illustrating first and second driving voltage lines of FIG. 14.
Figure 16:
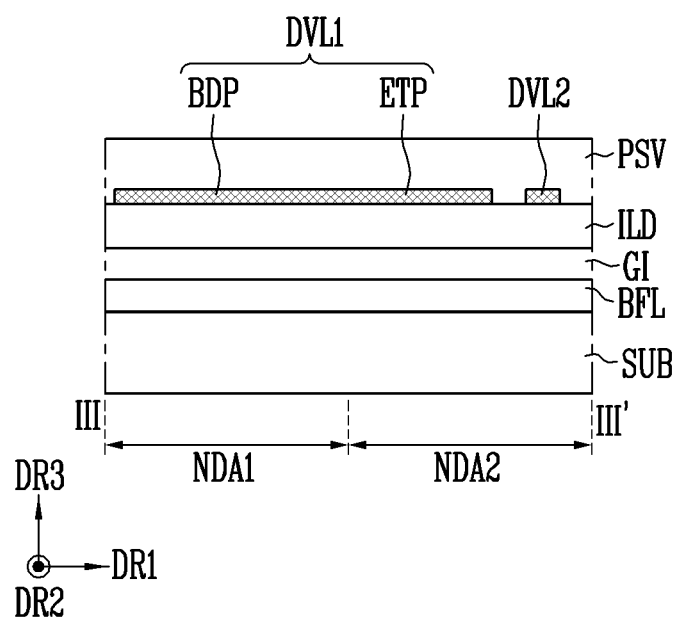
FIG. 16 is a cross-sectional view taken along the line III~III' of FIG. 15.

FIG. 14 is a plan view more schematically illustrating the display device DD of FIG. 10, FIG. 15 is a schematic enlarged plan view illustrating the first and second driving voltage lines DVL1 and DVL2 of FIG. 14, and FIG. 16 is a cross-sectional view taken along the line III~III' of FIG. 15.

For example, in FIGS. 14 and 15, configurations positioned under the first and second driving voltage lines DVL1 and DVL2 are omitted.

Regarding the display device DD of FIGS. 14-16, a point from different from that of the above-described embodiment is mainly described in order to avoid a repetitive description.

Referring to FIGS. 10, 14, and 16, the display device DD may include the display area DA provided with the pixels PXL and the non-display area NDA adjacent to the display area DA.

In an embodiment, the non-display area NDA may include a first non-display area NDA1 corresponding to the first area A1 and a second non-display area NDA2 corresponding to the second area A2. Each of the first and second non-display areas NDA1 and NDA2 may include the antistatic circuit area ESDPA, the fan-out area FTA, and the pad area PDA. The fan-out area FTA may include the first sub area SA1, the second sub area SA2, and the third sub area SA3.

A width in the second direction DR2 of the antistatic circuit area ESDPA, a width in the second direction DR2 of the first sub area SA1, a width in the second direction DR2 of the second sub area SA2, and a width in the second direction DR2 of the third sub area SA3 may be different from each other. For example, the width in the second direction DR2 of the first sub area SA1 may be the greatest and the width in the second direction DR2 of the third sub area SA3 may be the least. However, the present disclosure is not limited thereto, and the width in the second direction DR2 of the antistatic circuit area ESDPA, the width in the second direction DR2 of the first sub area SA1, the width in the second direction DR2 of the second sub area SA2, and the width in the second direction DR2 of the third sub area SA3 may be the same according to an embodiment. In addition, according to another embodiment, at least two or more of the antistatic circuit area ESDPA, the first sub area SA1, the second sub area SA2, and the third sub area SA3 may have the same width in the second direction DR2 and the remaining area may have a different width in the second direction DR2. The width in the second direction DR2 of each of the antistatic circuit area ESDPA, the first sub area SA1, the second sub area SA2, and the third sub area SA3 may be variously changed according to a product specification of the display device DD.

In the first non-display area NDA1, the antistatic circuit area ESDPA, the first sub area SA1, the second sub area SA2, and the third sub area SA3 may be disposed in a direction from the first area A1 to the first portion DICa of the driver DIC along the second direction DR2.

In the second non-display area NDA2, the second sub area SA2, the antistatic circuit area ESDPA, the first sub area SA1, and the third sub area SA3 may be disposed in a direction from the second area A2 to the second portion DICb of the driver DIC along the second direction DR2.

In the above-described non-display area NDA, the first driving voltage line DVL1, the second driving voltage line DVL2, and the driver DIC may be disposed.

The first driving voltage line DVL1 may be disposed in the first non-display area NDA1 and the second non-display area NDA2. In an embodiment, the first driving voltage line DVL1 may include the body portion BDP disposed in the first non-display area NDA1 and the extension portion ETP disposed in the second non-display area NDA2. The first driving voltage line DVL1 may be the 1a-th fan-out line LP1a described with reference to FIG. 10.

The body portion BDP may be positioned in remaining areas except for the antistatic circuit area ESDPA of the first non-display area NDA1, for example, in the fan-out area FTA. In a plan view, the body portion BDP may be provided in a plate shape corresponding to the fan-out area FTA of the first non-display area NDA1. However, the present disclosure is not limited thereto, and the body portion BDP may be changed to various shapes. In FIGS. 14 and 15, the body portion BDP is not positioned in the antistatic circuit area ESDPA, but the present disclosure is not limited thereto. Substantially, the body portion BDP may be provided in a form that reduces or minimizes an area positioned in the antistatic circuit area ESDPA (or overlaps the first antistatic portion ESDP1), and may be provided (or formed) integrally with some of the configurations of the first antistatic portion ESDP1.

Extension portion ETP may extend to the second non-display area NDA2 along the first direction DR1 from body portion BDP. The extension portion ETP may be one region of the first driving voltage line DVL1. The extension portion ETP may be positioned in the first sub area SA1 of the second non-display area NDA2. In FIGS. 14 and 15, the extension portion ETP is not positioned in the antistatic circuit area ESDPA of the second non-display area NDA2, but the present disclosure is not limited thereto. Substantially, the extension portion ETP may be provided in a form that reduces or minimizes an area positioned in the antistatic circuit area ESDPA (or overlaps the second antistatic portion ESDP2), and may be provided (or formed) integrally with some of configurations of the second antistatic portion ESDP2.

The body portion BDP of the first driving voltage line DVL1 may be provided (or formed) integrally with the first power pad of the pad portion PD, and may be electrically connected to a first power supply pad of the first portion DICa of the driver DIC. The voltage of the first driving power may be transmitted to the body portion BDP from the first power supply pad. The body portion BDP may be electrically connected to the first power line PL1 provided to each of the pixels PXL of the first area A1 to transmit the voltage of the first driving power to the first power line PL1.

The second driving voltage line DVL2 may be disposed in the second non-display area NDA2. The second driving voltage line DVL2 may be provided (or formed) integrally with the second power pad of the pad portion PD, and may be electrically connected a second power supply pad of the second portion DICb of the driver DIC. The voltage of the second driving power may be transmitted to the second driving voltage line DVL2 from the second power supply pad. The second driving voltage line DVL2 may be electrically connected to the second power line (refer to "PL2" of FIG. 4) provided to each of the pixels PXL of the second area A2 to transmit the voltage of the second driving power to the second power line PL2.

In an embodiment, the second driving voltage line DVL2 may be positioned in the second non-display area NDA2 to be spaced from the extension portion ETP of the first driving voltage line DVL1. The second driving voltage line DVL2 may be provided in a shape bypassing the extension portion ETP. In addition, the second driving voltage line DVL2 may be provided in various shapes within a range in which the second driving voltage line DVL2 is electrically separated from the second antistatic portion ESDP2. The second driving voltage line DVL2 may overlap the first sub area SA1, the second sub area SA2, and the third sub area SA3, but the present disclosure is not limited thereto.

In the above-described embodiment, the first driving voltage line DVL1 and the second driving voltage line DVL2 may be electrically separated from each other in the non-display area NDA. The first driving voltage line DVL1 and the second driving voltage line DVL2 may be the third conductive layer disposed on the substrate SUB. For example, the first driving voltage line DVL1 and the second driving voltage line DVL2 may be the third conductive layer provided on the interlayer insulating layer ILD, and may be provided at the same layer as the first scan line S1 described with reference to FIGS. 6-9.

As described above, in the display device DD according to an embodiment of the present disclosure, one driver DIC is divided into the first portion DICa and the second portion DICb in order to reduce or minimize a triple stack structure in which all of the first conductive layer, the second conductive layer, and the third conductive layer on the substrate SUB overlap and are formed in the non-display area NDA, the first driving voltage line DVL1 is designed to be electrically connected to the first portion DICa, and the second driving voltage line DVL2 is designed to be electrically connected to the second portion DICb. In addition, the above-described display device DD is designed so that the extension portion ETP, which is one region of the first driving voltage line DVL1, is positioned in the second non-display area NDA2.

In order to prevent or alleviate a defect due to the static electricity input from the outside, the above-described display device DD includes the first and second antistatic portions ESDP1 and ESDP2 in one area of the non-display area NDA, for example, the antistatic circuit area ESDPA. The first antistatic portion ESDP1 may be connected between the 2a-th fan-out line LP2a connected to the data line DL of the first area A1 and the body portion BDP of the first driving voltage line DVL1 to prevent the pulse potential due to the static electricity from flowing into the first area A1. The second antistatic portion ESDP2 may be connected between the 2b-th fan-out line LP2b connected to the data line DL of the second area A2 and the extension portion ETP of the first driving voltage line DVL1 to prevent the pulse potential due to the static electricity from flowing into the second area A2.

In a display device in which the first driving voltage line DVL1 includes only the body portion BDP positioned in the first non-display area NDA1 and the second driving voltage line DVL2 is provided in the same shape as the body portion BDP in the second non-display area NDA2, the second antistatic portion ESDP2 may not be directly connected to the first driving voltage line DVL1 and may be connected to the first power line PL1 provided in the pixels PXL of the display area DA. In this case, when static electricity is input from the outside, an overcurrent may flow in a direction of the display area DA, and thus a burnt defect may occur. In order to prevent or reduce such a burnt defect, the second antistatic portion ESDP2 may be connected to the second driving voltage line DVL2, but in this case, a defect due to a leakage current may occur when the display device DD is driven.

Accordingly, in the above-described embodiment, a position of the antistatic circuit area ESDPA in the first non-display area NDA1 and a position of the antistatic circuit area ESDPA in the second non-display area NDA2 may be designed differently, the extension portion ETP extending from the first non-display area NDA1 to the second non-display area NDA2 may be provided, and the second driving voltage line DVL2 may be designed to bypass the extension portion ETP. Thus, the second antistatic portion ESDP2 may be directly connected to the first driving voltage line DVL1. Accordingly, the second antistatic portion ESDP2 positioned in the second non-display area NDA2 may stably operate, and thus reliability thereof may be improved.

As a result, the display device DD according to the above-described embodiment may include the first and second antistatic portions ESDP1 and ESDP2 with improved reliability. Therefore, reliability of the display device DD may be improved by preventing or alleviating the defect due to the static electricity input from the outside.

Figure 17:
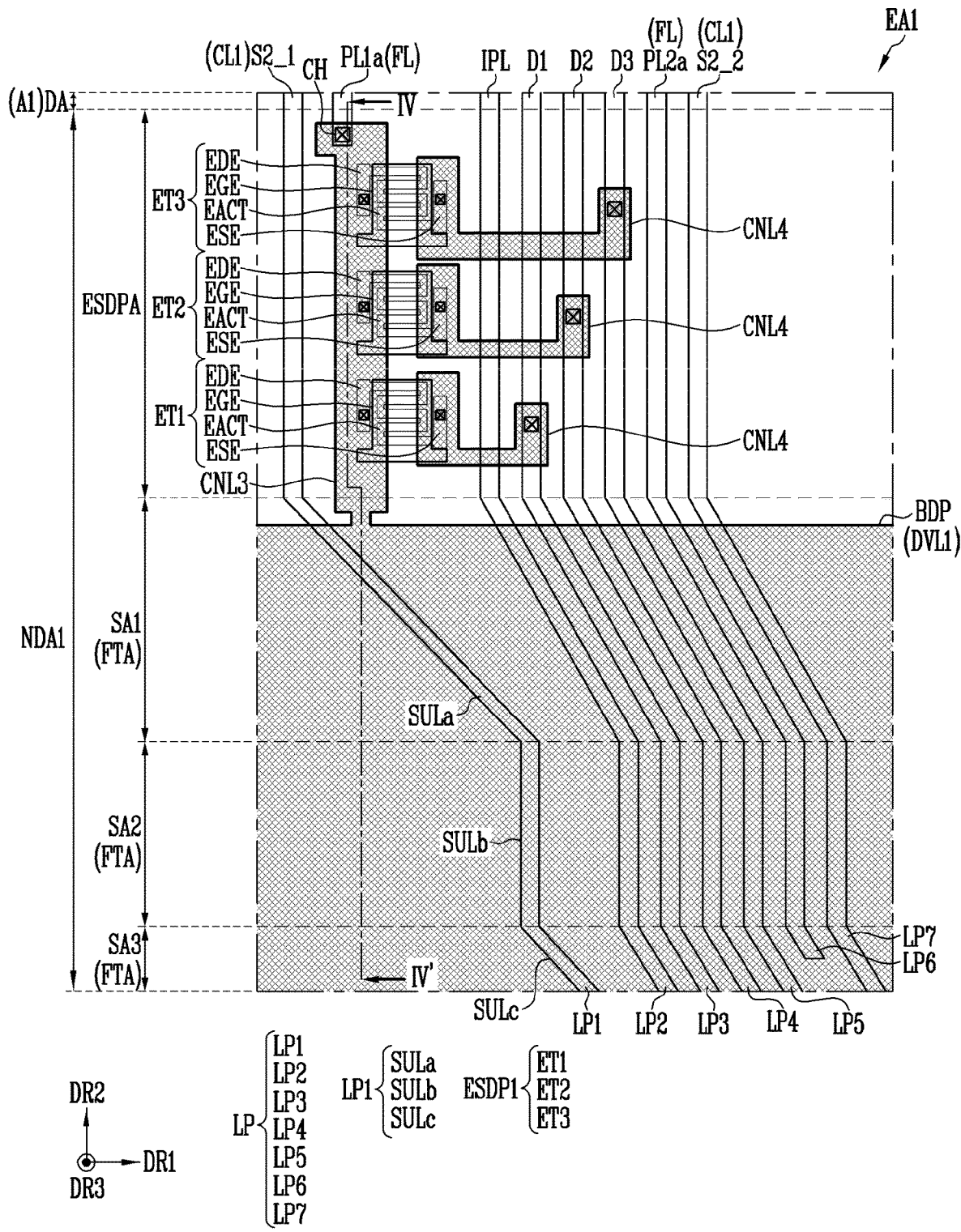
FIG. 17 is a schematic enlarged view of a portion EA1 of FIG. 14.
Figure 18:
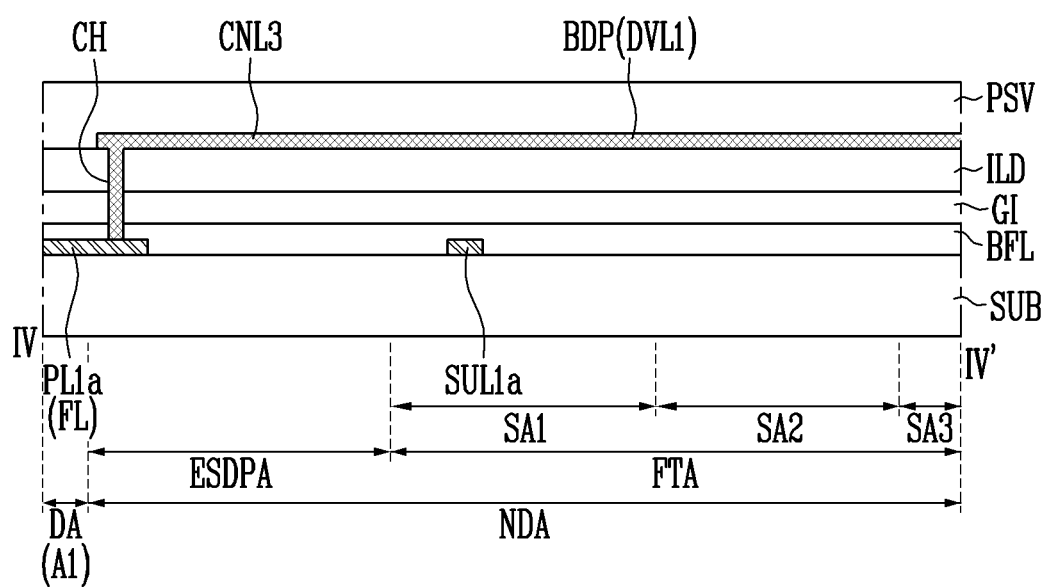
FIG. 18 is a cross-sectional view taken along the line IV~IV' of FIG. 17.
Figure 19:
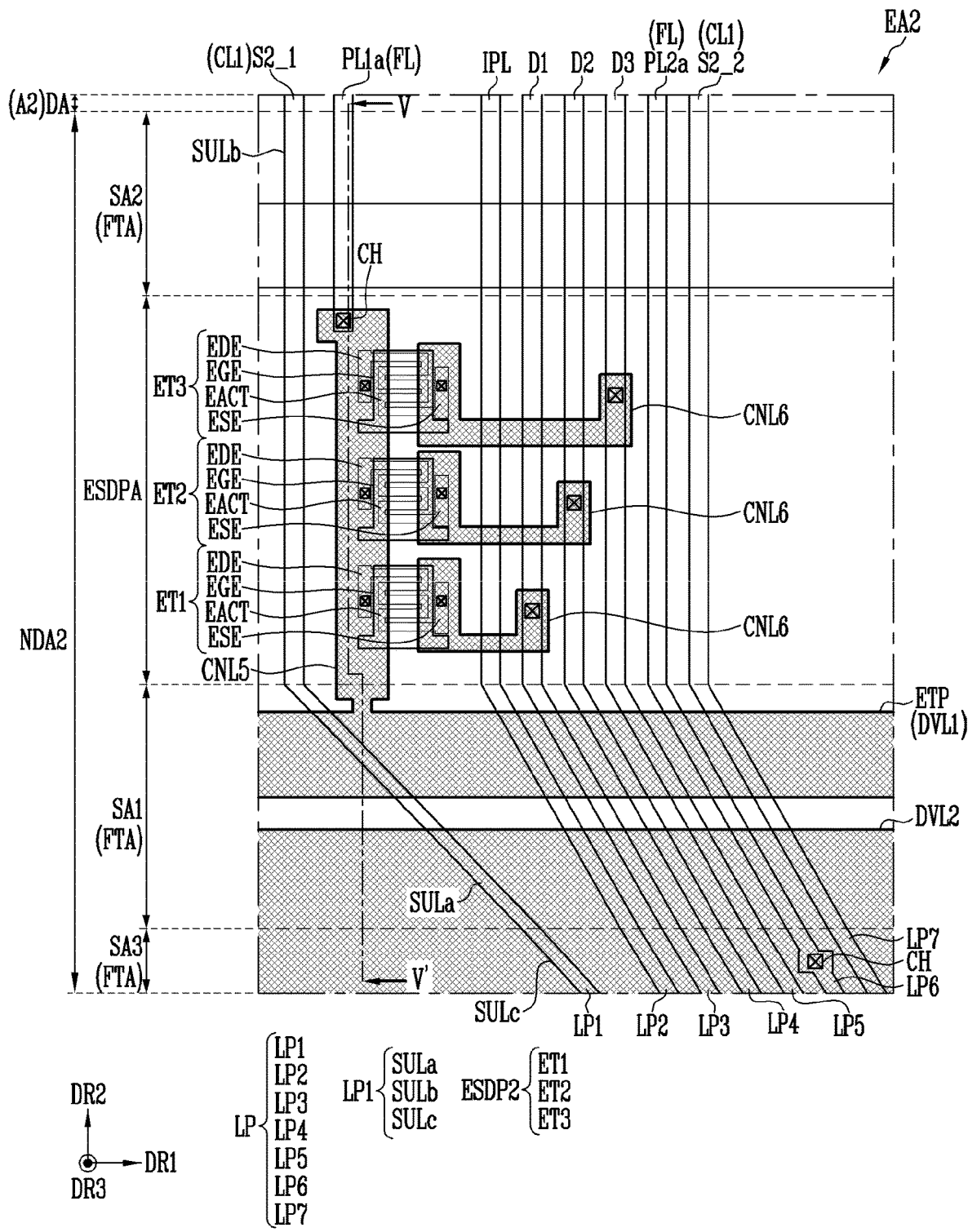
FIG. 19 is a schematic enlarged view of a portion EA2 of FIG. 14.
Figure 20:
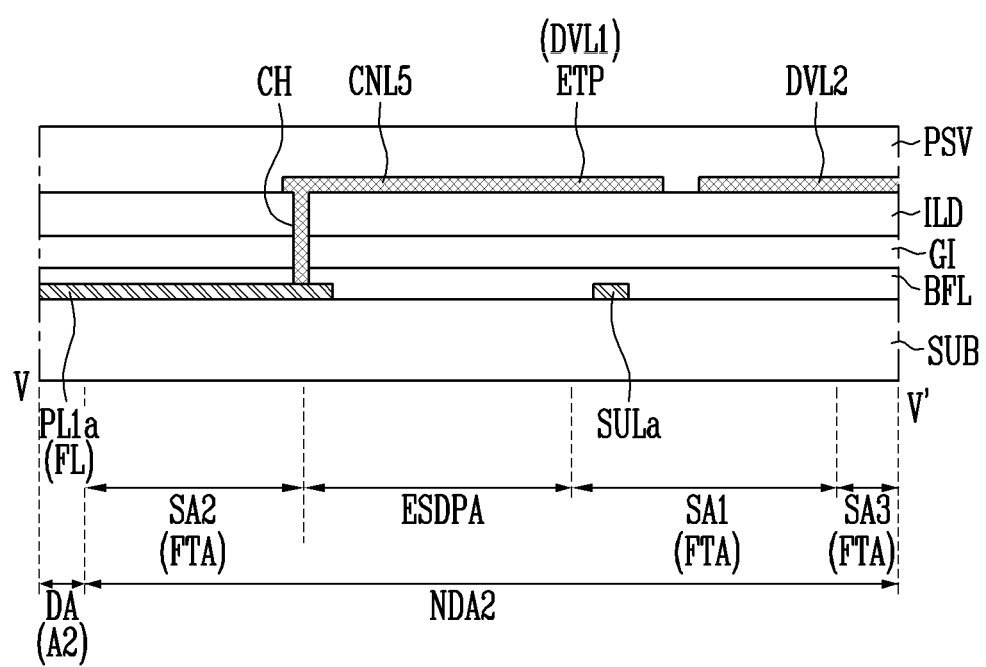
FIG. 20 is a cross-sectional view taken along the line V~V' of FIG. 19.

FIG. 17 is a schematic enlarged view of an EA1 portion of FIG. 14, FIG. 18 is a cross-sectional view taken along the line IV~IV' of FIG. 17, FIG. 19 is a schematic enlarged view of an EA2 portion of FIG. 14, and FIG. 20 is a cross-sectional view taken along the line V~V' of FIG. 19.

Regarding FIGS. 17-20, a point different from that of the above-described embodiment is mainly described in order to avoid a repetitive description.

Referring to FIGS. 10-20, the first non-display area NDA1 may be divided into the antistatic circuit area ESDPA, the first sub area SA1, the second sub area SA2, and the third sub area SA3 sequentially along a direction (e.g., the second direction DR2) from the first area A1 of the display area DA to the first portion DICa of the driver DIC. In addition, the second non-display area NDA2 may be divided into the second sub area SA2, the antistatic circuit area ESDPA, the first sub area SA1, and the third area SA3 sequentially along a direction (e.g., the second direction DR2) from the second area A2 of the display area DA to the second portion DICb of the display area DA.

Three first antistatic portions ESDP1 positioned in the same column may be positioned in the antistatic circuit area ESDPA of the first non-display area NDA1 along the second direction DR2. As an example, one of the three first antistatic portions ESDP1 may include a first transistor ET1 connected between a fourth connection line CNL4 and the first data line D1 of the first area A1, another of the three first antistatic portions ESDP1 may include a second transistor ET2 connected between the fourth connection line CNL4 and the second data line D2 of the first area A1, and the other of the three first antistatic portions ESDP1 may include a third transistor ET3 connected between the fourth connection line CNL4 and the third data line D3 of the first area A1. The first to third data lines D1, D2, and D3 described above may be the first to third data lines D1, D2, and D3 described with reference to FIGS. 6-9. Because each of the first to third transistors ET1, ET2, and ET3 is the same as the transistor ET described with reference to FIGS. 11-13, a detailed description thereof is omitted.

The source region ESE of the first transistor ET1 may be connected to the first data line D1 through the fourth connection line CNL4. The source region ESE of the second transistor ET2 may be connected to the second data line D2 through the fourth connection line CNL4. The source region ESE of the third transistor ET3 may be connected to the third data line D3 through the fourth connection line CNL4. The above-described fourth connection line CNL4 may be the connection line CNL described with reference to FIGS. 12 and 13.

The three first antistatic portions ESDP1 described above may share the third connection line CNL3. The third connection line CNL3 described above may be the 1a-th fan-out line LP1a described with reference to FIGS. 12 and 13. The drain region EDE of the first transistor ET1 may be connected to the third connection line CNL3, the drain region EDE of the second transistor ET2 may be connected to the third connection line CNL3, and the drain region EDE of the third transistor ET3 may be connected to the third connection line CNL3.

One end of the third connection line CNL3 may be electrically and physically connected to the first layer FL of the 1a-th power line PL1a of the first area A1 through a contact hole CH sequentially passing through the buffer layer BFL, the gate insulating layer GI, and the interlayer insulating layer ILD. Another end of the third connection line CNL3 may be provided (or formed) integrally with the body portion BDP of the first driving voltage line DVL1 to be electrically and physically connected to the body portion BDP. The first layer FL of the 1a-th power line PL1a may be electrically connected to the body portion BDP, and thus the voltage of the first driving power applied to the first driving voltage line DVL1 may be supplied to the 1a-th power line PL1a.

In the antistatic circuit area ESDPA of the first non-display area NDA1, the first conductive line CL1 of the (2-1)-th scan line S2_1 of the first area A1, the first layer FL of the 1a-th power line PL1a of the first area A1, the initialization power line IPL of the first area A1, the 2a-th power line PL2a of the first area A1, and the first conductive line CL1 of the (2-2)-th scan line S2_2 of the first area A1 may be disposed. Because the first conductive line CL1 of the (2-1)-th scan line S2_1, the first layer FL of the 1a-th power line PL1a, the initialization power line IPL, the 2a-th power line PL2a, and the first conductive line CL1 of the (2-2)-th scan line S2_2 are described in detail with reference to FIGS. 6-9, a repetitive description thereof is omitted.

First to seventh fan-out lines LP1 to LP7 may be disposed in the first to third sub areas SA1, SA2, and SA3 of the first non-display area NDA1. The first fan-out line LP1 may be provided (or formed) integrally with the first conductive line CL1 of the (2-1)-th scan line S2_1 to be electrically and physically connected to the (2-1)-th scan line S2_1. The second fan-out line LP2 may be provided (or formed) integrally with the initialization power line IPL to be electrically and physically connected to the initialization power line IPL. The third fan-out line LP3 may be provided (or formed) integrally with the first data line D1 to be electrically and physically connected to the first data line D1. The fourth fan-out line LP4 may be provided (or formed) integrally with the second data line D2 to be electrically and physically connected to the second data line D2. The fifth fan-out line LP5 may be provided (or formed) integrally with the third data line D3 to be electrically and physically connected to the third data line D3. The sixth fan-out line LP6 may be provided (or formed) integrally with the first layer FL of the 2a-th power line PL2a to be electrically and physically connected to the 2a-th power line PL2a. The seventh fan-out line LP7 may be provided (or formed) integrally with the first conductive line CL1 of the (2-2)-th scan line S2_2 to be electrically and physically connected to the first conductive line CL1 of the (2-2)-th scan line S2_2.

Each of the first to seventh fan-out lines LP1, LP2, LP3, LP4, LP5, LP6, and LP7 may be the first conductive layer provided on the substrate SUB. Each of the first to seventh fan-out lines LP1, LP2, LP3, LP4, LP5, LP6, and LP7 may be provided at the same layer, may include the same material, and may be formed through the same process, as the first conductive line CL1 of the (2-1)-th scan line S2_1 of the first area A1, the first layer FL of the 1a-th power line PL1a, the initialization power line IPL, the first to third data lines D1 to D3, the first layer FL of the 2a-th power line PL2a, and the first conductive line CL1 of the (2-2)-th scan line S2_2.

The first fan-out line LP1 may be divided into a first diagonal portion SULa, a straight portion SULb, and a second diagonal portion SULc according to a shape thereof. For example, the first diagonal portion SULa of the first fan-out line LP1 may be positioned in the first sub area SA1, the straight portion SULb of the first fan-out line LP1 may be positioned in the second sub area SA2, and the second diagonal portion SULc of the first fan-out line LP1 may be positioned in the third sub area SA3.

One end of the first diagonal portion SULa of the first fan-out line LP1 may be positioned adjacent to the antistatic circuit area ESDPA and may extend in a first diagonal direction. The straight portion SULb of the first fan-out line LP1 may extend in the second direction DR2 from another end of the first diagonal portion SULa. Here, one end of the straight portion SULb may be connected to the other end of the first diagonal portion SULa. In addition, the second diagonal portion SULc of the first fan-out line LP1 may extend in a second diagonal direction from another end of the straight portion SULb, and another end of the second diagonal portion SULc may be positioned adjacent to the pad area PDA. Here, the first diagonal direction and the second diagonal direction may be the same or different from each other. A length of the second diagonal portion SULc may be shorter than a length of the first diagonal portion SULa, but the present disclosure is not limited thereto. The first diagonal direction and the second diagonal direction may be directions inclined to the first direction DR1 or the second direction DR2.

In the method described above, each of the second, third, fourth, fifth, sixth, and seventh fan-out lines LP2, LP3, LP4, LP5, LP6, and LP7 may also include a first diagonal portion, a straight portion, and a second diagonal portion. As described above, when each of the first to seventh fan-out lines LP1, LP2, LP3, LP4, LP5, LP6, and LP7 includes the straight portion, a distance at which the first to seventh fan-out lines LP1, LP2, LP3, LP4, LP5, LP6, and LP7 are spaced from each other may be relatively increased.

In an embodiment, the second diagonal portion of the sixth fan-out line LP6 may be disposed to be spaced from the pad area PDA in the third sub area SA3, and thus may not be electrically connected to the driver DIC. In this case, the 2a-th power line PL2a connected to the sixth fan-out line LP6 may receive the voltage of the second driving power from the 2a-th power line PL2a positioned in the second area A2.

The body portion BDP of the first driving voltage line DVL1 may be disposed in the first non-display area NDA1. The body portion BDP may overlap the first to seventh fan-out lines LP1, LP2, LP3, LP4, LP5, LP6, and LP7, and may be provided in a plate shape that entirely covers the first to third sub areas SA1, SA2, and SA3. The body portion BDP may be provided (or formed) integrally with the third connection line CNL3 of the antistatic circuit area ESDPA to be electrically and physically connected to the third connection line CNL3. For example, the third connection line CNL3 positioned in the antistatic circuit area ESDPA may be one region of the body portion BDP.

The body portion BDP may be electrically connected to the first portion DICa of the driver DIC to transmit the voltage of the first driving power to the 1a-th power line PL1a of the first area A1 through the third connection line CNL3. In addition, each of the three first antistatic portions ESDP1 positioned in the antistatic circuit area ESDPA of the first non-display area NDA1 may be electrically connected to the body BDP to distribute the pulse potential due to the static electricity to the body portion BDP, that is, the first driving voltage line DVL1 through a corresponding transistor when the static electricity is input to the corresponding data lines D1, D2, and D3.

Three second antistatic portions ESDP2 may be positioned in the same column along the second direction DR2 in the antistatic circuit area ESDPA of the second non-display area NDA2. For example, one of the three second antistatic portions ESDP2 may include a first transistor ET1 connected between a sixth connection line CNL6 and the first data line D1 of the second area A2, another of the three second antistatic portions ESDP2 may include a second transistor ET2 connected between the sixth connection line CNL6 and the second data line D2 of the second area A2, and the other of the three second antistatic portions ESDP2 may include a third transistor ET3 connected between the sixth connection line CNL6 and the third data line D3 of the second area A2. The first to third data lines D1, D2, and D3 described above may be the first to third data lines D1, D2, and D3 described with reference to FIGS. 6-9.

The source region ESE of the first transistor ET1 may be connected to the first data line D1 through the sixth connection line CNL6. The source region ESE of the second transistor ET2 may be connected to the second data line D2 through the sixth connection line CNL6. The source region ESE of the third transistor ET3 may be connected to the third data line D3 through the sixth connection line CNL6. The sixth connection line CNL6 described above may be the connection line CNL described with reference to FIGS. 12 and 13.

The three second antistatic portions ESDP2 described above may share a fifth connection line CNL5. The drain region EDE of the first transistor ET1 may be connected to the fifth connection line CNL5, the drain region EDE of the second transistor ET2 may be connected to the fifth connection line CNL5, and the drain region EDE of the third transistor ET3 may be connected to the fifth connection line CNL5.

One end of the fifth connection line CNL5 may be electrically connected to the first layer FL of the 1a-th power line PL1a of the second area A2 through a contact hole CH sequentially passing through the buffer layer BFL, the gate insulating layer GI, and the interlayer insulating layer ILD. Another end of the fifth connection line CNL5 may be provided (or formed) integrally with the extension portion ETP of the first driving voltage line DVL1 to be electrically and physically connected to the extension portion ETP. The first layer FL of the 1a-th power line PL1a may be electrically connected to the extension portion ETP through a corresponding contact hole CH, and thus the voltage of the first driving power applied to the first driving voltage line DVL1 may be supplied to the 1a-th power line PL1a.

The antistatic circuit area ESDPA of the second non-display area NDA2 may correspond to the first area SA1 of the first non-display area NDA1. Accordingly, a position of the first antistatic portion ESDP1 and a position of the second antistatic portion ESDP2 may be different from each other. In the second non-display area NDA2, the first sub area SA1 may be positioned between the antistatic circuit area ESDPA and the third sub area SA3, the second sub area SA2 may be positioned between the second area A2 and the antistatic circuit area ESDPA, and the third sub area SA3 may be positioned between the first sub area SA1 and the pad area PDA.

First to seventh fan-out lines LP1, LP2, LP3, LP4, LP5, LP6, and LP7 may be disposed in the first to third sub areas SA1, SA2, and SA3 of the second non-display area NDA2. Because the first to seventh fan-out lines LP1, LP2, LP3, LP4, LP5, LP6, and LP7 have a structure substantially similar to that of the first to seventh fan-out lines LP1, LP2, LP3, LP4, LP5, LP6, and LP7 positioned in the first non-display area NDA1, a detailed description thereof is omitted.

The first fan-out line LP1 may be divided into a first diagonal portion SULa, a straight portion SULb, and a second diagonal portion SULc. In an embodiment, the first fan-out line LP1 may be disposed in an order of the straight portion SULb, the first diagonal portion SULa, and the second diagonal portion SULc in a direction from the second area A2 to the second portion DICb of the driver DIC along the second direction DR2.

One end of the straight portion SULb of the first fan-out line LP1 may be positioned adjacent to the second area A2, and extend to the antistatic circuit area ESDPA along the second direction DR2. The first diagonal portion SULa of the first fan-out line LP1 may extend in a first diagonal direction from another end of the straight portion SULb. Here, one end of the first diagonal portion SULa may be connected to the other end of the straight portion SULb. In addition, the second diagonal portion SULc of the first fan-out line LP1 may extend in a second diagonal direction from another end of the first diagonal portion SULa, and another end of the second diagonal portion SULc may be positioned adjacent to the pad area PDA. Here, the first diagonal direction and the second diagonal direction may be the same or different from each other.

In the method described above, each of the second, third, fourth, fifth, sixth, and seventh fan-out lines LP2, LP3, LP4, LP5, LP6, and LP7 may also include a straight portion, a first diagonal portion, and a second diagonal portion.

In an embodiment, the second diagonal portion of the sixth fan-out line LP6 may be electrically and physically connected to the second driving voltage line DVL2 through a corresponding contact hole CH. For example, the second diagonal portion of the sixth fan-out line LP6 may be electrically and physically connected to the second driving voltage line DVL2 through a contact hole CH sequentially passing through the buffer layer BFL, the gate insulating layer GI, and the interlayer insulating layer ILD. Accordingly, the voltage of the second driving power transmitted from the second portion DICb of the driver DIC to the second driving voltage line DVL2 may be transmitted to the 2a-th power line PL2a of the second area A2 through the sixth fan-out line LP6.

In the second non-display area NDA2, the extension portion ETP of the first driving voltage line DVL1 may be disposed. In addition, the second driving voltage line DVL2 provided (or formed) by bypassing the extended portion ETP so as to be spaced from the extended portion ETP may be disposed in the second non-display area NDA2.

The extension portion ETP may extend from the body portion BDP disposed in the first non-display area NDA1 to the second non-display area NDA2 along the first direction DR1. The extension portion ETP may overlap the first to seventh fan-out lines LP1, LP2, LP3, LP4, LP5, LP6, and LP7 in the first sub area SA1, and may be provided (or formed) integrally with the fifth connection line CNL5 to be electrically and physically connected to the fifth connection line CNL5. For example, the fifth connection line CNL5 positioned in the antistatic circuit area ESDPA may be one region of the extension portion ETP. That is, the fifth connection line CNL5 may be one region of the first driving voltage line DVL1. In other words, the fifth connection line CNL5 may be the first driving voltage line DVL1. As described above, because the fifth connection line CNL5 is electrically connected to the 1a-th power line PL1a of the second area A2 through the corresponding contact hole CH, the 1a-th power line PL1a and the first driving voltage line DVL1 may be electrically connected through the fifth connection line CNL5.

The extension portion ETP may transmit the voltage of the first driving power to the 1a-th power line PL1a of the second area A2 through the fifth connection line CNL5. In addition, each of the three second antistatic portions ESDP2 positioned in the antistatic circuit area ESDPA of the second non-display area NDA2 may be electrically connected to the extension unit ETP to distribute the pulse potential due to the static electricity to the extension portion ETP, that is, the first driving voltage line DVL1 through a corresponding transistor when the static electricity is input to the corresponding data lines D1, D2, and D3.

As described above, the second antistatic portion ESDP2 may be connected between the extension portion ETP to which the voltage of the first driving power is applied and the corresponding data lines D1, D2, and D3 to prevent or alleviate a defect of the data lines D1, D2, and D3 by the static electricity input from the outside.

FIG. 21 is a plan view schematically illustrating a display device DD according to an embodiment of the present disclosure.

The display device DD shown in FIG. 21 may have a configuration and a structure substantially similar to those of the display device DD shown in FIGS. 10-20 except that the first and second non-display areas NDA1 and NDA2 are identically divided into the second sub area SA2, the antistatic circuit area ESDPA, the first sub area SA1, and the third sub area SA3 sequentially in a direction from the display area to the driver DIC, and an upper surface SF of the body portion BDP and an upper surface SF of the extension portion ETP are positioned at the same line.

Accordingly, in FIG. 21, a point different from that of the above-described embodiment is mainly described in order to avoid a repetitive description. A portion that is not specifically described in the embodiment of FIG. 21 corresponds to the above-described embodiment, and the same reference numerals denote the same components, and similar reference numerals denote similar components.

Referring to FIG. 21, the non-display area NDA of the display device DD may include the first non-display area NDA1 and the second non-display area NDA2.

Each of the first and second non-display areas NDA1 and NDA2 may be divided into the second sub area SA2, the antistatic circuit area ESDPA, the first sub area SA1, and the third sub area SA3 sequentially in a direction from the display area DA to the driver DIC along the second direction DR2. Accordingly, the fan-out lines (refer to "LP" of FIG. 17) positioned in the first non-display area NDA1 and the fan-out lines (refer to "LP" of FIG. 19) positioned in the second non-display area NDA2 may have substantially the same structure. In addition, the first antistatic portion (refer to "ESDP1" of FIG. 17) positioned in the first non-display area NDA1 and the second antistatic portion (refer to "ESDP2" of FIG. 19) positioned in the second non-display area NDA2 may have substantially the same structure. That is, the first non-display area NDA1 and the second non-display area NDA2 may include a plurality of areas symmetrical to each other.

The first driving voltage line DVL1 may include the body portion BDP disposed in the first non-display area NDA1 and the extension portion ETP disposed in the second non-display area NDA2.

The body portion BDP may be positioned in the first and third sub areas SA1 and SA3 in the first non-display area NDA1. In addition, the body portion BDP may be provided (or formed) integrally with a portion of the first antistatic portion ESDP1 positioned in the antistatic circuit area ESDPA.

The extension portion ETP may extend from the body portion BDP to the second non-display area NDA2 in the first direction DR1. At this time, the extension portion ETP may be positioned in the first sub area SA1 of the second non-display area NDA2. The extension portion ETP may be provided (or formed) integrally with a portion of the second antistatic portion ESDP2 positioned in the antistatic circuit area ESDPA of the second non-display area NDA2.

In an embodiment, because the first sub area SA1 of the second non-display area NDA2 corresponds to the first sub area SA1 of the first non-display area NDA1, the upper surface SF of the extension portion ETP and the upper surface SF of the body portion BDP may be positioned at the same line. However, the present disclosure is not limited thereto, and according to an embodiment, the extension portion ETP and the body portion BDP may have upper surfaces SF positioned on different lines within a range that reduces or minimizes the area positioned in the corresponding antistatic circuit area ESDPA (or overlap the corresponding antistatic portion).

The second driving voltage line DVL2 may be positioned in the second non-display area NDA2 to be spaced from the extension portion ETP. The second driving voltage line DVL2 may be provided in a shape bypassing the extension portion ETP. In addition, the second driving voltage line DVL2 may be provided in various shapes within a range in which the second driving voltage line DVL2 is electrically separated from the second antistatic portion ESDP2.

The first driving voltage line DVL1 and the second driving voltage line DVL2 may be spaced from each other to be electrically separated from each other in the non-display area NDA.

Although the present disclosure has been described with reference to the embodiments above, those skilled in the art or those having a common knowledge in the art will understand that the present disclosure may be variously modified and changed without departing from the spirit and scope of the present disclosure described in the claims which will be described later.

Therefore, the technical scope of the present disclosure should not be limited to the contents described in the detailed description of the specification, but should be defined by the claims and their equivalents.

What is claimed is:

1. A display device comprising:
    a substrate including a display area and a non-display area adjacent to the display area, a plurality of pixels being located in the display area;
    a driver located in the non-display area;
    a data line electrically connected to the driver to transmit a data signal to each of the plurality of pixels;
    a first driving voltage line and a second driving voltage line in the non-display area; and
    an antistatic portion in the non-display area and connected between the data line and the first driving voltage line,
    wherein the display area includes at least one first area electrically connected to one side of the driver and at least one second area electrically connected to another side of the driver,
    wherein the non-display area includes a first non-display area corresponding to the first area and a second non-display area corresponding to the second area, and
    wherein the first driving voltage line comprises a first portion at the first non-display area and a second portion extending from the first portion and at the second non-display area.

2. The display device according to claim 1, wherein the second driving voltage line is in the second non-display area,
    wherein the second driving voltage line bypasses the second portion of the first driving voltage line in the second non-display area, and
    wherein the first driving voltage line and the second driving voltage line are electrically separated from each other.

3. The display device according to claim 2, wherein the first driving voltage line receives a first power and the second driving voltage line receives a second power,
    wherein the first power is a driving power at a higher potential than the second power.

4. The display device according to claim 3, further comprising:
    a buffer layer, a gate insulating layer, and an interlayer insulating layer sequentially stacked on the substrate;
    a first power line at the display area and electrically connected to each of the plurality of pixels;
    a second power line at the display area and spaced from the first power line, the second power line being electrically connected to each of the plurality of pixels;
    a pad portion at the non-display area and including a plurality of pads electrically connected to the driver; and
    a line portion at the non-display area and comprising a plurality of fan-out lines electrically connecting the pad portion and the pixels.

5. The display device according to claim 4, wherein the non-display area comprises:
    an antistatic circuit area, the antistatic portion being located in the antistatic circuit area;
    a fan-out area, the plurality of fan-out lines being located in the fan-out area; and
    a pad area, the plurality of pads being located in the pad area,
    wherein the fan-out area is divided into a first sub area, a second sub area, and a third sub area.

6. The display device according to claim 5, wherein the antistatic portion comprises a first antistatic portion positioned in the first non-display area and a second antistatic portion positioned in the second non-display area,
    wherein the first antistatic portion is connected between a data line positioned in the first area and the first portion of the first driving voltage line, and
    wherein the second antistatic portion is connected between a data line positioned in the second area and the second portion of the first driving voltage line.

7. The display device according to claim 6, wherein each of the first and second antistatic portions comprises at least one transistor, the at least one transistor comprising:
    an active pattern on the buffer layer;
    a gate electrode on the active pattern with the gate insulating layer therebetween; and
    a first terminal and a second terminal connected to both ends of the active pattern, respectively, wherein the gate electrode is floating.

8. The display device according to claim 7, wherein the first antistatic portion further comprises:
    a first connection line electrically connecting one of the first and second terminals of the transistor and the first portion of the first driving voltage line; and
    a second connection line electrically connecting the other one of the first and second terminals of the transistor and the data line located at the first area,
    wherein the first connection line is provided integrally with the first portion of the first driving voltage line.

9. The display device according to claim 7, wherein the second antistatic portion comprises:
    a first connection line electrically connecting one of the first and second terminals of the transistor and the second portion of the first driving voltage line; and
    a second connection line electrically connecting the other one of the first and second terminals of the transistor and the data line located at the second area,
    wherein the first connection line is provided integrally with the second portion of the first driving voltage line.

10. The display device according to claim 7, wherein the first antistatic portion and the second antistatic portion are located at positions corresponding to each other in the non-display area, in a plan view.

11. The display device according to claim 10, wherein the first non-display area and the second non-display area are divided into the second sub area, the antistatic circuit area, the first sub area, and the third sub area sequentially disposed in a direction from a corresponding display area toward the driver.

12. The display device according to claim 11, wherein at least one side of the first portion and at least one side of the second portion of the first driving voltage line are positioned at the same line, in a plan view.

13. The display device according to claim 7, wherein the first antistatic portion and the second antistatic portion are provided at different positions in the non-display area, in a plan view.

14. The display device according to claim 13, wherein the first non-display area is divided into the antistatic circuit area, the first sub area, the second sub area, and the third sub area sequentially disposed in a direction from the first area toward the driver, and
    wherein the second non-display area is divided into the second sub area, the antistatic circuit area, the first sub area, and the third sub area sequentially disposed in a direction from the second area toward the driver.

15. The display device according to claim 6, wherein each of the plurality of fan-out lines comprises:
a first diagonal portion located at the first sub area;
a straight portion located at the second sub area; and
a second diagonal portion located at the third sub area.

16. The display device according to claim 15, wherein each of the plurality of fan-out lines comprises the first diagonal portion, the straight portion, and the second diagonal portion sequentially arranged along a direction from the first area toward the driver, in the first non-display area, and
wherein each of the plurality of fan-out lines comprises the straight portion, the first diagonal portion, and the second diagonal portion sequentially arranged along a direction from the second area toward the driver, in the second non-display area.

17. The display device according to claim 4, wherein the first driving voltage line and the second driving voltage line are on the interlayer insulating layer and are spaced from each other, and
wherein the first driving voltage line and the second driving voltage line overlap the plurality of fan-out lines, in a plan view.

18. The display device according to claim 4, further comprising:
a first bus line in the non-display area and connected to the first power line; and
a second bus line in the non-display area and connected to the second power line,
wherein the first driving voltage line is electrically connected to the first bus line, and the second driving voltage line is electrically connected to the second bus line.

19. The display device according to claim 5, wherein each of the plurality of pixels further comprises:
a first emission area, a second emission area, and a third emission area divided along one direction; and
a first electrode, a second electrode, a third electrode, and a fourth electrode located at each of the first, second, and third emission areas and spaced from each other in the one direction, and
a plurality of light emitting elements are located at each of the first emission area, the second emission area, and the third emission area.

20. The display device according to claim 19, wherein the plurality of light emitting elements comprises:
a plurality of first light emitting elements between the first electrode and the second electrode and electrically connected to the first and second electrodes; and
a plurality of second light emitting elements between the third electrode and the fourth electrode and electrically connected to the third and fourth electrodes.

* * * * *